US012796090B2

(12) United States Patent
Yoshino et al.

(10) Patent No.: US 12,796,090 B2
(45) Date of Patent: Nov. 10, 2026

(54) ARRAY SUBSTRATE AND DISPLAY DEVICE

(71) Applicant: Sharp Display Technology Corporation, Kameyama City (JP)

(72) Inventors: Hikaru Yoshino, Kameyama City (JP); Shingo Kamitani, Kameyama City (JP); Junichi Morinaga, Kameyama City (JP)

(73) Assignee: SHARP DISPLAY TECHNOLOGY CORPORATION, Kameyama City (JP)

( * ) Notice: Subject to any disclaimer, the term of this patent is extended or adjusted under 35 U.S.C. 154(b) by 495 days.

(21) Appl. No.: 18/243,197

(22) Filed: Sep. 7, 2023

(65) Prior Publication Data

US 2024/0105735 A1 Mar. 28, 2024

(30) Foreign Application Priority Data

Sep. 27, 2022 (JP) ................................ 2022-153346

(51) Int. Cl.

| | |
|---|---|
| ***H01L 27/12*** | (2006.01) |
| ***G02F 1/1362*** | (2006.01) |
| ***G02F 1/1368*** | (2006.01) |
| ***G06F 3/044*** | (2006.01) |
| ***H10D 86/40*** | (2025.01) |
| ***H10D 86/60*** | (2025.01) |

(52) U.S. Cl.

CPC ....... *H10D 86/60* (2025.01); *G02F 1/136227* (2013.01); *G02F 1/136286* (2013.01); *G02F 1/1368* (2013.01); *G06F 3/0446* (2019.05); *G06F 3/0447* (2019.05); *H10D 86/441* (2025.01)

(58) Field of Classification Search

CPC ................. H10D 86/60; H10D 86/441; G02F 1/136227; G02F 1/136286; G02F 1/1368; G02F 1/13338; G06F 3/0446; G06F 3/0447; G06F 3/0412; G06F 3/0443

See application file for complete search history.

(56) References Cited

U.S. PATENT DOCUMENTS

2013/0162570 A1 6/2013 Shin et al.
2016/0259195 A1 9/2016 Shin et al.
(Continued)

FOREIGN PATENT DOCUMENTS

CN 103176302 A 6/2013

*Primary Examiner* — Jarrett J Stark
(74) *Attorney, Agent, or Firm* — Keating & Bennett, LLP

(57) ABSTRACT

In an array substrate, a plurality of wiring lines include a first wiring line located between a first pixel electrode and a second pixel electrode in a first direction, and a second wiring line located between a third pixel electrode and a fourth pixel electrode in the first direction. A plurality of switching elements include a first switching element and a second switching element. A plurality of common electrodes include a first common electrode overlapping the first pixel electrode, the second pixel electrode, the third pixel electrode, the first wiring line, and a first semiconductor portion, and a second common electrode overlapping the fourth pixel electrode and the second wiring line. Further, there is provided a first overlapping portion that is disposed overlapping a second semiconductor portion and has the same potential as that of any of the plurality of common electrodes.

11 Claims, 47 Drawing Sheets

(56) References Cited

U.S. PATENT DOCUMENTS

| | | | |
|---|---|---|---|
| 2018/0252956 | A1 | 9/2018 | Shin et al. |
| 2019/0319052 | A1* | 10/2019 | Yoshida ................ G02F 1/1368 |
| 2020/0064669 | A1* | 2/2020 | Nishiyama .......... G02F 1/13454 |
| 2020/0159077 | A1* | 5/2020 | Yoshida ............... H10D 86/481 |
| 2020/0272012 | A1 | 8/2020 | Yoshida |
| 2020/0319491 | A1 | 10/2020 | Shin et al. |
| 2021/0325748 | A1* | 10/2021 | Li ..................... G02F 1/136286 |
| 2022/0100043 | A1* | 3/2022 | Morinaga ......... G02F 1/136286 |
| 2022/0121051 | A1 | 4/2022 | Shin et al. |
| 2022/0276540 | A1* | 9/2022 | Wang ................ G02F 1/136227 |
| 2022/0358889 | A1* | 11/2022 | Kim ..................... G09G 3/3648 |
| 2022/0382110 | A1* | 12/2022 | Wang ................ G02F 1/136295 |
| 2023/0333422 | A1 | 10/2023 | Shin et al. |
| 2025/0093695 | A1 | 3/2025 | Shin et al. |

* cited by examiner

ARRAY SUBSTRATE AND DISPLAY DEVICE

CROSS-REFERENCE TO RELATED APPLICATIONS

This application claims the benefit of priority to Japanese Patent Application Number 2022-153346 filed on Sep. 27, 2022. The entire contents of the above-identified application are hereby incorporated by reference.

BACKGROUND

Technical Field

The techniques disclosed herein relate to array substrates and display devices.

A display device described in US 2020/0272012 A is known as an example of a display device of the related art. A display device described in US 2020/0272012 A includes a pixel electrode, a common electrode overlapping the pixel electrode via an insulating film, a switching element connected to the pixel electrode, a pixel wiring line connected to the switching element and disposed adjacent to the pixel electrode, and a plurality of wiring lines disposed adjacent to the pixel electrode on the same side as the pixel wiring line and spaced apart from each other and electrically connected to the common electrode. The plurality of wiring lines each include a common portion having a common positional relation with respect to the pixel wiring line. The display device described in US 2020/0272012 A includes a plurality of position detection electrodes obtained by dividing the common electrode, a second pixel wiring line disposed intersecting the pixel wiring line and overlapping a partition opening for partitioning the plurality of position detection electrodes, and a blocking portion overlapping the second pixel wiring line and electrically connected to the wiring line.

SUMMARY

In the display device described in US 2020/0272012 A mentioned above, since the second pixel wiring line is disposed to overlap the partition opening, an electrical field generated from the second pixel wiring line is not blocked by the position detection electrode, but is blocked by the blocking portion overlapping the second pixel wiring line. However, when the blocking portion is provided at a position overlapping the second pixel wiring line, it is necessary to secure a wide arrangement space for the blocking portion in order to prevent a short circuit between another electrode or the like and the blocking portion, or the like. As a result, in order to prevent a structure near the blocking portion from being visually recognized, it is necessary to widen the light blocking range, which raises a risk that the aperture ratio of the pixel is decreased. When some measures are taken to prevent the decrease in the aperture ratio of the pixel, there arises a risk that unevenness is generated in the display luminance, as a result.

The techniques described in the present specification have been accomplished based on the above-described circumstances, and an object thereof is to make the pixel aperture ratio unlikely to decrease and to make unevenness in the display luminance unlikely to be generated.

(1) An array substrate according to the techniques described in the present specification includes a plurality of common electrodes, a plurality of pixel electrodes disposed overlapping the plurality of common electrodes via a first insulating film, a plurality of switching elements connected to the plurality of pixel electrodes, and a plurality of wiring lines connected to any of the plurality of common electrodes or any of the plurality of switching elements. The plurality of pixel electrodes include a first pixel electrode, a second pixel electrode disposed being spaced apart from the first pixel electrode in a first direction, a third pixel electrode, and a fourth pixel electrode disposed being spaced apart from the third pixel electrode in the first direction. The plurality of wiring lines include a first wiring line located between the first pixel electrode and the second pixel electrode in the first direction, and extending along a second direction intersecting with the first direction; and a second wiring line located between the third pixel electrode and the fourth pixel electrode in the first direction, and extending along the second direction. The plurality of switching elements include a first switching element connected to the first wiring line and the first pixel electrode, and a second switching element connected to the second wiring line and the third pixel electrode. The plurality of common electrodes include a first common electrode and a second common electrode disposed being spaced apart from the first common electrode in the first direction. The first switching element includes a first semiconductor portion. The second switching element includes a second semiconductor portion. The first common electrode is disposed overlapping the first pixel electrode, the second pixel electrode, the third pixel electrode, the first wiring line, and at least the first semiconductor portion of the first switching element. The second common electrode is disposed overlapping the fourth pixel electrode and the second wiring line. Further, there is provided an overlapping portion that is disposed overlapping at least the second semiconductor portion of the second switching element and has the same potential as the potential of any of the plurality of common electrodes.

(2) In addition to (1), in the array substrate, the plurality of common electrodes may be a plurality of position detection electrodes, the first common electrode may be a first position detection electrode, and the second common electrode may be a second position detection electrode. The plurality of wiring lines may include a third wiring line extending along the first direction and connected to any of the plurality of position detection electrodes, and a fourth wiring line extending along the first direction and connected to at least the second switching element. At least part of the third wiring line is disposed overlapping the fourth wiring line via a second insulating film, and part of the third wiring line is disposed overlapping the second semiconductor portion. The overlapping portion may include a first overlapping portion constituted by a portion of the third wiring line overlapping the second semiconductor portion.

(3) In addition to (2), in the array substrate, the second switching element may include a first electrode connected to part of the second semiconductor portion and disposed overlapping part of the third pixel electrode, and may be provided with a second electrode disposed overlapping part of the first electrode and part of the third pixel electrode. The third wiring line may be formed of a first conductive film located on a lower-layer side relative to any of the plurality of position detection electrodes and the plurality of pixel electrodes via a third insulating film, the fourth wiring line may be formed of a second conductive film located on a lower-layer side relative to the first conductive film via the second insulating film, the first electrode may be formed of a portion of the second conductive film different from the fourth wiring line, and the second electrode may be formed of a portion of the first conductive film different from the third wiring line and the first overlapping portion, and may be connected to the third pixel electrode and the first electrode overlapping each other. The first overlapping portion may be disposed to be aligned being spaced apart from the second electrode in the second direction.

(4) In addition to (3), in the array substrate, the second switching element may include a third electrode connected to a section of the second semiconductor portion different from a section of the second semiconductor portion connected to the first electrode, the third electrode may be constituted by part of the fourth wiring line, and the first electrode may include a first portion overlapping the second electrode and a second portion extending from the first portion along the second direction and connected to part of the second semiconductor portion.

(5) In addition to any one of the above (2) to (4), in the array substrate, the plurality of wiring lines may include a fifth wiring line extending along the first direction, overlapping the first position detection electrode, disposed not overlapping the second position detection electrode, and connected to the first position detection electrode; a sixth wiring line extending along the first direction, overlapping the second position detection electrode, disposed not overlapping the first position detection electrode, and connected to the second position detection electrode; and a seventh wiring line which extends along the first direction, and at least part of which is disposed overlapping the fifth wiring line and the sixth wiring line via the second insulating film. The plurality of switching elements may include a third switching element connected to the second wiring line and the seventh wiring line, the third switching element may include a third semiconductor portion, part of the fifth or sixth wiring line may be disposed overlapping the third semiconductor portion, and the overlapping portion may include a second overlapping portion constituted by a portion of the fifth or sixth wiring line overlapping the third semiconductor portion.

(6) In addition to any one of the above (2) to (5), in the array substrate, the plurality of position detection electrodes may include a third position detection electrode aligned being spaced apart from the first position detection electrode in the second direction. The plurality of wiring lines may include an eighth wiring line extending along the first direction, disposed being interposed between the first position detection electrode and the third position detection electrode, and disposed overlapping neither the first position detection electrode nor the third position detection electrode; and a ninth wiring line which extends along the first direction, and at least part of which is disposed overlapping the eighth wiring line via the second insulating film. The eighth wiring line may be directly or indirectly connected to any of the plurality of position detection electrodes. The plurality of switching elements may include a fourth switching element connected to the second wiring line and the ninth wiring line, the fourth switching element may include a fourth semiconductor portion, part of the eighth wiring line may be disposed overlapping the fourth semiconductor portion, and the overlapping portion may include a third overlapping portion constituted by a portion of the eighth wiring line overlapping the fourth semiconductor portion.

(7) In addition to (1), in the array substrate, the plurality of common electrodes may be a plurality of position detection electrodes, the first common electrode may be a first position detection electrode, and the second common electrode may be a second position detection electrode. The plurality of wiring lines may include a tenth wiring line extending along the first direction and connected to any of the plurality of position detection electrodes; and an eleventh wiring line extending along the first direction and connected to at least the second switching element. The eleventh wiring line may be formed of a third conductive film located on a lower-layer side relative to any of the plurality of position detection electrodes and the plurality of pixel electrodes via a fourth insulating film. The tenth wiring line may be formed of a portion of the third conductive film different from the eleventh wiring line, and disposed to be aligned being spaced apart from the eleventh wiring line in the second direction. The plurality of pixel electrodes may be formed of a fourth conductive film. The overlapping portion may include a fourth overlapping portion constituted by a portion of the fourth conductive film different from the plurality of pixel electrodes.

(8) In addition to (7), in the array substrate, the fourth overlapping portion may include a fifth overlapping portion having a third portion overlapping the first position detection electrode or the second position detection electrode, and the third portion of the fifth overlapping portion may be connected to the first position detection electrode or the second position detection electrode.

(9) In addition to (7) or (8), in the array substrate, the fourth overlapping portion may include a sixth overlapping portion having a fourth portion overlapping the tenth wiring line, and the fourth portion of the sixth overlapping portion may be connected to the tenth wiring line.

(10) In addition to any one of the above (1) to (9), in the array substrate, the first common electrode and the second common electrode may be disposed to interpose the second semiconductor portion therebetween in the first direction and not to overlap the second semiconductor portion, and the overlapping portion may be disposed in a different layer from the plurality of common electrodes.

(11) In addition to (1), in the array substrate, part of the first common electrode or the second common electrode may be disposed overlapping the second semiconductor portion, and the overlapping portion may be constituted by a portion of the first common electrode or the second common electrode overlapping the second semiconductor portion.

(12) A display device according to the techniques described in the present specification includes the array substrate described in any one of the above-described (1) to (11), and a counter substrate disposed to face the array substrate.

According to the techniques described in the present specification, it is possible to make the pixel aperture ratio unlikely to decrease and to make unevenness in the display luminance unlikely to be generated.

BRIEF DESCRIPTION OF DRAWINGS

The disclosure will be described with reference to the accompanying drawings, wherein like numbers reference like elements.

DESCRIPTION OF EMBODIMENTS

First Embodiment

A first embodiment will be described with reference to FIGS. 1 to 20. In the present embodiment, an example of a liquid crystal panel (display device) 10 having an image display function and a touch panel function (position input function, position detection function) will be described. Note that an X-axis, a Y-axis, and a Z-axis are indicated in part of each drawing, and directions of these axes are drawn so as to be common in all the drawings. An upper side and a lower side in FIG. 5, FIG. 6, FIG. 7, and FIG. 16 are defined as a front side and a rear side, respectively.

Figure 1:
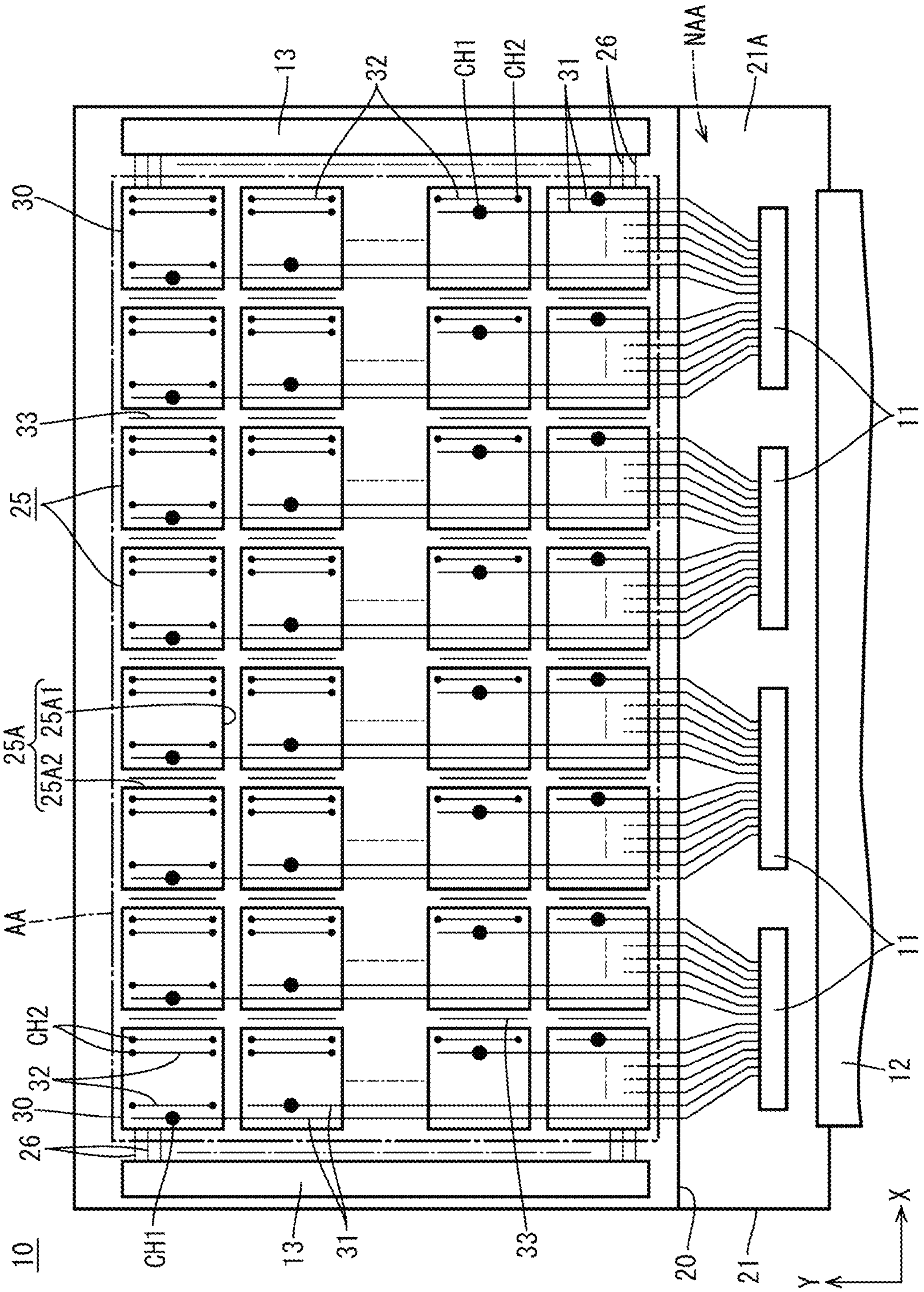
FIG. 1 is a plan view of a liquid crystal panel according to a first embodiment.

A schematic planar configuration of the liquid crystal panel 10 will now be described with reference to FIG. 1. As illustrated in FIG. 1, the liquid crystal panel 10 has a horizontally elongated, substantially rectangular shape as a whole in plan view. A short side direction, a long side direction, and a plate thickness direction (normal direction of a plate surface of each substrate 20, 21) of this liquid crystal panel 10 coincide with a Y-axis direction, an X-axis direction, and a Z-axis direction, respectively. In the present embodiment, the Y-axis direction is a "first direction" and the X-axis direction is a "second direction intersecting with the first direction". The liquid crystal panel 10 can display an image by using illumination light emitted from a backlight device (illumination device) provided on the rear side thereof. The backlight device is disposed on a rear side (back face side) of the liquid crystal panel 10, and includes a light source (for example, a light emitting diode (LED)), an optical member configured to impart an optical effect on light from the light source, thereby converting the light into planar light, and the like, for example.

In the liquid crystal panel 10, as illustrated in FIG. 1, a center portion of a screen is established as a display region (range surrounded by a dot-dash line in FIG. 1) AA in which images are displayed. In contrast, a frame-shaped (frame-formed) outer peripheral portion surrounding the display region AA of the screen of the liquid crystal panel 10 is a non-display region NAA in which images are not displayed. The liquid crystal panel 10 is formed by bonding the pair of substrates 20, 21 together. Of the pair of substrates 20, 21, the substrate on a front side (front face side) is the counter substrate 20, and the substrate on a rear side (back face side) is the array substrate (active matrix substrate) 21. The counter substrate 20 and the array substrate 21 are each formed by layering various films on an inner face side of a glass substrate. Note that polarizers are bonded to outer face sides of both the substrates 20, 21, respectively.

As illustrated in FIG. 1, the array substrate 21 has a protruding portion 21A protruding laterally along the Y-axis direction with respect to the counter substrate 20. In this protruding portion 21A, a driver (signal supply unit) 11, for supplying various signals for the display function and the touch panel function described below, and a flexible substrate 12 are mounted. The driver 11 is mounted on the protruding portion 21A of the array substrate 21 in a chip-on-glass (COG) manner. The driver 11 is composed of a large-scale integration (LSI) chip including a drive circuit in an interior thereof, and processes various signals transmitted by the flexible substrate 12. The driver 11 is disposed alongside the display region AA while being spaced apart therefrom in the Y-axis direction on the array substrate 21. The flexible substrate 12 has a configuration in which a wiring line pattern including a plurality of wiring lines are formed on a base material made of a synthetic resin material (for example, a polyimide resin) having insulating properties and flexibility. One end side portion of the flexible substrate 12 is connected to the array substrate 21, and the other end side portion thereof is connected to an external control substrate (signal supply source). Various signals supplied from the control substrate are transmitted to the liquid crystal panel 10 via the flexible substrate 12. Further, in the non-display region NAA of the array substrate 21, a pair of gate circuit portions 13 are provided, sandwiching the display region AA therebetween from both sides in the X-axis direction. The gate circuit portions 13 are each configured to supply a scanning signal to a gate wiring line 26 described below. The gate circuit portions 13 are each monolithically provided to the array substrate 21.

The liquid crystal panel 10 according to the present embodiment has both a display function for displaying an image and a touch panel function for detecting a position (input position) input by a user based on the displayed image. In the liquid crystal panel 10, a touch panel pattern for exhibiting the touch panel function is integrated (in an in-cell form). The touch panel pattern is a so-called projected electrostatic capacitance type, and the detection type thereof is a self-capacitance type. As illustrated in FIG. 1, the touch panel pattern is constituted by a plurality of touch electrodes (position detection electrodes) 30 disposed side-by-side in a matrix shape in the plate surface of the liquid crystal panel 10. The touch electrodes 30 are disposed in the display region AA of the liquid crystal panel 10. Accordingly, the display region AA of the liquid crystal panel 10 substantially matches a touch region (position input region) in which an input position can be detected. Note that the non-display region NAA substantially matches a non-touch region (non-position input region) in which an input position cannot be detected. Then, when the user brings a position input member, which is a conductor such as a finger of the user or a touch pen operated by the user, close to the surface (display surface) of the liquid crystal panel 10 based on an image displayed in the display region AA of the liquid crystal panel 10, electrostatic capacitance is formed between the position input member and the touch electrode 30. Thereby, the electrostatic capacitance detected with the touch electrode 30 being close to the position input member changes as the position input member approaches thereto, and is different from the electrostatic capacitance of the touch electrode 30 being far from the position input member. Based on the difference in electrostatic capacitance, a detection circuit described below can detect an input position.

As illustrated in FIG. 1, the plurality of touch electrodes 30 are disposed side by side being spaced apart from each other along the Y-axis direction (first direction) and the plurality of touch electrodes 30 are disposed side by side being spaced apart from each other along the X-axis direction (second direction) in the display region AA. The touch electrode 30 has a substantially rectangular shape in plan view, with one side having a dimension of several millimeters. The touch electrode 30 is much larger than a pixel PX described below in plan view, and is disposed in a range over a plurality (approximately several tens to several hundreds) of pixels PX in the X-axis direction and the Y-axis direction. A detailed configuration of the touch electrode 30 will be described below.

As illustrated in FIG. 1, a plurality of touch wiring lines (third wiring lines) 31 provided in the liquid crystal panel 10 are selectively connected to the plurality of touch electrodes 30. The touch wiring lines 31 extend substantially along the Y-axis direction. One end side portion of the touch wiring line 31 in the Y-axis direction is connected to the driver 11 in the non-display region NAA. The other end side portion of the touch wiring line 31 in the Y-axis direction is connected to a specific touch electrode 30 among the plurality of touch electrodes 30 aligned along the Y-axis direction in the display region AA. The formation range of the touch wiring line 31 in the Y-axis direction is limited to a range from the driver 11 to the touch electrode 30 to be connected thereto, and the touch wiring line 31 is not disposed on a side (upper side in FIG. 1) opposite to the driver 11 side (lower side in FIG. 1) of the touch electrode 30 to be connected thereto. Note that only one touch wiring line 31 may be connected to one touch electrode 30 depending on the number of touch wiring lines 31 installed, but a plurality of touch wiring lines 31 may be connected to one touch electrode 30. In addition, the number of touch wiring lines 31 connected to one touch electrode 30 may vary depending on the position of the touch electrode 30. In this case, for example, preferably the number of touch wiring lines 31 connected to the touch electrode 30 far from the driver 11 is set larger than the number of touch wiring lines 31 connected to the touch electrode 30 close to the driver 11, but is not necessarily limited thereto. Note that, in FIG. 1, a black dot represents the connection location (first contact hole CH1) of the touch wiring line 31 to the touch electrode 30. Furthermore, the touch wiring line 31 is connected to a detection circuit. The detection circuit may be provided in the driver 11, or may be provided outside of the liquid crystal panel 10 and connected via the flexible substrate 12. A detailed configuration of the touch wiring line 31 will be described below.

As illustrated in FIG. 1, a plurality of connection wiring lines (fifth wiring line, sixth wiring line) 32 provided in the liquid crystal panel 10 are directly connected to the plurality of touch electrodes 30. The connection wiring lines 32 extend substantially along the Y-axis direction, similarly to the touch wiring lines 31. The connection wiring line 32 overlaps the touch electrode 30 to be connected thereto, and the formation range thereof in the Y-axis direction is limited to the formation range in the Y-axis direction of the touch electrode 30 to be connected thereto. The connection wiring line 32 is connected to the touch electrode 30 to be connected thereto at a plurality of locations. Note that, in FIG. 1, a black dot represents the connection location (second contact hole CH2) of the connection wiring line 32 to the touch electrode 30. A resistance distribution of the touch electrode 30 is reduced by such a connection wiring line 32. The connection wiring lines 32 are spaced apart from the touch wiring lines 31 on the side opposite to the driver 11 side in the Y-axis direction. That is, the connection wiring lines 32 are positioned in the same row as the touch wiring lines 31. The connection wiring lines 32 can be described as being disposed utilizing space where the touch wiring lines 31 are not disposed. The number of connection wiring lines 32 overlapping the touch electrodes 30 is larger for the touch electrodes 30 farther from the driver 11 than that for the touch electrodes 30 closer to the driver 11. A detailed configuration of the connection wiring line 32 will be described below.

As illustrated in FIG. 1, a plurality of dummy touch wiring lines (eighth wiring lines) 33 provided in the liquid crystal panel 10 are indirectly connected to the plurality of touch electrodes 30. The dummy touch wiring lines 33 extend substantially along the Y-axis direction, similarly to the touch wiring lines 31 and the connection wiring lines 32. The dummy touch wiring line 33 is interposed between the touch electrodes 30 adjacent to each other in the X-axis direction, and is disposed not to overlap with any of the touch electrodes 30. The formation range in the Y-axis direction of the dummy touch wiring line 33 is limited to the formation range in the Y-axis direction of the touch electrodes 30 adjacent to each other in the X-axis direction. The dummy touch wiring lines 33 are connected to the connection wiring lines 32 adjacent to each other while being spaced apart in the X-axis direction at a plurality of locations (see FIG. 12). Accordingly, the dummy touch wiring line 33 is indirectly connected to the touch electrode 30 via the connection wiring line 32. The resistance distribution of the touch electrode 30 is further reduced by such dummy touch wiring line 33. The plurality of dummy touch wiring lines 33 are disposed side by side spaced apart in the Y-axis direction. The number of dummy touch wiring lines 33 aligned in the Y-axis direction is equal to the number of touch electrodes 30 aligned in the Y-axis direction. A detailed configuration of the dummy touch wiring line 33 will be described below.

Figure 2:
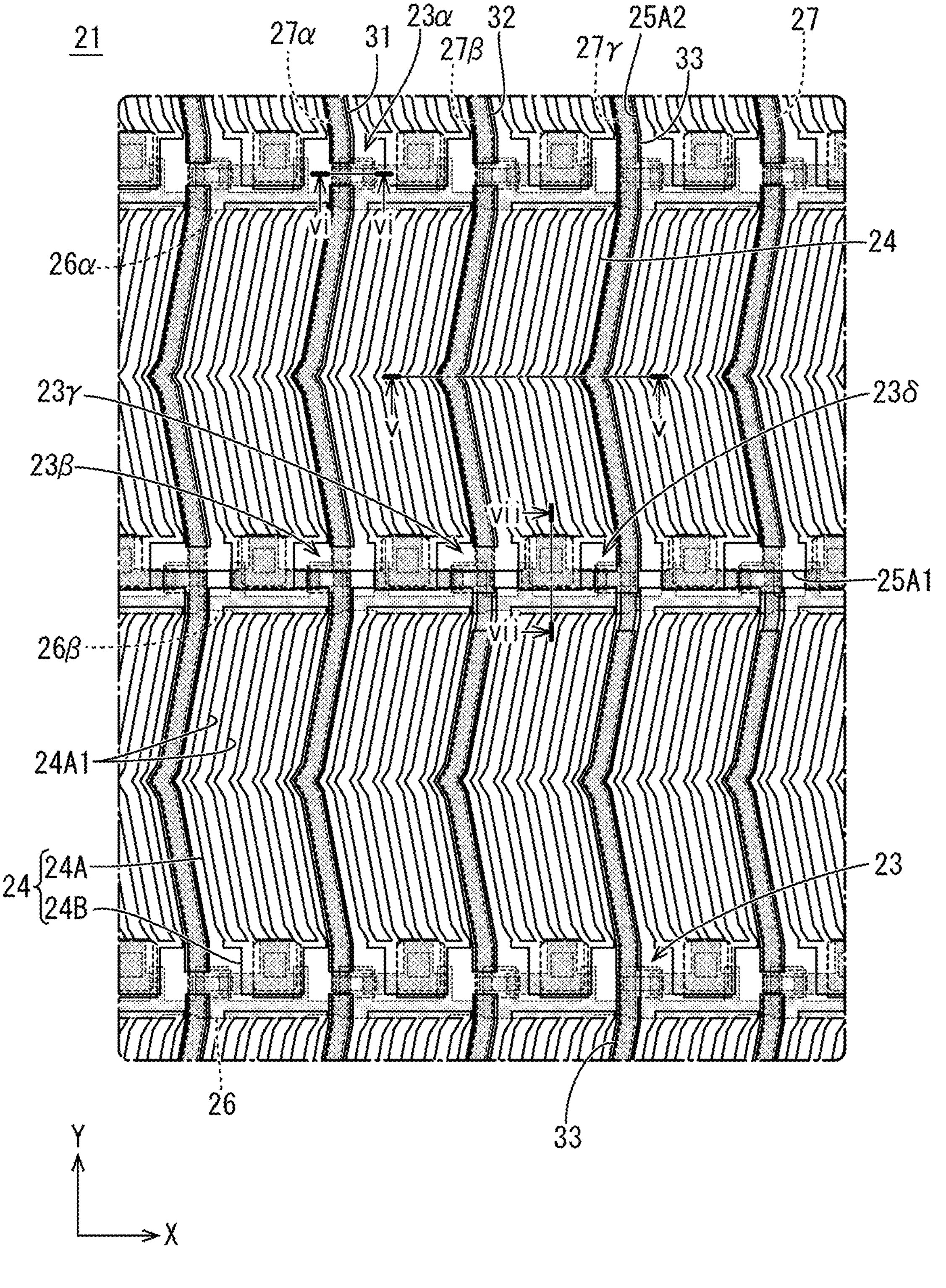
FIG. 2 is a plan view illustrating a pixel arrangement in a display region of the liquid crystal panel according to the first embodiment, and indicating a first metal film and a second metal film with different shading.

A pixel arrangement in the display region AA of the array substrate 21 will now be described with reference to FIG. 2. FIG. 2 illustrates a pixel arrangement in the vicinity of a boundary of two touch electrodes 30 aligned along the X-axis direction and two touch electrodes 30 aligned along the Y-axis direction (four touch electrodes 30 in total). In FIG. 2, a first metal film and a second metal film included in the array substrate 21 are respectively illustrated with different shading. In FIG. 2, a first transparent electrode film is indicated by a chain double-dashed line. The first metal film and the second metal film will be described in detail later. As illustrated in FIG. 2, on the inner face side of the display region AA of the array substrate 21, a plurality of thin film transistors (TFTs; switching elements) 23 and a plurality of pixel electrodes 24 are provided side by side spaced apart within a surface of the array substrate 21. The plurality of TFTs 23 and the plurality of pixel electrodes 24 are provided side by side in a matrix shape and spaced apart from each other in the Y-axis direction (first direction) and the X-axis direction (second direction) intersecting with the Y-axis direction. Gate wiring lines (first wiring lines, second wiring lines, scanning wiring lines) 26 and source wiring lines (fourth wiring lines, seventh wiring lines, ninth wiring lines, signal wiring lines) 27, which are formed in a lattice pattern, are disposed around the TFTs 23 and the pixel electrodes 24 to surround them. The gate wiring line 26 extends substantially linearly along the X-axis direction, and a plurality of the gate wiring lines 26 are disposed side by side spaced apart in the Y-axis direction, sandwiching the pixel electrode 24 therebetween. A line width of the gate wiring line 26 changes depending on the position thereof in the X-axis direction. The source wiring line 27 extends substantially along the Y-axis direction while being repeatedly bent into a zigzag shape. A plurality of the source wiring lines 27 are disposed side by side spaced apart in the X-axis direction, sandwiching the pixel electrode 24 therebetween. The gate wiring line 26 and the source wiring line 27 intersect each other, and the number of intersections thereof is a value obtained by multiplying the number of gate wiring lines 26 installed by the number of source wiring lines 27 installed. The TFT 23 is interposed between the pixel electrode 24 and the gate wiring line 26, which are connected to the TFT 23, in the Y-axis direction. Note that the plurality of TFTs 23 include those positioned on the right side in FIG. 2 with respect to the source wiring line 27 to be connected thereto, and those positioned on the left side in the same drawing. The TFT 23 located on the right side in FIG. 2 with respect to the source wiring line 27 to be connected thereto and the TFT 23 located on the left side in the same drawing are alternately aligned one by one in the Y-axis direction. The TFT 23 located on the right side in FIG. 2 with respect to the source wiring line 27 to be connected thereto and the TFT 23 located on the left side in the same drawing are configured to be reversed in the right-left direction. Further, all of the TFTs 23 are positioned on the lower side in FIG. 2 with respect to the pixel electrodes 24 to be connected thereto.

Figure 3:
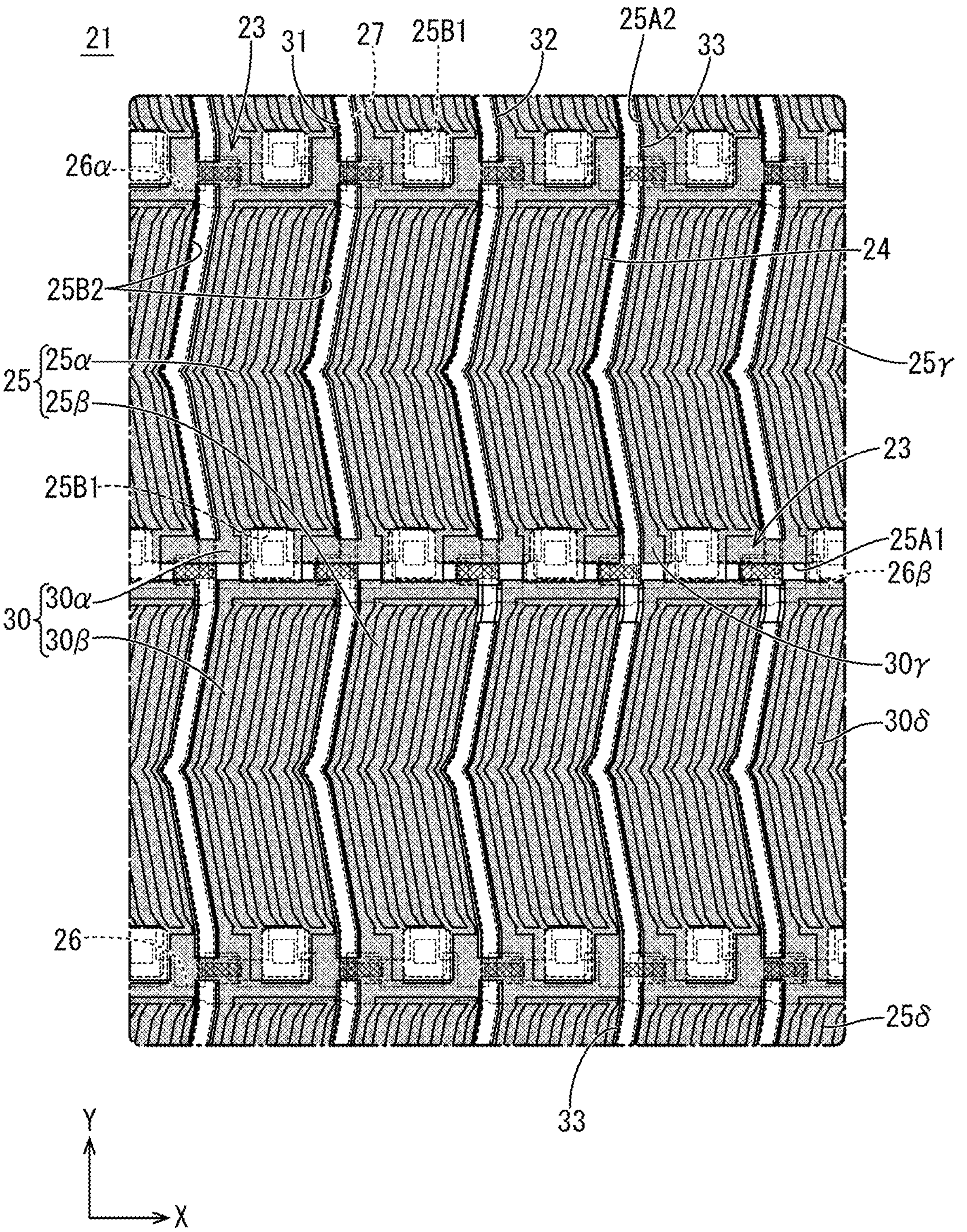
FIG. 3 is a plan view illustrating a pixel arrangement in a display region of the liquid crystal panel according to the first embodiment, and indicating a semiconductor film and a first transparent electrode film with different shading.

Next, a common electrode 25 provided on the array substrate 21 will be described with reference to FIG. 1 and FIG. 3. The pixel arrangement in the same range as that in FIG. 2 is illustrated in FIG. 3, where a first transparent electrode film included in the array substrate 21 is indicated with shading. The first transparent electrode film mentioned above will be described in detail below. As illustrated in FIG. 3, the array substrate 21 is provided with the common electrode 25 disposed across substantially the entire display region AA. The common electrode 25 overlaps a lower-layer side of the plurality of pixel electrodes 24. As illustrated in FIGS. 1 and 3, pluralities of the common electrodes 25 are disposed side by side being spaced apart from each other along the X-axis direction and the Y-axis direction, respectively, in the display region AA. That is, the common electrodes 25 constitute the touch electrodes 30 discussed above. The adjacent common electrodes 25 are partitioned by a slit 25A. The slit 25A forms a substantially lattice pattern as a whole in plan view. The slit 25A is made of a first slit 25A1 extending over the entire length of the display region AA substantially along the X-axis direction, and a second slit 25A2 extending over the entire length of the display region AA substantially along the Y-axis direction. In FIG. 3, four common electrodes 25 (touch electrodes 30) are illustrated. The common electrodes 25 (touch electrodes 30) aligned along the Y-axis direction are partitioned by the first slit 25A1. The common electrodes 25 (touch electrodes 30) aligned along the X-axis direction are partitioned by the second slit 25A2.

A common potential signal corresponding to the image display function and a touch signal (position detection signal) corresponding to the touch panel function are supplied to the touch wiring line 31 connected to the touch electrode 30 from the driver 11 by time-sharing, as illustrated in FIG. 1. A timing at which the common potential signal is supplied from the driver 11 to the touch wiring line 31 is a display period. A timing at which the touch signal is supplied from the driver 11 to the touch wiring line 31 is a sensing period (position detection period). This common potential signal is transmitted to all of the touch wiring lines 31 at the same timing (display period). As a result, all of the touch electrodes 30 are at the reference potential based on the common potential signal and thus function as the common electrode 25. In the common electrode 25, there is formed a first opening 25B1 overlapping part of the TFT 23 (near a third contact hole CH3 and a fourth contact hole CH4 described below), as illustrated in FIG. 3. A plurality of the first openings 25B1 are formed at positions in the common electrode 25 which overlap the plurality of TFTs 23, respectively. The plurality of first openings 25B1 are disposed side by side in a matrix shape spaced apart in the X-axis direction and the Y-axis direction in the common electrode 25. Short-circuiting of the common electrode 25 to the pixel electrode 24 is avoided by the first openings 25B1. In the common electrode 25, there are formed a plurality of second openings 25B2 overlapping the touch wiring line 31 and the connection wiring line 32. The plurality of second openings 25B2 have an elongated (longitudinally long) slit shape extending along the extension direction of the touch wiring line 31 and the connection wiring line 32. A formation range of the second opening 25B2 in the Y-axis direction is substantially the same as a formation range of a pixel electrode main body 24A described below of the pixel electrode 24 in the Y-axis direction.

Figure 4:
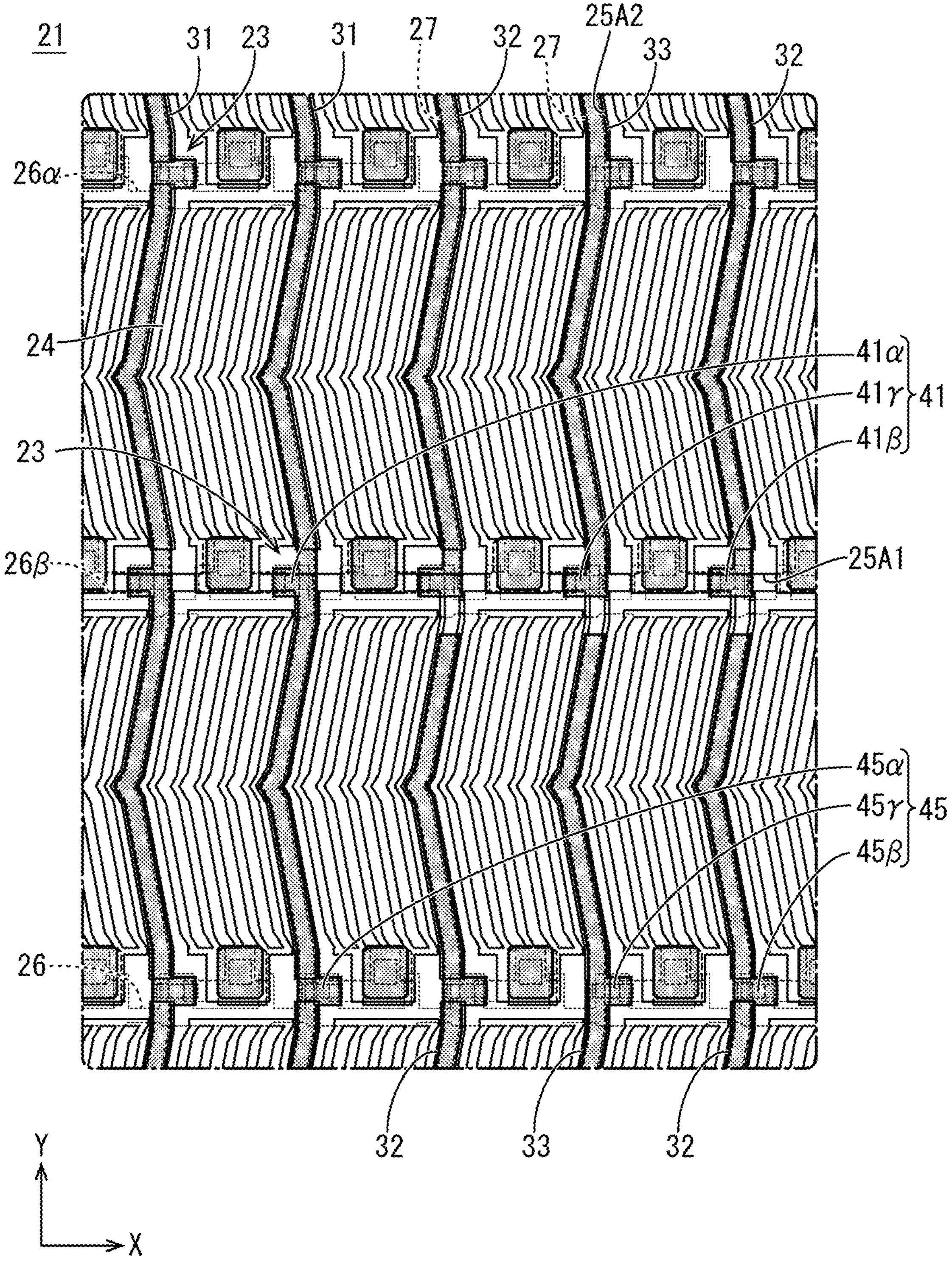
FIG. 4 is a plan view illustrating a pixel arrangement in a display region of the liquid crystal panel according to the first embodiment, and indicating a third metal film with shading.

The touch wiring line 31, the connection wiring line 32, and the dummy touch wiring line 33 will now be described with reference to FIG. 4. The pixel arrangement in the same range as that in FIG. 2 is illustrated in FIG. 4, where a third metal film included in the array substrate 21 is indicated with shading. Note that, in FIG. 4, the first transparent electrode film (common electrode 25 and touch electrode 30) and the like are indicated by chain double-dashed lines. The third metal film mentioned above will be described in detail later. As illustrated in FIG. 4, the touch wiring line 31 overlaps the source wiring line 27 in plan view. Similar to the source wiring line 27, the touch wiring line 31 extends substantially along the Y-axis direction while being repeatedly bent into a zigzag shape. The touch wiring line 31 crosses the first slit 25A1 partitioning the touch electrodes 30 adjacent to each other in the Y-axis direction. The connection wiring line 32 is in the same layer as the touch wiring line 31 and overlaps the source wiring line 27 in plan view. Similar to the source wiring line 27 and the touch wiring line 31, the connection wiring line 32 extends substantially along the Y-axis direction while being repeatedly bent into a zigzag shape. The connection wiring line 32 does not cross the first slit 25A1 partitioning the touch electrode 30 to be connected thereto and the touch electrode 30 adjacent to each other in the Y-axis direction. The connection wiring line 32 has such an alignment relation as to be spaced apart in the Y-axis direction from the touch wiring line 31 and connection wiring line 32 overlapping the touch electrode 30 adjacent in the Y-axis direction to the touch electrode 30 to be connected thereto. The dummy touch wiring line 33 is in the same layer as the touch wiring line 31 and the connection wiring line 32, and overlaps the source wiring line 27 in plan view. Similar to the source wiring line 27, the touch wiring line 31, and the connection wiring line 32, the dummy touch wiring line 33 extends substantially along the Y-axis direction while being repeatedly bent into a zigzag shape. The dummy touch wiring line 33 is disposed to overlap the second slit 25A2 partitioning the touch electrodes 30 adjacent to each other in the X-axis direction. The dummy touch wiring line 33 does not cross the first slit 25A1 partitioning the touch electrodes 30 adjacent to each other in the Y-axis direction.

Figure 5:
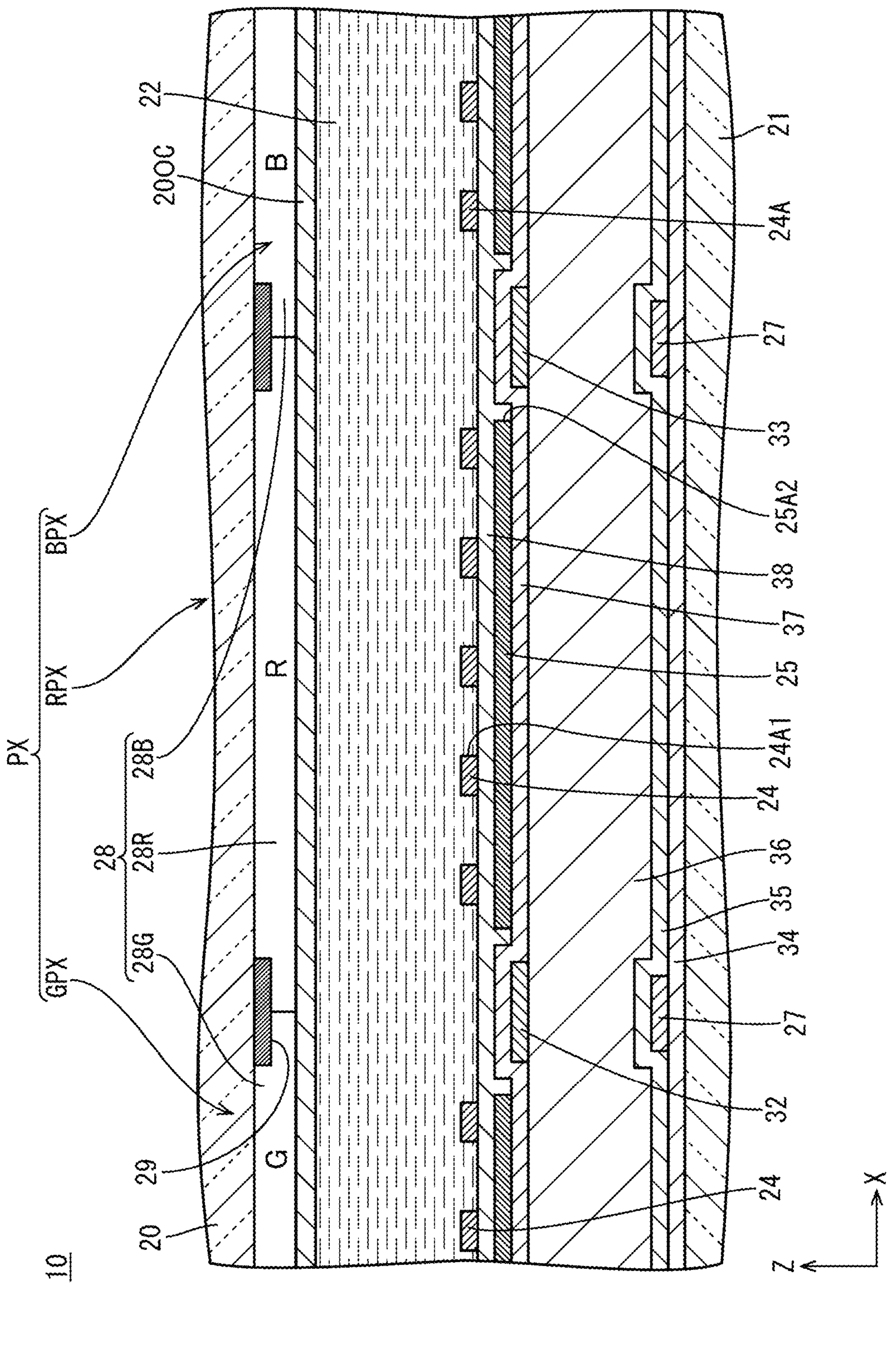
FIG. 5 is a cross-sectional view of the liquid crystal panel according to the first embodiment taken along a line v-v in FIG. 2.

A cross-sectional configuration in the vicinity of a center portion of the pixel electrode 24 (pixel PX) in the liquid crystal panel 10 will now be described with reference to FIG. 5. As illustrated in FIG. 5, the liquid crystal panel 10 includes a liquid crystal layer (medium layer) 22 disposed between the pair of substrates 20, 21 and containing liquid crystal molecules, which are substances having optical characteristics that change in accordance with application of an electrical field. Three-color color filters 28 exhibiting blue (B), green (G), and red (R) are provided in the display region AA on an inner face side of the counter substrate 20 constituting the liquid crystal panel 10. The plurality of color filters 28 exhibiting colors different from each other are arranged side by side so as to be adjacent to each other in the extension direction of the gate wiring line 26 (X-axis direction). The plurality of color filters 28 exhibiting colors different from each other extend along the extension direction of the source wiring line 27 (substantially the Y-axis direction). In this manner, the plurality of color filters 28 exhibiting colors different from each other are arrayed in a stripe pattern as a whole. These color filters 28 overlap the pixel electrodes 24 on the array substrate 21 side in plan view. The plurality of color filters 28 exhibiting colors different from each other are disposed such that boundaries thereof (color boundaries) overlap the source wiring line 27. An overcoat film 200C disposed in a solid-like form across the substantially entire region of the counter substrate 20 is provided for flattening on the upper-layer side (liquid crystal layer 22 side) of the color filter 28. Note that alignment films for aligning the liquid crystal molecules included in the liquid crystal layer 22 are respectively formed on innermost faces (uppermost layers) in contact with the liquid crystal layer 22 of both the substrates 20, 21.

As illustrated in FIG. 5, the color filters 28 include a first color filter (green color filter) 28G exhibiting green, a second color filter (blue color filter) 28B exhibiting blue, and a third color filter (red color filter) 28R exhibiting red. In the following description, when the color filters 28 are distinguished from each other, a suffix G is appended to the reference numeral of the first color filter exhibiting green, a suffix B is appended to the reference numeral of the second color filter exhibiting blue, and a suffix R is appended to the reference numeral of the third color filter exhibiting red. The first color filter 28G selectively transmits green light having a wavelength included in a green wavelength region (approximately 500 nm to approximately 570 nm). The first color filter 28G is highest in relative luminous efficiency. The second color filter 28B selectively transmits blue light included in a blue wavelength region (approximately 400 nm to approximately 500 nm). The second color filter 28B is lowest in the relative luminous efficiency. The third color filter 28R selectively transmits red light having a wavelength included in a red wavelength region (approximately 600 nm to approximately 780 nm). The third color filter 28R is lower in the relative luminous efficiency than the first color filter 28G but higher in the relative luminous efficiency than the second color filter 28B. In the present embodiment, the color filters 28 are arrayed with the first color filter 28G, the third color filter 28R, and the second color filter 28B repeatedly aligned side by side in that order from the left side in FIG. 5.

In this liquid crystal panel 10, as illustrated in FIG. 5, the three color filters 28G, 28B, 28R aligned along the X-axis direction and the three pixel electrodes 24 facing the three color filters 28G, 28B, 28R respectively constitute pixels GPX, BPX, RPX of three colors. The first pixel (green pixel) GPX exhibiting green, which has the highest luminosity factor, is constituted by the first color filter 28G and the pixel electrode 24 facing the first color filter 28G. The second pixel (blue pixel) BPX exhibiting blue, which has the lowest luminosity factor, is constituted by the second color filter 28B and the pixel electrode 24 facing the second color filter 28B. The third pixel (red pixel) RPX exhibiting red, which has an intermediate luminosity factor, is constituted by the third color filter 28R and the pixel electrode 24 facing the third color filter 28R. Then, this liquid crystal panel 10 is provided with display pixels configured that can display color display with predetermined gradation by the pixels GPX, BPX, RPX of the three colors adjacent to each other along the X-axis direction. An array pitch of the pixels GPX, BPX, RPX in the Y-axis direction is approximately three times an array pitch thereof in the X-axis direction.

Figure 7:
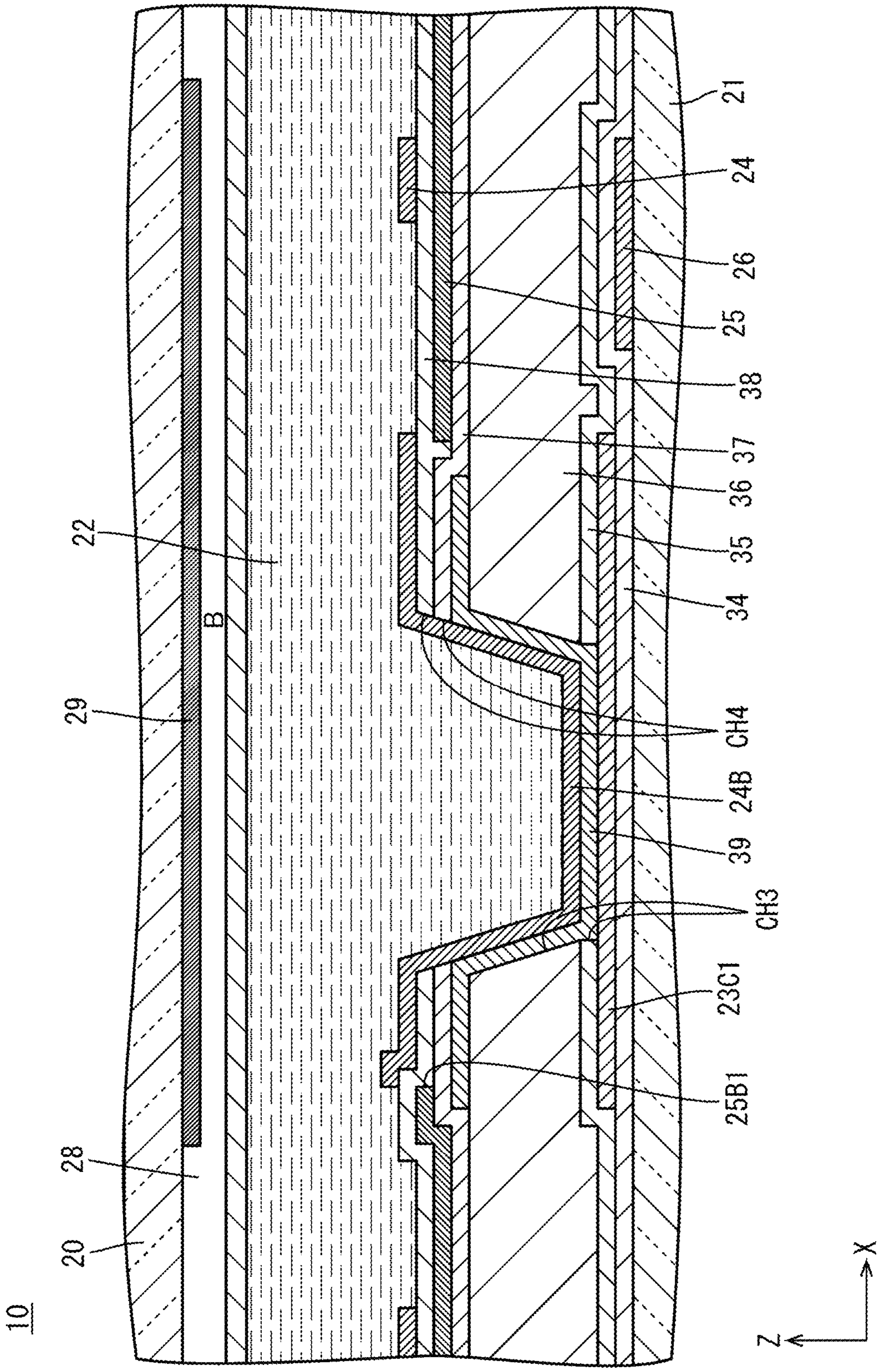
FIG. 7 is a cross-sectional view of the liquid crystal panel according to the first embodiment taken along a line vii-vii in FIG. 2.

As illustrated in FIG. 5, a light-blocking portion (inter-pixel light-blocking portion, black matrix) 29 is provided on the inner face side of the counter substrate 20 in the display region AA. The light-blocking portion 29 is composed of a light-blocking material having excellent light-blocking properties (for example, a material in which a pigment such as carbon black is contained in a photosensitive resin material such as acrylic or polyimide). The light-blocking portion 29 can block light emitted from a backlight device or the like. In the display region AA, the light-blocking portion 29 has a planar shape being in a substantially lattice pattern, and partitions adjacent pixel electrodes 24 (pixels PX). The light-blocking portion 29 overlaps at least the gate wiring line 26 and the source wiring line 27 on the array substrate 21 side in plan view. The light-blocking portion 29 includes a first light-blocking portion extending along the X-axis direction to overlap the gate wiring line 26 and a second light-blocking portion extending substantially along the Y-axis direction to overlap the source wiring line 27. In FIG. 5, only the second light-blocking portion is illustrated, while the first light-blocking portion is illustrated in FIG. 7 and the like. In the surface of the counter substrate 20, a region (pixel opening) surrounded by the first light-blocking portion and the second light-blocking portion constituting the light-blocking portion 29 overlaps most of the pixel electrode 24 to define an opening range of the pixel PX. The above-described region transmits transmission light of the pixel electrode 24 and the color filter 28, and emits light to the outside of the liquid crystal panel 10. Note that the light-blocking portion 29 is also provided in the non-display region NAA of the counter substrate 20, and is disposed in a solid-like form over substantially the entire region in the non-display region NAA.

Figure 6:
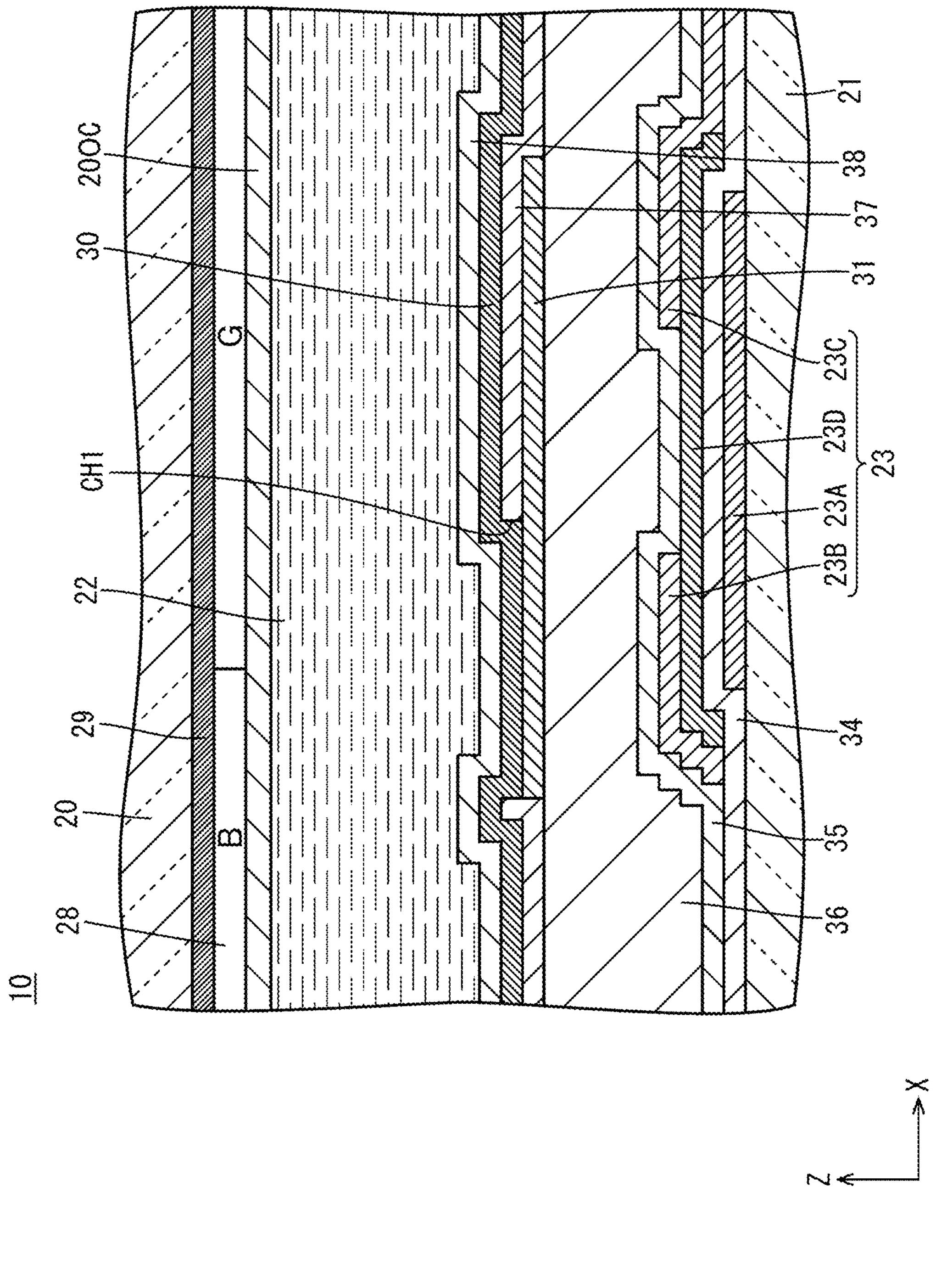
FIG. 6 is a cross-sectional view of the liquid crystal panel according to the first embodiment taken along a line vi-vi in FIG. 2.

The various films layered and formed on the inner face side of the array substrate 21 will now be described with reference to FIG. 6. As illustrated in FIG. 6, in the array substrate 21, the first metal film, a gate insulating film 34, a semiconductor film, the second metal film (second conductive film), a first interlayer insulating film (second insulating film) 35, a flattening film (second insulating film) 36, the third metal film (first conductive film), a second interlayer insulating film (third insulating film) 37, a first transparent electrode film, a third interlayer insulating film (first insulating film) 38, a second transparent electrode film, and the alignment film are layer-formed in that order from the lower-layer side (glass substrate side). The first metal film, the second metal film, and the third metal film are each a single layer film composed of one type of metal material selected from copper, titanium, aluminum, molybdenum, tungsten, and the like, or a layered film or alloy composed of different types of metal materials, and thus have conductivity and light-blocking properties. The first metal film constitutes the gate wiring line 26, a gate electrode 23A of the TFT 23, and the like. The second metal film constitutes the source wiring line 27, and a source electrode 23B and a drain electrode 23C of the TFT 23, and the like. The third metal film constitutes the touch wiring line 31, the connection wiring line 32, the dummy touch wiring line 33, and the like. The semiconductor film is composed of a thin film using, for example, an oxide semiconductor or amorphous silicon as the material thereof, and constitutes a semiconductor portion 23D of the TFT 23, and the like. The first transparent electrode film and the second transparent electrode film are composed of a transparent electrode material (for example, indium tin oxide (ITO) or indium zinc oxide (IZO)). The first transparent electrode film constitutes the common electrode 25 (touch electrode 30) and the like. The second transparent electrode film constitutes the pixel electrode 24 and the like. The alignment film is as described above.

The gate insulating film 34, the first interlayer insulating film 35, the second interlayer insulating film 37, and the third interlayer insulating film 38 are each formed of an inorganic material such as silicon nitride ($SiN_x$) or silicon oxide ($SiO_2$). The gate insulating film 34, the first interlayer insulating film 35, the second interlayer insulating film 37, and the third interlayer insulating film 38 have film thicknesses larger than those of the first transparent electrode film and the second transparent electrode film. The flattening film 36 is made of, for example, an organic material such as PMMA (acrylic resin) and has photosensitivity. The flattening film 36 has a film thickness significantly larger than the film thicknesses of the gate insulating film 34, the first interlayer insulating film 35, the second interlayer insulating film 37, and the third interlayer insulating film 38. This flattening film 36 flattens an inner face of the array substrate 21 (surface on the liquid crystal layer 22 side). The gate insulating film 34 maintains an insulated state between the first metal film on the lower-layer side and the semiconductor film and the second metal film on the upper-layer side. For example, an intersection between the gate wiring line 26 composed of the first metal film and the source wiring line 27 composed of the second metal film is maintained in an insulated state by the gate insulating film 34. In addition, in the TFT 23, an overlapping area between the gate electrode 23A composed of the first metal film and the semiconductor portion 23D composed of the semiconductor film is maintained in an insulated state by the gate insulating film 34. The first interlayer insulating film 35 and the flattening film 36 maintain an insulated state between the semiconductor film and the second metal film on the lower-layer side and the third metal film on the upper-layer side. For example, an overlapping area between the source wiring line 27 composed of the second metal film and the wiring lines 31 to 33 composed of the third metal film is maintained in an insulated state by the first interlayer insulating film 35 and the flattening film 36. The second interlayer insulating film 37 maintains the insulated state between the third metal film on the lower-layer side and the first transparent electrode film on the upper-layer side. For example, an overlapping area between the wiring lines 31 to 33 composed of the third metal film and the common electrode 25 (touch electrode 30) composed of the first transparent electrode film is maintained in an insulated state by the second interlayer insulating film 37. The third interlayer insulating film 38 maintains an insulated state between the first transparent electrode film on the lower-layer side and the second transparent electrode film on the upper-layer side. For example, an overlapping area between the common electrode 25 (touch electrode 30) composed of the first transparent electrode film and the pixel electrode 24 composed of the second transparent electrode film is maintained in the insulated state by the third interlayer insulating film 38.

Figure 8:
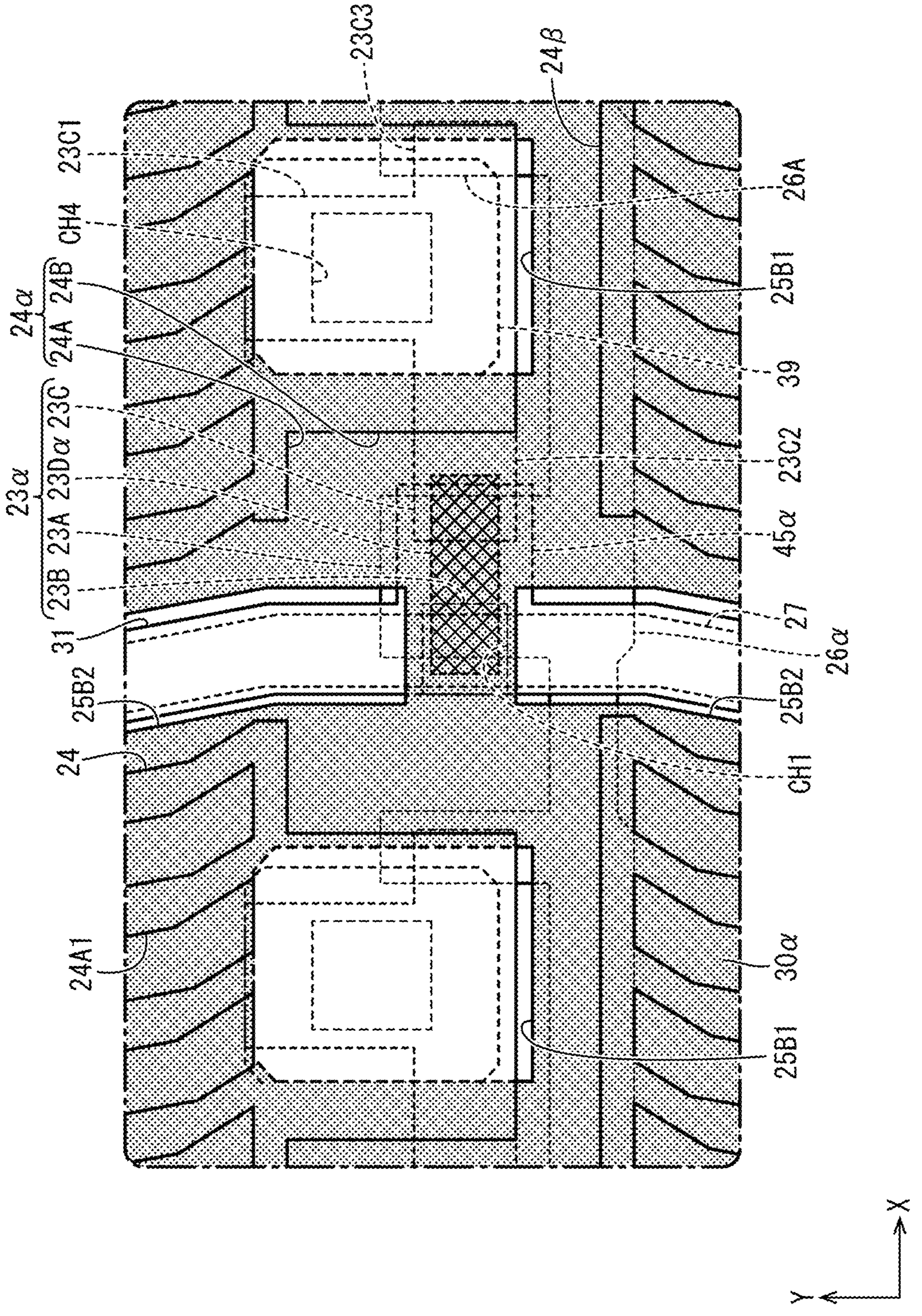
FIG. 8 is an enlarged plan view illustrating a TFT, a touch wiring line, and the like in a formation range of a touch electrode according to the first embodiment, and indicating a semiconductor film and a first transparent electrode film with different shading.
Figure 9:
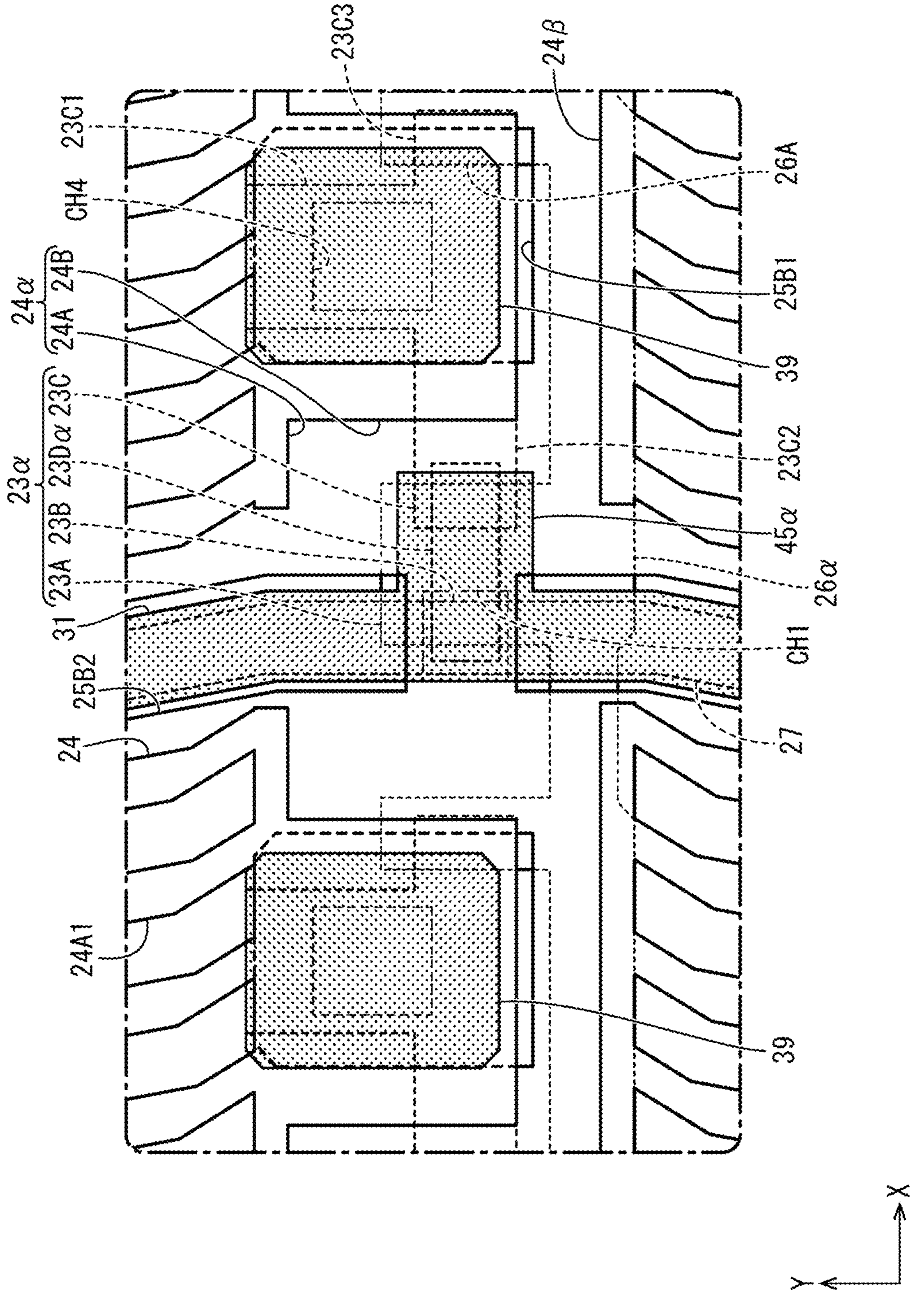
FIG. 9 is an enlarged plan view illustrating a TFT, a touch wiring line, and the like in a formation range of a touch electrode according to the first embodiment, and indicating the third metal film with shading.

Next, the TFT 23 will be described with reference to FIG. 6 to FIG. 9. In FIGS. 8 and 9, the TFT 23 (first TFT 23α described below), the touch wiring line 31, and the like in a formation range of the touch electrode 30 (first touch electrode 30α described below) are illustrated in an enlarged manner. In FIG. 8, the semiconductor film and the first transparent electrode film included in the array substrate 21 are indicated with different shading. In FIG. 9, the third metal film included in the array substrate 21 is indicated with shading. In FIG. 9, the first transparent electrode film is indicated by a chain double-dashed line. As illustrated in FIG. 6 and FIG. 8, the TFT 23 includes the gate electrode 23A made of the first metal film. The gate electrode 23A is a portion extending along the Y-axis direction from the middle of the gate wiring line 26 extending along the X-axis direction. In other words, the gate electrode 23A is formed by partially widening the gate wiring line 26. The dimension of the gate electrode 23A in the X-axis direction is equivalent to the linear dimension of the semiconductor portion 23D described below. The gate electrode 23A overlaps most of the range of the source wiring line 27 in the X-axis direction. The gate electrode 23A drives the TFT 23 based on a scanning signal supplied to the gate wiring line 26. The TFT 23 includes the source electrode 23B composed of the second metal film. The source electrode 23B is constituted by part of the source wiring line 27 (overlapping portion with the gate electrode 23A). Accordingly, the source wiring line 27 does not have a widened portion (extending portion) as in the gate electrode 23A of the gate wiring line 26. The source electrode 23B is disposed at one end in the X-axis direction of the TFT 23 (left end illustrated in FIG. 6 and FIG. 8). The source electrode 23B overlaps part of the gate electrode 23A and is connected to one end portion of the semiconductor portion 23D.

As illustrated in FIG. 7 and FIG. 8, the TFT 23 includes the drain electrode 23C made of the second metal film. The drain electrode 23C is disposed at a position spaced apart from the source electrode 23B in the X-axis direction, that is, at the other end of the TFT 23 in the X-axis direction (right end illustrated in FIG. 7 and FIG. 8). The drain electrode 23C is formed in a substantially reverse T-shape in plan view. The drain electrode 23C includes a first drain-electrode forming portion (first portion) 23C1 disposed at a position spaced apart from the source electrode 23B in the X-axis direction, a second drain-electrode forming portion (second portion) 23C2 extending from the first drain-electrode forming portion 23C1 along the X-axis direction toward the source electrode 23B side, and a third drain-electrode forming portion 23C3 extending from the first drain-electrode forming portion 23C1 along the X-axis direction toward a side opposite to the source electrode 23B side. The first drain-electrode forming portion 23C1 of the drain electrode 23C is connected to part (contact portion 24B described later) of the pixel electrode 24. The second drain-electrode forming portion 23C2 of the drain electrode 23C is disposed to overlap part of the gate electrode 23A, and is connected to the other end portion of the semiconductor portion 23D, that is, to the end portion on the opposite side to the source electrodes 23B side. An intermediate electrode 39 made of the third metal film is provided at a position overlapping both the first drain-electrode forming portion 23C1 of the drain electrode 23C and part of the pixel electrode 24, as illustrated in FIGS. 7 and 9. The intermediate electrode 39 is positioned between the drain electrode 23C and the pixel electrode 24 in the Z-axis direction. The intermediate electrode 39 has a substantially rectangular island shape in plan view, and is physically separated from the touch wiring line 31 and the connection wiring line 32 composed of other portions of the same third metal film. The third contact hole CH3 is formed at a position overlapping the first drain-electrode forming portion 23C1 of the drain electrode 23C and the intermediate electrode 39 in the first interlayer insulating film 35 and the flattening film 36 interposed between the first drain-electrode forming portion 23C1 of the drain electrode 23C and the intermediate electrode 39. The intermediate electrode 39 is connected to the drain electrode 23C through the third contact hole CH3. In the second interlayer insulating film 37 and the third interlayer insulating film 38 interposed between the intermediate electrode 39 and the pixel electrode 24, the fourth contact hole CH4 is formed at a position overlapping the intermediate electrode 39 and the pixel electrode 24. The pixel electrode 24 is connected to the intermediate electrode 39 through the fourth contact hole CH4. Thus, the pixel electrode 24 is connected to the drain electrode 23C via the intermediate electrode 39. The third drain-electrode forming portion 23C3 of the drain electrode 23C overlaps a widened portion 26A formed by partially widening the gate wiring line 26. The widened portion 26A is disposed at a position spaced apart from the gate electrodes 23A in the X-axis direction. Since the third drain-electrode forming portion 23C3 of the drain electrode 23C is disposed overlapping the widened portion 26A, capacitance between the gate wiring line 26 and the drain electrode 23C (that is, the pixel electrode 24) is unlikely to fluctuate even when the drain electrode 23C is positionally offset in the X-axis direction relative to the gate wiring line 26 during the manufacture of the array substrate 21.

As illustrated in FIG. 6 and FIG. 8, the TFT 23 includes the semiconductor portion 23D having an island shape and including a channel portion. The semiconductor portion 23D extends along the X-axis direction and is formed in a horizontally elongated rectangular shape in plan view. Most of the semiconductor portion 23D overlaps the gate electrode 23A via the gate insulating film 34. One end portion of the semiconductor portion 23D in the X-axis direction overlaps substantially the entire width of the source wiring line 27 and is connected thereto. The other end portion of the semiconductor portion 23D in the X-axis direction overlaps and is connected to an extending tip portion from the first drain-electrode forming portion 23C1 of the second drain-electrode forming portion 23C2 of the drain electrode 23C. As discussed above, the semiconductor portion 23D is disposed at a position closer to the source wiring line 27 than to the first drain-electrode forming portion 23C1 of the drain electrode 23C in the X-axis direction. A portion of the semiconductor portion 23D which overlaps the gate electrode 23A but overlaps none of the source electrode 23B and the drain electrode 23C is a channel portion that functions as a channel (current path). A portion of the semiconductor portion 23D which overlaps the source electrode 23B and the drain electrode 23C is a portion that does not function as a channel. When the TFT 23 is in an on state based on a scanning signal supplied to the gate electrode 23A, an image signal (data signal) supplied to the source wiring line 27 is supplied from the source electrode 23B to the drain electrode 23C via the semiconductor portion 23D. As a result, the pixel electrode 24 is charged to the potential based on the image signal.

The pixel electrode 24 will now be described with reference to FIG. 5, FIG. 7, and FIG. 8. As illustrated in FIG. 8, the pixel electrode 24 includes the pixel electrode main body 24A with a planar shape being longitudinally elongated. The pixel electrode main body 24A is bent midway in the longitudinal direction thereof. Specifically, the pixel electrode main body 24A is slightly inclined relative to the Y-axis direction at both side edges in the longitudinal direction, and bent once at a substantially central position, thereby forming a shallow V-shape in which the apex angle is an obtuse angle. As illustrated in FIGS. 5 and 8, a plurality of slits 24A1 (four slits in FIG. 5, FIG. 8, and the like) each extending along a side edge on the longitudinal side are formed in the pixel electrode main body 24A. Note that a specific number of installations, a shape, a formation range, and the like of the slits 24A1 can be changed as appropriate to other than those illustrated in the drawings. As illustrated in FIG. 8, the pixel electrode 24 includes the contact portion 24B protruding toward one side along the Y-axis direction from the pixel electrode main body 24A. The contact portion 24B protrudes downward from the pixel electrode main body 24A in FIG. 8, and is disposed to overlap the first drain-electrode forming portion 23C1 of the drain electrode 23C and the intermediate electrode 39. The contact portion 24B has a rectangular shape in plan view. As illustrated in FIG. 7, the contact portion 24B is a section connected to the first drain-electrode forming portion 23C1 of the drain electrode 23C via the intermediate electrode 39. When the pixel electrode 24 configured as discussed above is charged, a potential difference is generated between the pixel electrode 24 and the common electrode 25 overlapping each other. As a result, a fringe electrical field (oblique electrical field) including a component in a normal direction with respect to the plate surface of the array substrate 21 in addition to a component along the plate surface of the array substrate 21 is generated between an opening edge of the slit 24A1 in the pixel electrode 24 and the common electrode 25. By using the fringe electrical field, the alignment state of the liquid crystal molecules contained in the liquid crystal layer 22 can be controlled. In other words, the liquid crystal panel 10 according to the present embodiment has an operation mode of a fringe field switching (FFS) mode.

Next, a connection structure between the touch electrode 30 and the touch wiring line 31 will be described with reference to FIGS. 4, 6, and 8. As illustrated in FIG. 6, the second interlayer insulating film 37 is interposed between the touch wiring line 31 made of the third metal film and the touch electrode 30 made of the first transparent electrode film. In the second interlayer insulating film 37, the first contact hole CH1 for connecting the touch wiring line 31 and the touch electrode 30 is formed to be an opening. As illustrated in FIGS. 4 and 8, the first contact hole CH1 is disposed at a position overlapping both the touch wiring line 31 and the touch electrode 30 in which the touch wiring line 31 is to be connected thereto. Specifically, the first contact hole CH1 overlaps the source electrode 23B provided in the predetermined TFT 23 included in the plurality of TFTs 23 each overlapping both the touch wiring line 31 and the touch electrode 30.

Figure 10:
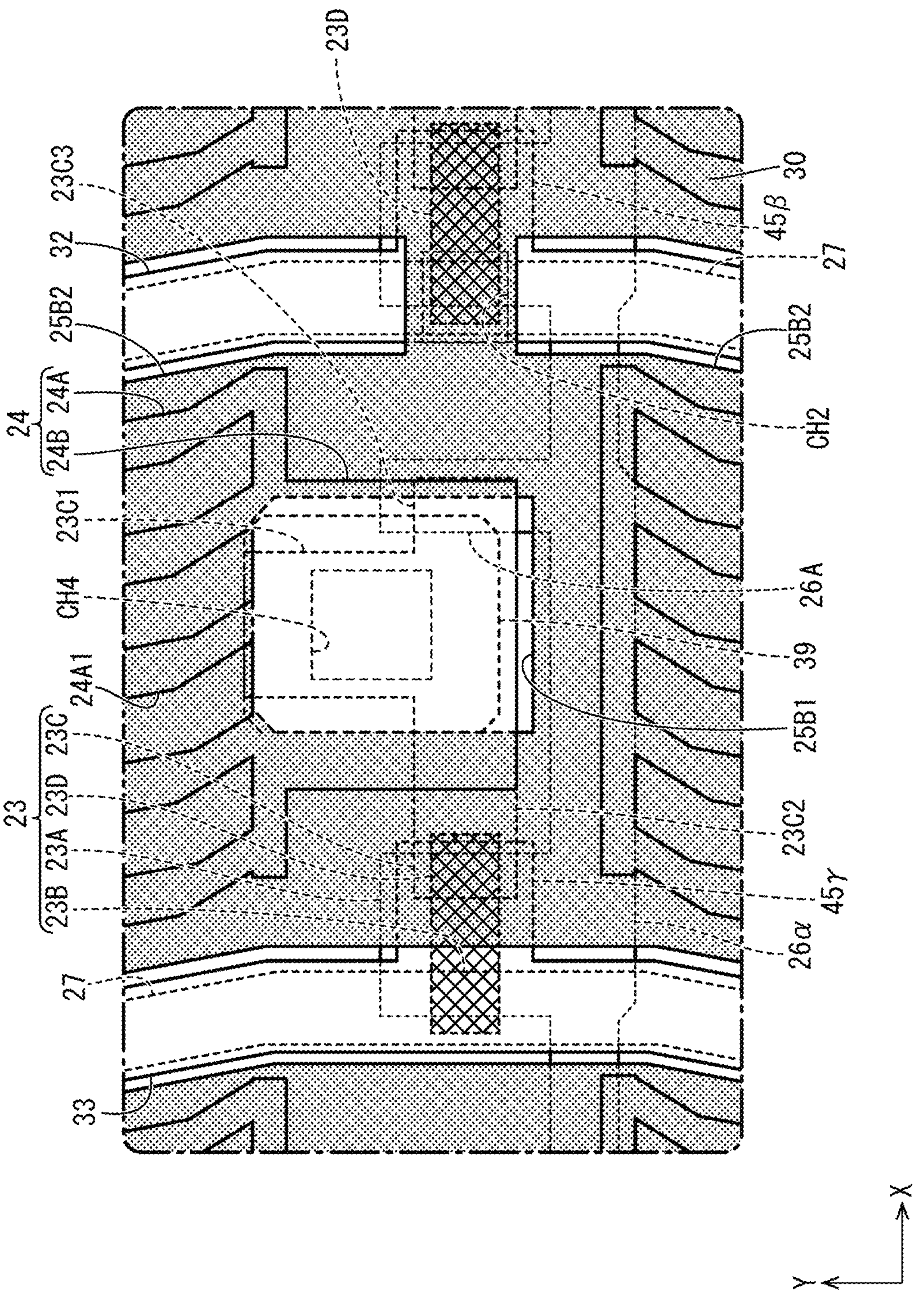
FIG. 10 is an enlarged plan view illustrating a TFT, a connection wiring line, and the like in a formation range of a touch electrode according to the first embodiment, and indicating a semiconductor film and a first transparent electrode film with different shading.
Figure 11:
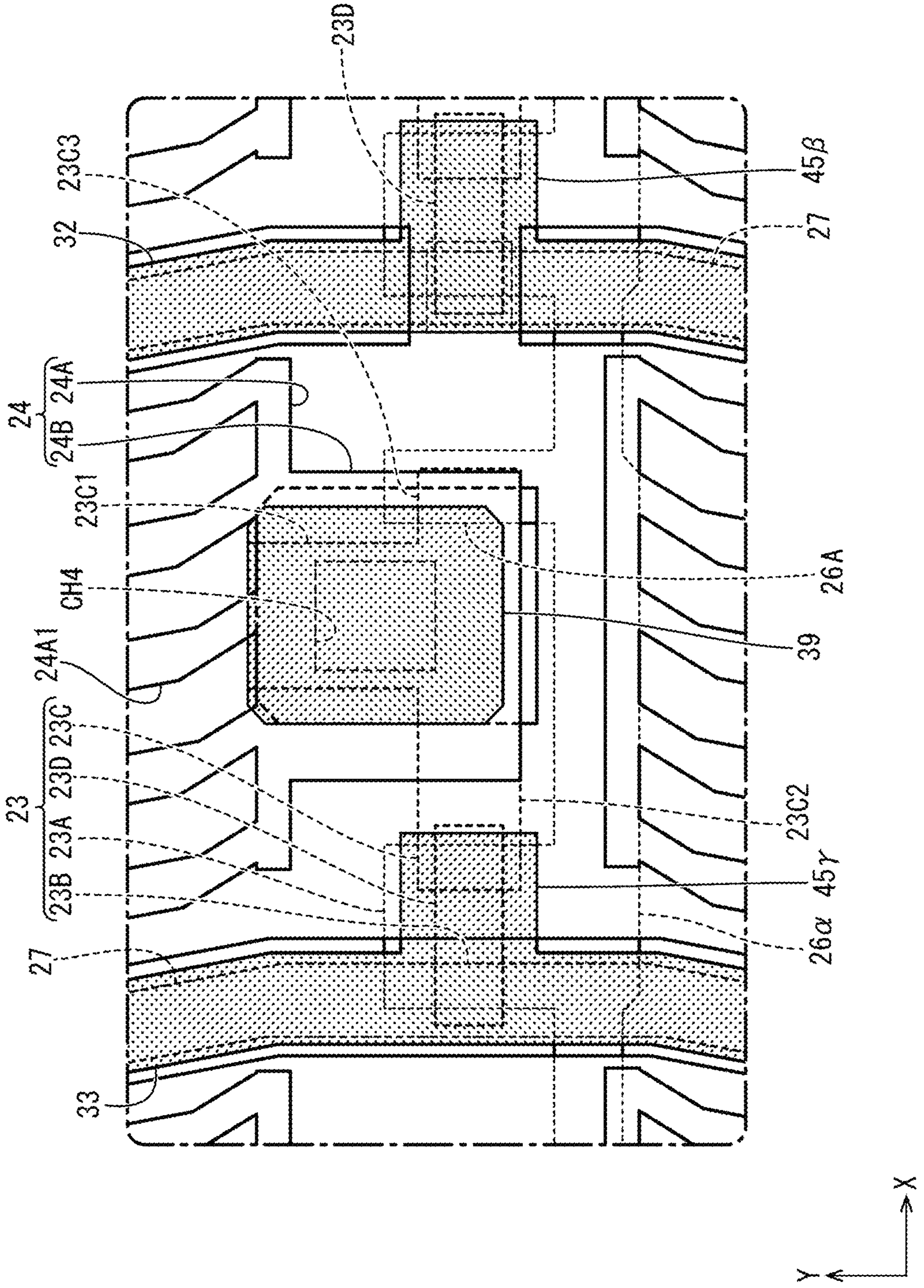
FIG. 11 is an enlarged plan view illustrating a TFT, a connection wiring line, and the like in a formation range of a touch electrode according to the first embodiment, and indicating the third metal film with shading.

The connection structure between the touch electrode 30 and the connection wiring line 32 will be described with reference to FIGS. 4, 10, and 11. In FIGS. 10 and 11, the TFT 23 in the formation range of the touch electrode 30, the connection wiring line 32, and the like are illustrated in an enlarged manner. In FIG. 10, the semiconductor film and the first transparent electrode film included in the array substrate 21 are indicated with different shading. In FIG. 11, the third metal film included in the array substrate 21 is indicated with shading. In FIG. 11, the first transparent electrode film is indicated by a chain double-dashed line. The connection wiring line 32 and the touch wiring line 31 are made of the same third metal film. Accordingly, the second interlayer insulating film 37 is interposed between the connection wiring line 32 and the touch electrode 30 (see FIG. 6). In the second interlayer insulating film 37, as illustrated in FIGS. 4, 10, and 11, the second contact hole CH2 for connecting the connection wiring line 32 and the touch electrode 30 is formed to be an opening. The second contact hole CH2 is disposed at a position overlapping both the connection wiring line 32 and the touch electrode 30 overlapping with the connection wiring line 32. Specifically, the second contact hole CH2 overlaps the source electrode 23B provided in the predetermined TFT 23 included in the plurality of TFTs 23 each overlapping both the connection wiring line 32 and the touch electrode 30. The cross-sectional configuration of the connection location between the touch electrode 30 and the connection wiring line 32 is the same as the cross-sectional configuration of the connection location between the touch electrode 30 and the touch wiring line 31 illustrated in FIG. 6.

Figure 12:
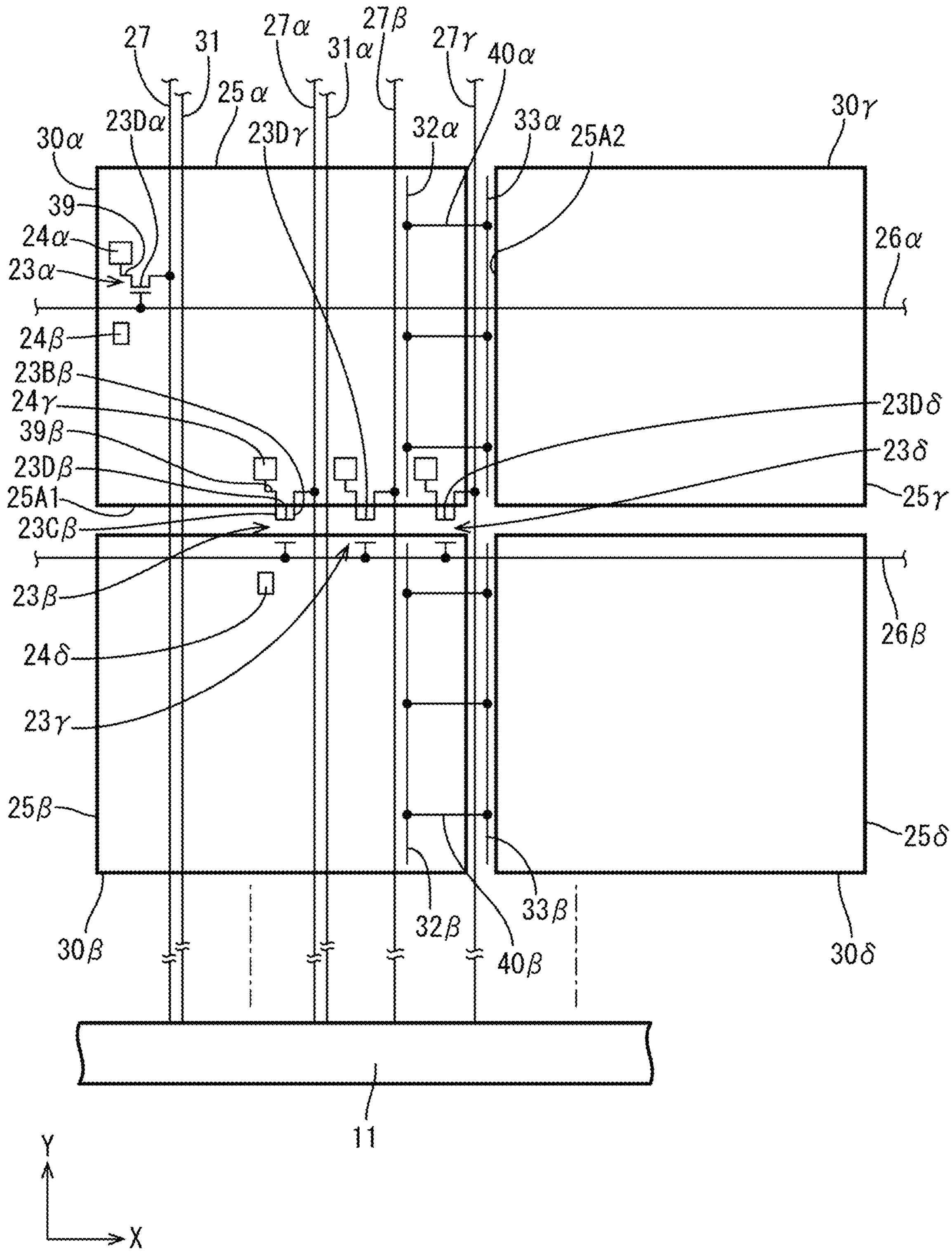
FIG. 12 is a plan view schematically illustrating a relationship between four touch electrodes, and a TFT, a pixel electrode, a gate wiring line, a source wiring line, a touch wiring line, a connection wiring line and a dummy touch wiring line, according to the first embodiment.

Next, the specific touch electrode 30 among the plurality of touch electrodes 30 (common electrodes 25), and the TFT 23, semiconductor portion 23D, pixel electrode 24, gate wiring line 26, source wiring line 27, touch wiring line 31, connection wiring line 32, and dummy touch wiring line 33 related to the above touch electrode 30 will be described in detail with reference to FIGS. 12 to 20. In FIG. 12, four touch electrodes 30 among the plurality of touch electrodes 30 are particularly illustrated. Hereinafter, when the illustrated touch electrodes 30 are distinguished from each other, the upper-left touch electrode 30 in FIG. 12 is referred to as a "first touch electrode (first position detection electrode)" with a suffix α appended to the reference numeral thereof, the lower-left touch electrode 30 in FIG. 12 is referred to as a "second touch electrode (second position detection electrode)" with a suffix β appended to the reference numeral thereof, the upper-right touch electrode 30 in FIG. 12 is referred to as a "third touch electrode (third position detection electrode)" with a suffix γ appended to the reference numeral thereof, and the lower-right touch electrode 30 in FIG. 12 is referred to as a "fourth touch electrode" with a suffix δ appended to the reference numeral thereof. When the illustrated touch electrodes 30 are not distinguished and are collectively referenced, no suffix is appended to the reference numerals thereof. The first touch electrode 30α is a first common electrode 25α. The second touch electrode 30β is a second common electrode 25β. The third touch electrode 30γ is a third common electrode 25γ. The fourth touch electrode 30δ is a fourth common electrode 25δ. The first touch electrode 30α (first common electrode 25α), the second touch electrode 30β (second common electrode 25β), the third touch electrode 30γ (third common electrode 25γ), and the fourth touch electrode 30δ (fourth common electrode 25δ) are also illustrated in FIG. 3.

In FIG. 12, a plurality of the gate wiring lines 26 overlapping the first touch electrode 30α and the second touch electrode 30β are illustrated. In the following description, when the gate wiring lines 26 are distinguished from each other, the gate wiring line 26 overlapping the first touch electrode 30α is referred to as a "first gate wiring line (first wiring line)" and a suffix α is appended to the reference numeral thereof, and the gate wiring line 26 overlapping the second touch electrode 30β and being closest to the first slit 25A1 partitioning the first touch electrode 30α and the second touch electrode 30β is referred to as a "second gate wiring line (second wiring line)" and a suffix β is appended to the reference numeral thereof. When the gate wiring lines 26 are not distinguished and are collectively referenced, no suffix is appended to the reference numerals. The first gate wiring line 26α is also illustrated in FIGS. 2 to 4 and FIGS. 8 to 11. The second gate wiring line 26β is also illustrated in FIGS. 2 to 4.

In FIG. 12, the plurality of pixel electrodes 24 each overlapping the first touch electrode 30α and the second touch electrode 30β are illustrated. In the following description, when the pixel electrodes 24 are distinguished from each other, the pixel electrode 24 overlapping the first touch electrode 30α and being adjacent to the first gate wiring line 26α at the upper side (at the opposite side to the driver 11 side) in FIG. 12 is referred to as a "first pixel electrode" and a suffix α is appended to the reference numeral thereof, the pixel electrode 24 overlapping the first touch electrode 30α and interposing the first gate wiring line 26α between the pixel electrode 24 and the first pixel electrode 24α is referred to as a "second pixel electrode" and a suffix β is appended to the reference numeral thereof, the pixel electrode 24 overlapping the first touch electrode 30α and being adjacent to the second gate wiring line 26β at the upper side in FIG. 12 is referred to as a "third pixel electrode" and a suffix γ is appended to the reference numeral thereof, and the pixel electrode 24 overlapping the second touch electrode 30β and interposing the second gate wiring line 26β between the pixel electrode 24 and the third pixel electrode 24γ is referred to as a "fourth pixel electrode" and a suffix δ is appended to the reference numeral thereof. When the pixel electrodes 24 are not distinguished and are collectively referenced, no suffix is appended to the reference numerals.

In FIG. 12, the touch wiring line 31 overlapping the first touch electrode 30α and the second touch electrode 30β is illustrated. In the following description, when the touch wiring lines 31 are distinguished from each other, the touch line 31 overlapping the source wiring line 27 (first source wiring line 27α described below) connected to the TFT 23 (second TFT 23β described below) of the third pixel electrode 24γ to be connected thereto is referred to as a "first touch wiring line (third wiring line)" with a suffix α appended to the reference numeral thereof. When the touch wiring lines 31 are not distinguished and are collectively referenced, no suffix is appended to the reference numerals.

In FIG. 12, the plurality of connection wiring lines 32 each overlapping the first touch electrode 30α and the second touch electrode 30β are illustrated. In the following description, when the connection wiring lines 32 are distinguished from each other, the connection wiring line 32 overlapping the first touch electrode 30α is referred to as a "first connection wiring line (fifth wiring line)" and a suffix α is appended to the reference numeral thereof, and the connection wiring line 32 overlapping the second touch electrode 30β and being aligned spaced apart from the first connection wiring line 32α in the Y-axis direction is referred to as a "second connection wiring line (sixth wiring line)" and a suffix β is appended to the reference numeral thereof. When the connection wiring lines 32 are not distinguished and are collectively referenced, no suffix is appended to the reference numerals.

In FIG. 12, the dummy touch wiring line 33 is illustrated. In the following description, when the dummy touch wiring lines 33 are distinguished from each other, the dummy touch wiring line 33 interposed between the first touch electrode 30α and the third touch electrode 30γ is referred to as a "first dummy touch wiring line (eighth wiring line)" and a suffix α is appended to the reference numeral thereof, and the dummy touch wiring line 33 interposed between the second touch electrode 30β and the fourth touch electrode 30δ is referred to as a "second dummy touch wiring line" and a suffix β is appended to the reference numeral thereof. When the dummy touch wiring lines 33 are not distinguished and are collectively referenced, no suffix is appended to the reference numerals.

In FIG. 12, a plurality of the source wiring lines 27 are illustrated. In the following description, when the source wiring lines 27 are distinguished from each other, the source wiring line 27 overlapping the first touch wiring line 31α is referred to as a "first source wiring line (fourth wiring line)" and a suffix α is appended to the reference numeral thereof, the source wiring line 27 overlapping the first connection wiring line 32α and the second connection wiring line 32β is referred to as a "second source wiring line (seventh wiring line)" and a suffix β is appended to the reference numeral thereof, and the source wiring line 27 overlapping the first dummy touch wiring line 33α and the second dummy touch wiring line 33β is referred to as a "third source wiring line (ninth wiring line)" and a suffix γ is appended to the reference numeral thereof. When the source wiring lines 27 are not distinguished and are collectively referenced, no suffix is appended to the reference numerals. The first source wiring line 27α, the second source wiring line 27β, and the third source wiring line 27γ are also illustrated in FIG. 2.

The plurality of TFTs 23 are illustrated in FIG. 12. In the following description, when the TFTs 23 are distinguished from each other, the TFT 23 connected to the first gate wiring line 26α and the first pixel electrode 24α is referred to as a "first TFT (first switching element)" with a suffix α appended to the reference numeral thereof, the TFT 23 connected to the second gate wiring line 26β, the first source wiring line 27α, and the third pixel electrode 24γ is referred to as a "second TFT (second switching element)" with a suffix β appended to the reference numeral thereof, the TFT 23 connected to the second gate wiring line 26β and the second source wiring line 27β is referred to as a "third TFT (third switching element)" with a suffix γ appended to the reference numeral thereof, and the TFT 23 connected to the second gate wiring line 26β and the third source wiring line 27γ is referred to as a "fourth TFT (fourth switching element)" with a suffix δ appended to the reference numeral thereof. When the TFTs 23 are not distinguished and are collectively referenced, no suffix is appended to the reference numerals. The first TFT 23α, the second TFT 23β, the third TFT 23γ, and the fourth TFT 23δ are also illustrated in FIG. 2.

The source electrodes 23B provided in the plurality of TFTs 23 are illustrated in FIG. 12. In the following description, when the source electrodes 23B are distinguished from each other, the source electrode 23B provided in the second TFT 23β is referred to as a "second source electrode (third electrode)" and a suffix β is appended to the reference numeral thereof, and when they are not distinguished and are collectively referenced, no suffix is appended to the reference numerals.

The drain electrodes 23C provided in the plurality of TFTs 23 are illustrated in FIG. 12. In the following description, when the drain electrodes 23C are distinguished from each other, the drain electrode 23C provided in the second TFT 23β is referred to as a "second drain electrode (first electrode)" and a suffix β is appended to the reference numeral thereof, and when they are not distinguished and are collectively referenced, no suffix is appended to the reference numerals.

The semiconductor portions 23D provided in the plurality of TFTs 23 are illustrated in FIG. 12. In the following description, when the semiconductor portions 23D are distinguished from each other, the semiconductor portion 23D included in the first TFT 23α is referred to as a "first semiconductor portion" with a suffix α appended to the reference numeral thereof, the semiconductor portion 23D included in the second TFT 23β is referred to as a "second semiconductor portion" with a suffix β appended to the reference numeral thereof, the semiconductor portion 23D included in the third TFT 23γ is referred to as a "third semiconductor portion" with a suffix γ appended to the reference numeral thereof, and the semiconductor portion 23D included in the fourth TFT 23δ is referred to as a "fourth semiconductor portion" with a suffix δ appended to the reference numeral thereof. When the semiconductor portions 23D are not distinguished and are collectively referenced, no suffix is appended to the reference numerals.

A plurality of the intermediate electrodes 39 are illustrated in FIG. 12. In the following description, when the intermediate electrodes 39 are distinguished from each other, the intermediate electrode 39 overlapping the second drain electrode 23Cβ is referred to as a "second intermediate electrode (second electrode)" and a suffix β is appended to the reference numeral thereof, and when they are not distinguished and are collectively referenced, no suffix is appended to the reference numerals.

Figure 13:
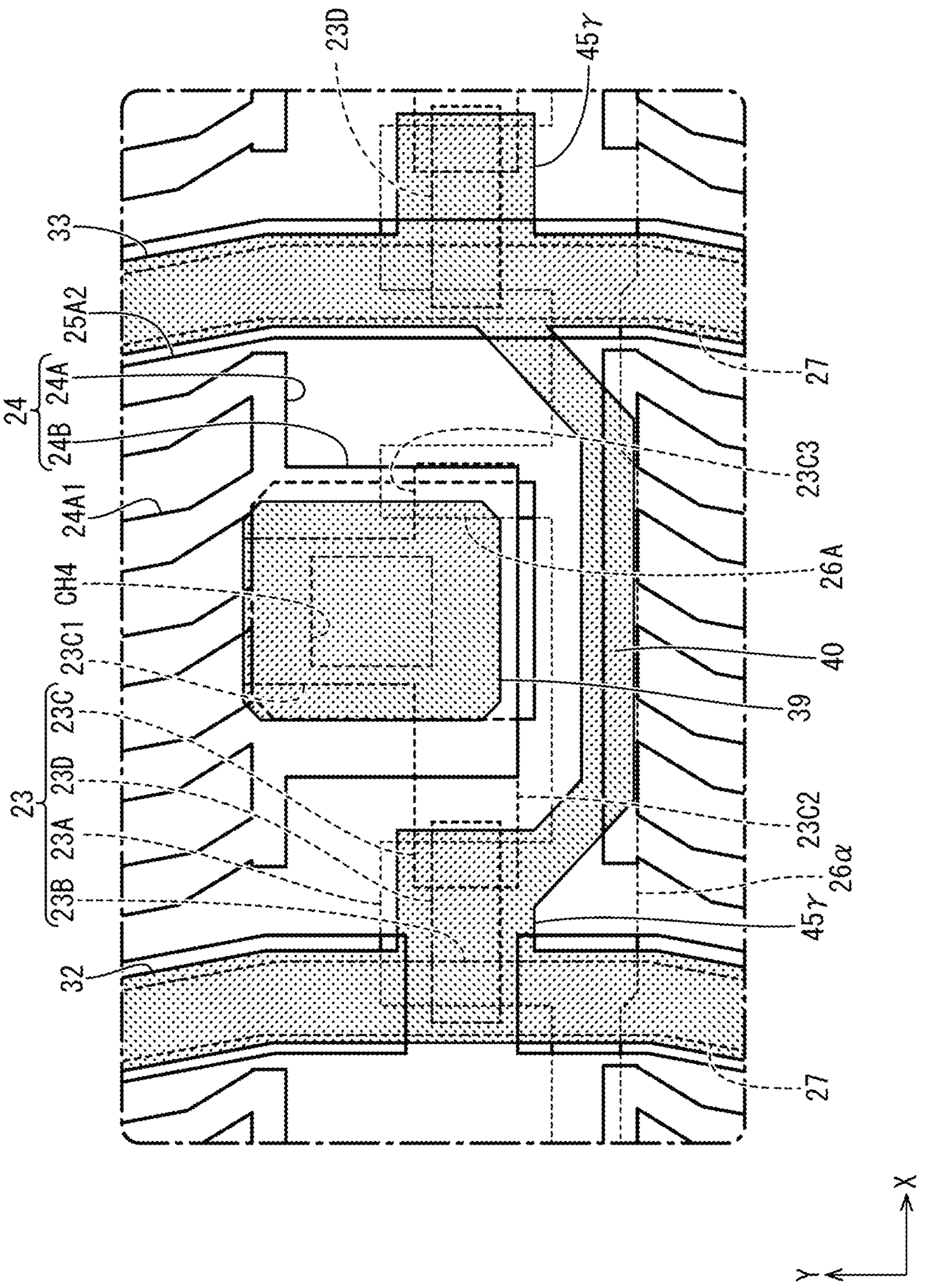
FIG. 13 is an enlarged plan view illustrating a first connection wiring line, a first dummy touch wiring line, and the like near a second slit partitioning a first touch electrode and a third touch electrode according to the first embodiment, and indicating the third metal film with shading.

A connection structure between the connection wiring line 32 and the dummy touch wiring line 33 will be described with reference to FIGS. 12 and 13. In FIG. 13, the first connection wiring line 32α, the first dummy touch wiring line 33α, and the like in the vicinity of the second slits 25A2 partitioning the first touch electrode 30α and the third touch electrode 30γ are illustrated in an enlarged manner. In FIG. 13, the third metal film included in the array substrate 21 is indicated with shading. As illustrated in FIG. 12, the array substrate 21 is provided with a transverse wiring line 40 configured to connect the connection wiring line 32 and the dummy touch wiring line 33 adjacent to each other while being spaced apart in the X-axis direction. As illustrated in FIG. 12, the transverse wiring line 40 at least includes a first transverse wiring line 40α connecting the first connection wiring line 32α and the first dummy touch wiring line 33α, and a second transverse wiring line 40β connecting the second connection wiring line 32P and the second dummy touch wiring line 33β. A plurality of the first transverse wiring lines 40α and a plurality of the second transverse wiring lines 40β are respectively disposed at position spaced apart from each other in the Y-axis direction. Three first transverse wiring lines 40α and three second transverse wiring lines 40β are illustrated in FIG. 12. The transverse wiring lines 40 each extend along the X-axis direction and cross the TFT 23 and the pixel electrode 24 interposed between the connection wiring line 32 and the dummy touch wiring line 33. As illustrated in FIG. 13, the transverse wiring line 40 is made of the same third metal film as the connection wiring line 32 and the dummy touch wiring line 33. Accordingly, the transverse wiring line 40 is directly continuous with both the connection wiring line 32 and the dummy touch wiring line 33 to be connected thereto. Most of the transverse wiring line 40 is disposed overlapping the gate wiring line 26.

The relationship between the first touch electrode 30α and other structures will be described with reference to FIGS. 8, 9, and 12. As illustrated in FIGS. 8, 9, and 12, the first touch electrode 30α is disposed to overlap substantially the entire area of the first semiconductor portion 23Dα of the first TFT 23α, substantially the entire area of the first pixel electrode 24α, substantially the entire area of the second pixel electrode 24β, and substantially the entire area of the third pixel electrode 24γ. The first touch electrode 30α is disposed to overlap part of the first gate wiring line 26α, part of the first source wiring line 27α, part of the second source wiring line 27β, and part of the first touch wiring line 31α. Portions of the respective wiring lines 26α, 27α, 27β, and 31α that cross the first touch electrode 30α overlap the first touch electrode 30α.

Figure 14:
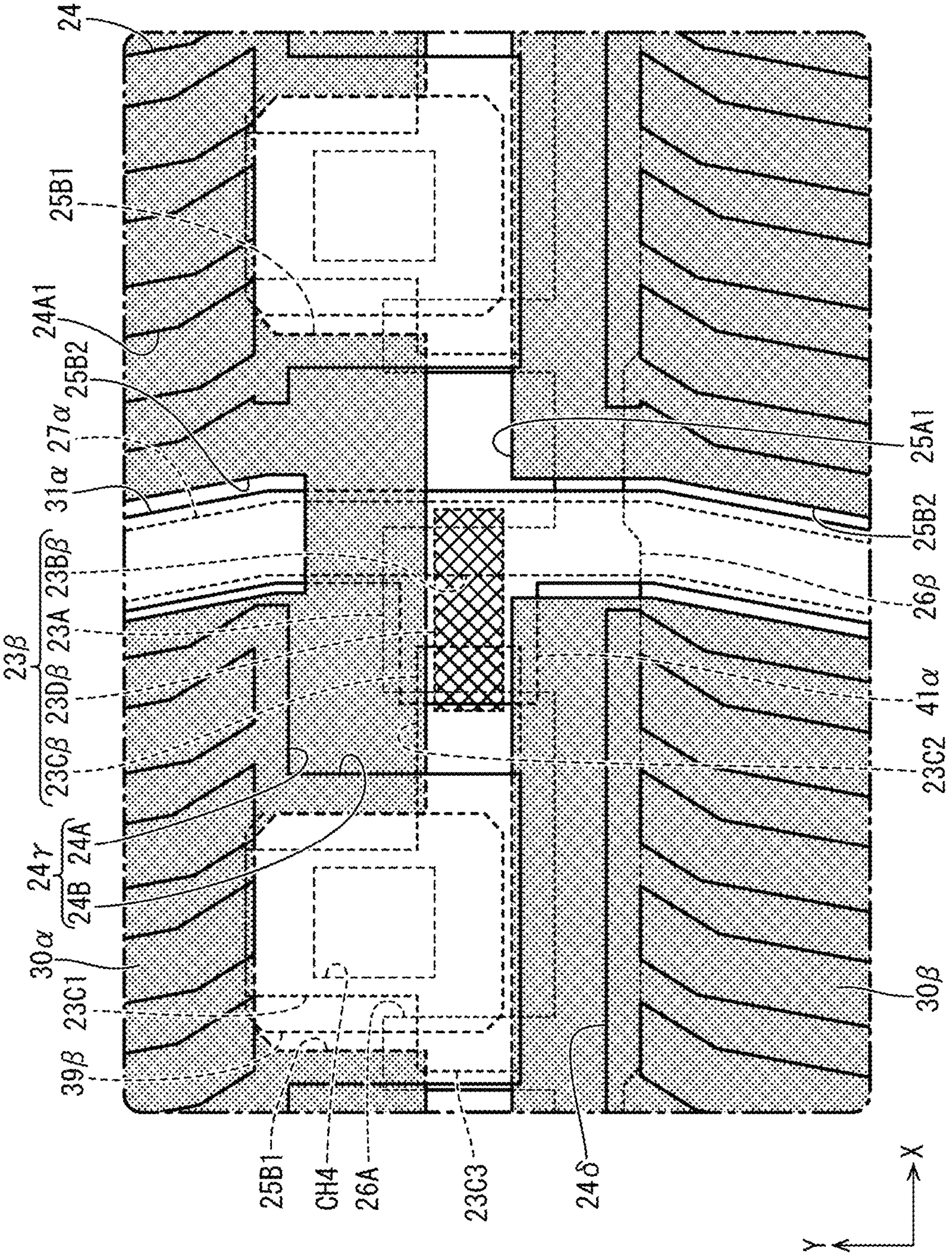
FIG. 14 is an enlarged plan view illustrating a second TFT, a second gate wiring line, a first touch wiring line, and the like near a first slit partitioning the first touch electrode and a second touch electrode according to the first embodiment, and indicating the semiconductor film and the first transparent electrode film with different shading.
Figure 15:
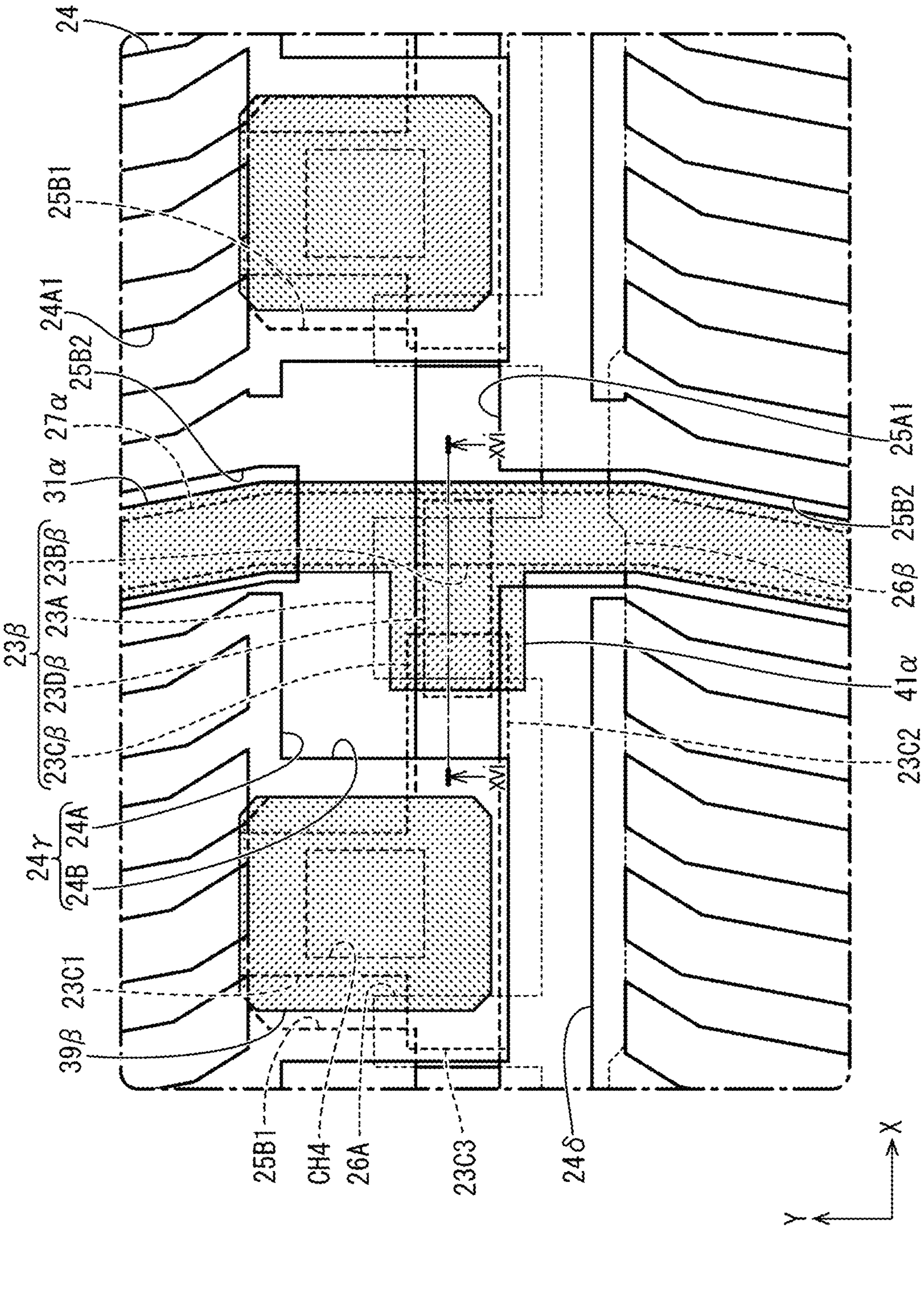
FIG. 15 is an enlarged plan view illustrating the second TFT, the second gate wiring line, the first touch wiring line, and the like near the first slit partitioning the first touch electrode and the second touch electrode according to the first embodiment, and indicating the third metal film with shading.

The relationship between the second touch electrode 30β and other structures will be described with reference to FIGS. 12, 14, and 15. In FIG. 14 and FIG. 15, the second TFT 23β, the second gate wiring line 26β, the first touch wiring line 31α, and the like in the vicinity of the first slit 25A1 partitioning the first touch electrode 30α and the second touch electrode 30β are illustrated in an enlarged manner. In FIG. 14, the semiconductor film and the first transparent electrode film included in the array substrate 21 are indicated with different shading. In FIG. 15, the third metal film included in the array substrate 21 is indicated with shading. As illustrated in FIGS. 12, 14, and 15, the second touch electrode 30β is disposed to overlap the fourth pixel electrode 24δ. The second touch electrode 30β is disposed to overlap part of the second gate wiring line 26β, part of the first source wiring line 27α, part of the second source wiring line 27β, and part of the first touch wiring line 31α. Portions of the respective wiring lines 26β, 27α, 27β, and 31α that cross the second touch electrode 30β overlap the second touch electrode 30β. In particular, the second gate wiring line 26β is disposed to overlap an end portion of the second touch electrode 30β facing the first slit 25A1, and is disposed not to overlap the first slit 25A1, except for a portion widened to form the gate electrode 23A and the widened portion 26A.

As described above, all of the gate wiring lines 26 including the first gate wiring lines 26α and the second gate wiring lines 26β are disposed to overlap the touch electrodes 30 over the substantially entire length thereof. As a result, an electrical field generated from each gate wiring line 26 is blocked by each touch electrode 30 overlapping with the gate wiring line 26. With this, a potential fluctuation at each pixel electrode 24 adjacent to each gate wiring line 26 caused by an electrical field generated from each gate wiring line 26 is unlikely to occur, and thus unevenness is unlikely to be generated in display luminance related to each pixel PX. Since it is unnecessary to provide a blocking portion overlapping the gate wiring line 26 as in the related art, it is possible to prevent a situation in which the aperture ratio of the pixel PX is reduced due to the blocking portion.

On the other hand, since the second touch electrode 30β is disposed overlapping the second gate wiring line 26β, as illustrated in FIGS. 12, 14, and 15, the second semiconductor portion 23Dβ included in the second TFT 23β is disposed to overlap the first slit 25A1 partitioning the first touch electrode 30α and the second touch electrode 30β and overlap none of the first touch electrode 30α and the second touch electrode 30β. Accordingly, the second semiconductor portion 23Dβ is covered with none of the first touch electrode 30α and the second touch electrode 30β from the upper-layer side. The first slit 25A1 overlaps not only the second semiconductor portion 23Dβ included in the second TFT 23β, but also the entire area of the source electrode 23Bβ included in the second TFT 23β and a portion of the drain electrode 23Cβ included in the second TFT 23β extending along the X-axis direction (including part of the first drain-electrode forming portion 23C1, and the second and third drain-electrode forming portions 23C2 and 23C3). The first slit 25A1 extends substantially linearly along the X-axis direction and communicates with the plurality of first openings 25B1 on the way. Specifically, the first slit 25A1 is continuous with an end portion of the first opening 25B1 on the side (lower side in FIGS. 14 and 15) opposite to the pixel electrode main body 24A side in the Y-axis direction.

As described above, in the array substrate 21 according to the present embodiment, the semiconductor portion 23D (including the first semiconductor portion 23Dα) overlapping the touch electrode 30 and the semiconductor portion 23D (including the second semiconductor portion 23Dβ) not overlapping the touch electrode 30 are mixed. Because of this, in the TFT 23 (including the first TFT 23α) provided with the semiconductor portion 23D overlapping with the touch electrode 30 and the TFT 23 (including the second TFT 23β) provided with the semiconductor portion 23D not overlapping with the touch electrode 30, there is a concern that a difference in leakage current caused to flow due to a back channel generated in each semiconductor portion 23D occurs when a potential fluctuation occurs in the touch electrode 30. When a difference in the leakage current occurs, the potential of the pixel electrode 24 fluctuates, and thus there is a concern that unevenness is generated in the display luminance related to the pixel PX. Here, in a case where a configuration is adopted in which an opening is provided in a portion of the first touch electrode 30α overlapping the first semiconductor portion 23Dα, none of the semiconductor portions 23D overlap the touch electrodes 30. However, when such an opening is provided in the first touch electrode 30α, the resistance distribution of the first touch electrode 30α becomes high, and as a result, there arises a concern that a problem such as a decrease in touch sensitivity may occur.

Then, as illustrated in FIGS. 4 and 14 to 16, the array substrate 21 according to the present embodiment is provided with an overlapping portion 41 disposed to overlap the semiconductor portion 23D, which is disposed not to overlap any of the touch electrodes 30 but overlap the first slit 25A1. The overlapping portion 41 has the same potential as any of the plurality of touch electrodes 30. In the present embodiment, the overlapping portion 41 is indirectly connected to any of the plurality of touch electrodes 30. The overlapping portion 41 is made of the third metal film, and is disposed to overlap the upper-layer side of the semiconductor portion 23D via the first interlayer insulating film 35 and the flattening film 36. The overlapping portion 41 has a formation range overlapping the most part (at least a channel portion functioning as a channel) of the semiconductor portion 23D. The overlapping portions 41 include a first overlapping portion 41α connected to the touch wiring line 31, a second overlapping portion 4113 connected to the connection wiring line 32, and a third overlapping portion 41γ connected to the dummy touch wiring line 33. In the following description, when the overlapping portions 41 are distinguished from each other, the overlapping portion 41 connected to the touch wiring line 31 is referred to as a "first overlapping portion" and a suffix α is appended to the reference numeral thereof, the overlapping portion 41 connected to the connection wiring line 32 is referred to as a "second overlapping portion" and a suffix β is appended to the reference numeral thereof, and the overlapping portion 41 connected to the dummy touch wiring line 33 is referred to as a "third overlapping portion" and a suffix γ is appended to the reference numeral thereof. When the overlapping portions 41 are not distinguished and collectively referenced, no suffix is appended to the reference numerals.

Figure 16:
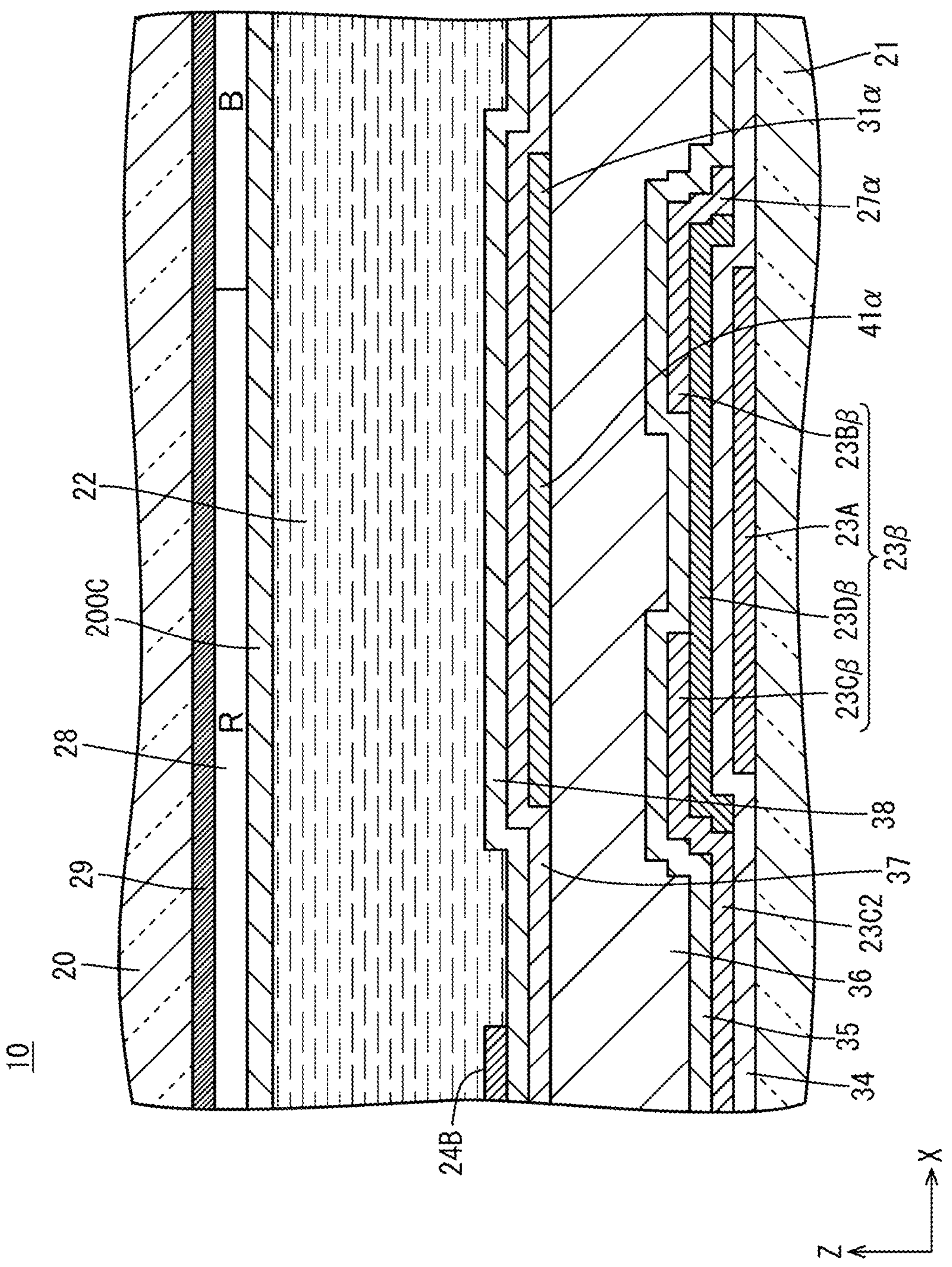
FIG. 16 is a cross-sectional view of the liquid crystal panel according to the first embodiment taken along a line xvi-xvi in FIG. 15.

The first overlapping portion 41α will be described with reference to FIGS. 14 to 16. As illustrated in FIGS. 14 to 16, the first overlapping portion 41α is constituted by part of the first touch wiring line 31α. Specifically, a portion of the first touch wiring line 31α that crosses the first slit 25A1 partitioning the first touch electrode 30α and the second touch electrode 30β is selectively widened. The widened portion of the first touch wiring line 31α extends along the X-axis direction and protrudes laterally relative to another portion (main body portion) of the first touch wiring line 31α. The widened portion of the first touch wiring line 31α overlaps the second semiconductor portion 23Dβ included in the second TFT 23β and constitutes the first overlapping portion 41α. As described above, the first overlapping portion 41α constituted of part of the first touch wiring line 31α is indirectly connected to any of the plurality of touch electrodes 30 via the first touch wiring line 31α. Accordingly, at least at the timing when a common potential signal is supplied from the driver 11 to the first touch wiring line 31α, the touch electrode 30 connected to the first touch wiring line 31α and the first overlapping portion 41α have the same potential. According to the present embodiment, the first touch electrode 30α is disposed overlapping the first semiconductor portion 23Dα of the first TFT 23α, and the first overlapping portion 41α is disposed overlapping the second semiconductor portion 23Dβ of the second TFT 23β. The first overlapping portion 41α has the same potential as any of the plurality of touch electrodes 30. Accordingly, when a potential fluctuation occurs in the plurality of touch electrodes 30, leakage currents caused by the potential fluctuation and flowing through the first semiconductor portion 23Dα and the second semiconductor portion 23Dβ are equivalent. As a result, even when leakage currents flow through the first semiconductor portion 23Dα and the second semiconductor portion 23Dβ, unevenness is unlikely to be generated in the display luminance related to the first pixel electrode 24α and the third pixel electrode 24γ.

Figure 17:
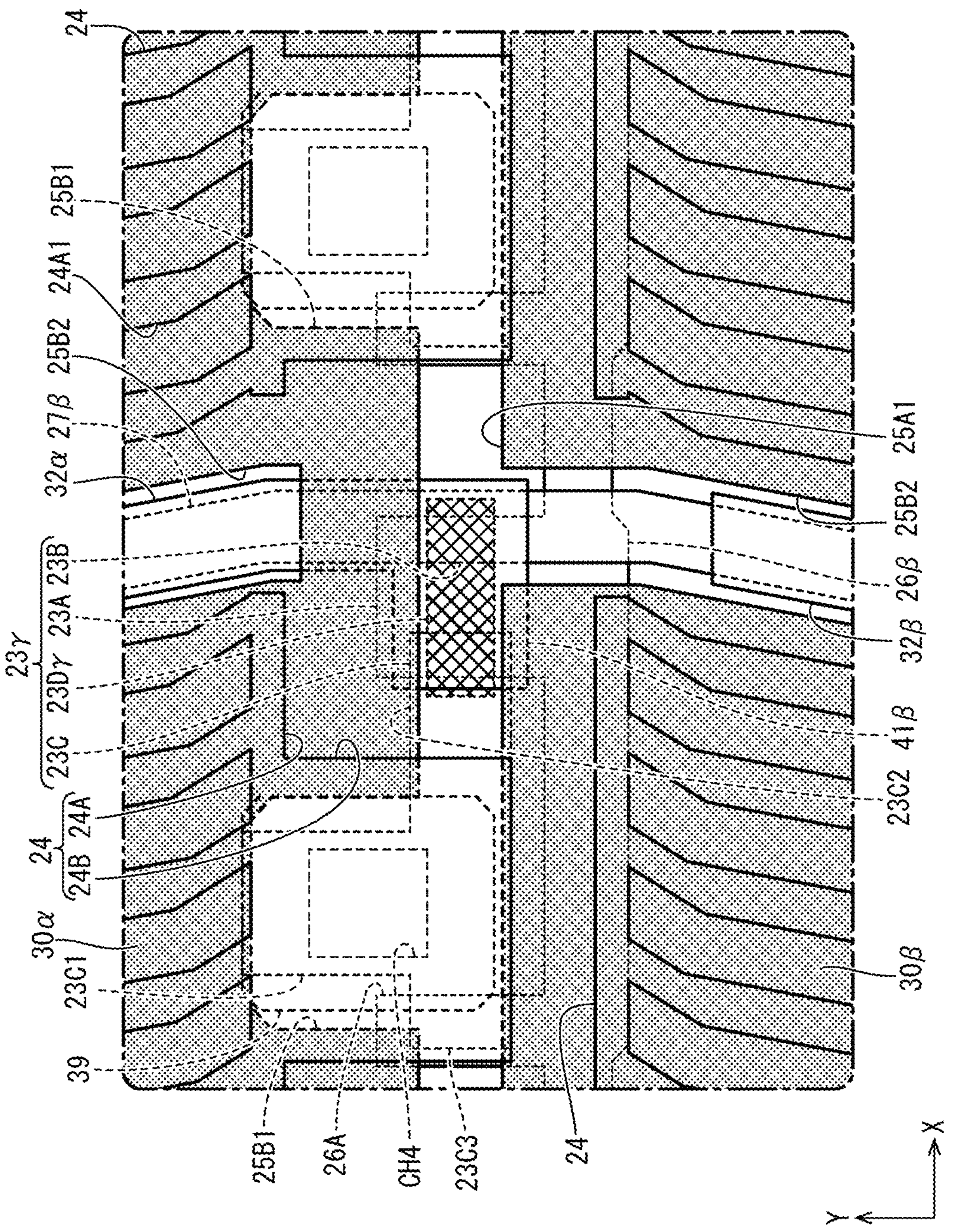
FIG. 17 is an enlarged plan view illustrating a third TFT, the first connection wiring line, and the like near the first slit partitioning the first touch electrode and the second touch electrode according to the first embodiment, and indicating the semiconductor film and the first transparent electrode film with different shading.
Figure 18:
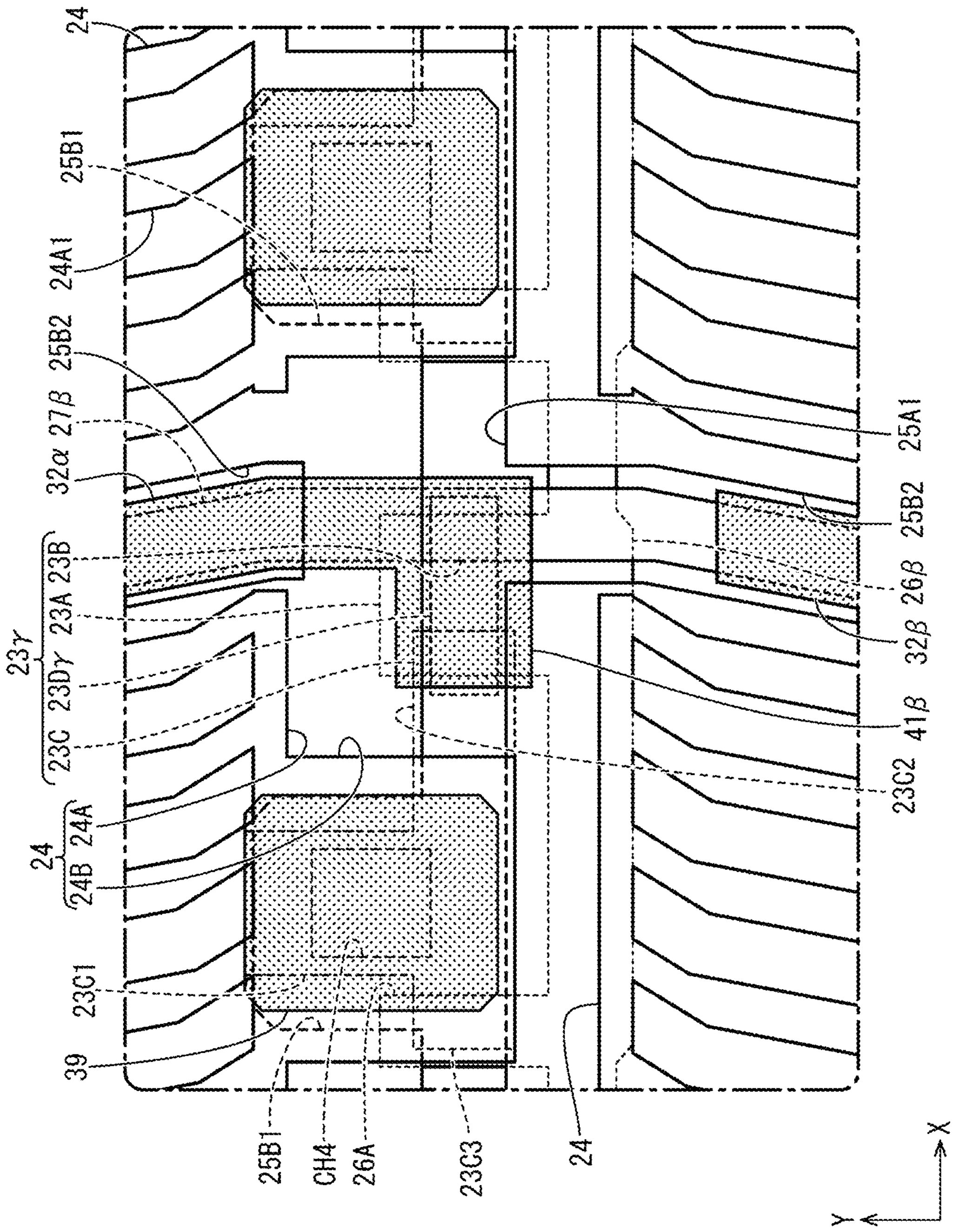
FIG. 18 is an enlarged plan view illustrating the third TFT, the first connection wiring line, and the like near the first slit partitioning the first touch electrode and the second touch electrode according to the first embodiment, and indicating the third metal film with shading.

The second overlapping portion 41β will be described with reference to FIGS. 17 and 18. In FIG. 17 and FIG. 18, the third TFT 23γ, the first connection wiring line 32α, and the like in the vicinity of the first slit 25A1 partitioning the first touch electrode 30α and the second touch electrode 30β are illustrated in an enlarged manner. In FIG. 17, the semiconductor film and the first transparent electrode film included in the array substrate 21 are indicated with different shading. In FIG. 18, the third metal film included in the array substrate 21 is illustrated with shading. As illustrated in FIGS. 17 and 18, the second overlapping portion 41β is constituted by part of the first connection wiring line 32α. Specifically, an end portion (an end portion on the side near the second connection wiring line 32β) of the first connection wiring line 32α facing the first slit 25A1 partitioning the first touch electrode 30α and the second touch electrode 30β is selectively widened. The widened portion of the first connection wiring line 32α extends along the X-axis direction and protrudes laterally relative to another portion (main body portion) of the first connection wiring line 32α. The widened portion of the first connection wiring line 32α overlaps the third semiconductor portion 23Dγ included in the third TFT 23γ and constitutes the second overlapping portion 41β. The cross-sectional configurations of the second overlapping portion 41β and the third semiconductor portion 23Dγ overlapping each other are similar to those of the first overlapping portion 41α and the second semiconductor portion 23Dβ illustrated in FIG. 16. As described above, the second overlapping portion 41β constituted of part of the first connection wiring line 32α is indirectly connected to the first touch electrode 30α via the first connection wiring line 32α. Accordingly, at least at the timing when a common potential signal is supplied from the driver 11 to the touch wiring line 31, the first connection wiring line 32α connected to the first touch electrode 30α and the second overlapping portion 41β have the same potential. According to the present embodiment, the first touch electrode 30α is disposed overlapping the first semiconductor portion 23Dα of the first TFT 23α, the first overlapping portion 41α is disposed overlapping the second semiconductor portion 23Dβ of the second TFT 23β, and the second overlapping portion 41β is disposed overlapping the third semiconductor portion 23Dγ of the third TFT 23γ. The second overlapping portion 41β has the same potential as the first touch electrode 30α. Accordingly, when a potential fluctuation occurs in the plurality of touch electrodes 30, leakage currents caused by the potential fluctuation and flowing through the first semiconductor portion 23Dα, the second semiconductor portion 23Dβ, and the third semiconductor portion 23Dγ are equivalent. Due to this, even when a leakage current flows through the first semiconductor portion 23Dα, the second semiconductor portion 23Dβ, and the third semiconductor portion 23Dγ, unevenness is unlikely to be generated in the display luminance related to the first pixel electrode 24α, the second pixel electrode 24β, and the pixel electrode 24 connected to the third TFT 23γ.

Figure 19:
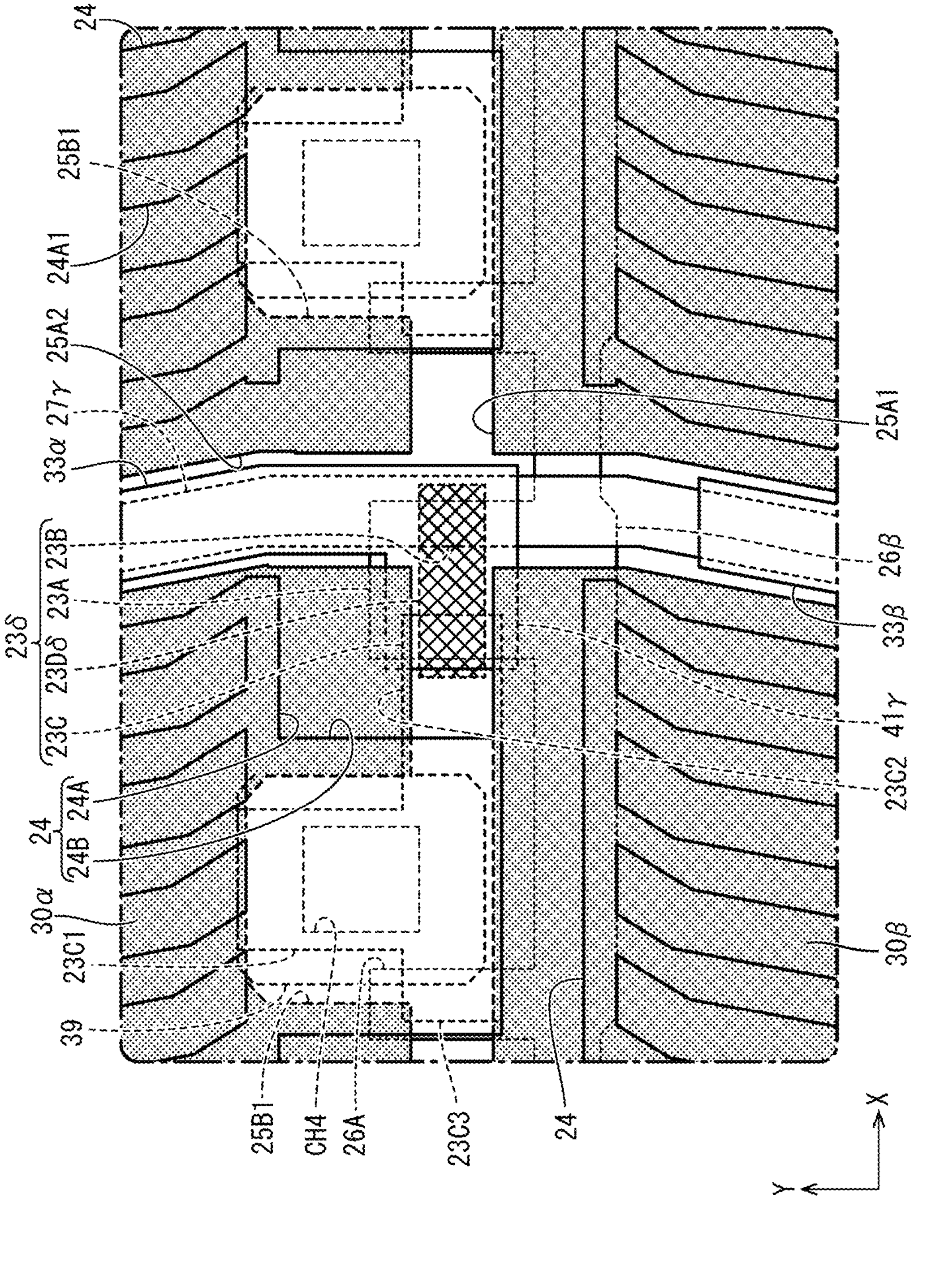
FIG. 19 is an enlarged plan view illustrating a fourth TFT, the first dummy touch wiring line, and the like near the first slit partitioning the first touch electrode and the second touch electrode according to the first embodiment, and indicating the semiconductor film and the first transparent electrode film with different shading.
Figure 20:
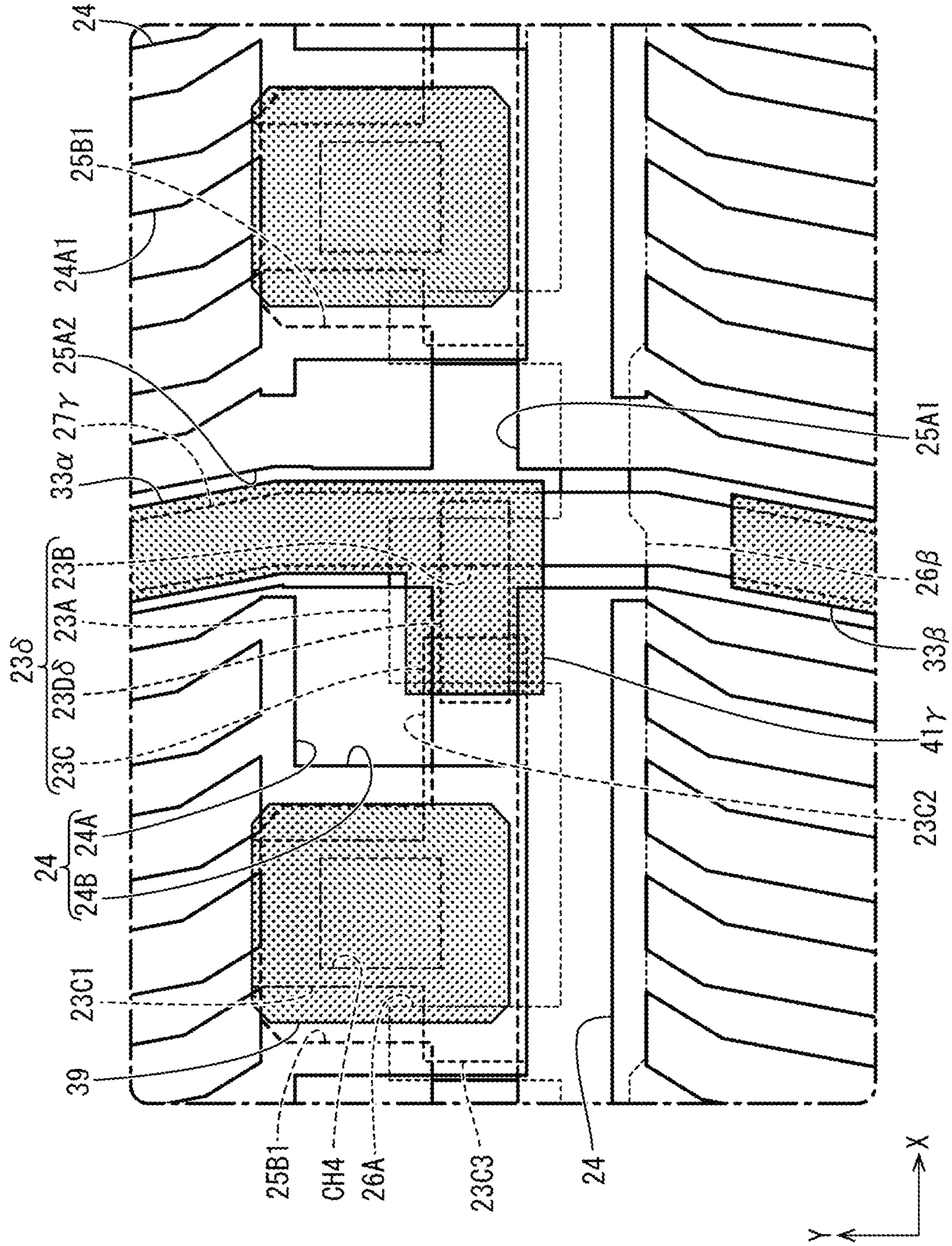
FIG. 20 is an enlarged plan view illustrating the fourth TFT, the first dummy touch wiring line, and the like near the first slit partitioning the first touch electrode and the second touch electrode according to the first embodiment, and indicating the third metal film with shading.

The third overlapping portion 41γ will be described with reference to FIGS. 19 and 20. In FIG. 19 and FIG. 20, the fourth TFT 23δ, the first dummy touch wiring line 33α, and the like in the vicinity of the first slit 25A1 partitioning the first touch electrode 30α and the second touch electrode 30β are illustrated in an enlarged manner. In FIG. 19, the semiconductor film and the first transparent electrode film included in the array substrate 21 are indicated with different shading. In FIG. 20, the third metal film included in the array substrate 21 is indicated with shading. As illustrated in FIGS. 19 and 20, the third overlapping portion 41γ is constituted by part of the first dummy touch wiring line 33α. Specifically, an end portion (an end portion on the side near the second dummy touch wiring line 33β) of the first dummy touch wiring line 33α facing the first slit 25A1 partitioning the first touch electrode 30α and the second touch electrode 30β is selectively widened. The widened portion of the first dummy touch wiring line 33α extends along the X-axis direction and protrudes laterally relative to another portion (main body portion) of the first dummy touch wiring line 33α. The widened portion of the first dummy touch wiring line 33α overlaps the fourth semiconductor portion 23Dδ included in the fourth TFT 23δ and constitutes the third overlapping portion 41γ. The cross-sectional configurations of the third overlapping portion 41γ and the fourth semiconductor portion 23Dγ overlapping each other are similar to those of the first overlapping portion 41α and the second semiconductor portion 23Dβ illustrated in FIG. 16. As described above, the third overlapping portion 41γ constituted of part of the first dummy touch wiring line 33α is indirectly connected to the first touch electrode 30α via the first dummy touch wiring line 33α and the first connection wiring line 32α. Accordingly, at least at the timing when a common potential signal is supplied from the driver 11 to the touch wiring line 31, the first dummy touch wiring line 33α connected to the first touch electrode 30α via the first connection wiring line 32α and the third overlapping portion 41γ have the same potential. According to the present embodiment, the first touch electrode 30α is disposed overlapping the first semiconductor portion 23Dα of the first TFT 23α, the first overlapping portion 41α is disposed overlapping the second semiconductor portion 23Dβ of the second TFT 23β, the second overlapping portion 41β is disposed overlapping third semiconductor portion 23Dγ of the third TFT 23γ, and the third overlapping portion 41γ is disposed overlapping the fourth semiconductor portion 23Dδ of the fourth TFT 23δ. That is, the overlapping portion 41 is disposed to overlap each of all the semiconductor portions 23D disposed overlapping the first slit 25A1. The third overlapping portion 41γ has the same potential as the first touch electrode 30α. Accordingly, when a potential fluctuation occurs in the plurality of touch electrodes 30, leakage currents caused by the potential fluctuation and flowing through the first semiconductor portion 23Dα, the second semiconductor portion 23Dβ, the third semiconductor portion 23Dγ, and the fourth semiconductor portion 23Dδ are equivalent. Due to this, even when a leakage current flows through the first semiconductor portion 23Dα, the second semiconductor portion 23Dβ, the third semiconductor portion 23Dγ, and the fourth semiconductor portion 23Dδ, unevenness is unlikely to be generated in the display luminance related to the first pixel electrode 24α, the second pixel electrode 24β, the pixel electrode 24 connected to the third TFT 23γ, and the pixel electrode 24 connected to the fourth TFT 23δ.

As illustrated in FIG. 4, the array substrate 21 is provided with a dummy overlapping portion 45 disposed to overlap the semiconductor portion 23D, which is disposed not overlapping the first slit 25A1 but overlapping the touch electrode 30. The dummy overlapping portion 45 has a similar configuration to that of the overlapping portion 41, except that the semiconductor portion 23D to be overlapped by the dummy overlapping portion 45 is different from that to be overlapped by the overlapping portion 41. The dummy overlapping portion 45 is constituted by part of any of the touch wiring line 31, the connection wiring line 32 and the dummy touch wiring line 33, and is made of the third metal film. The dummy overlapping portion 45 include a first dummy overlapping portion 45α connected to the touch wiring line 31, a second dummy overlapping portion 45β connected to the connection wiring line 32, and a third dummy overlapping portion 45γ connected to the dummy touch wiring line 33. As described above, any of the overlapping portion 41 and the dummy overlapping portion 45 is disposed to overlap each semiconductor portion 23D included in all the TFTs 23 disposed in the display region AA.

As discussed above, the array substrate 21 according to the present embodiment includes the plurality of common electrodes 25, the plurality of pixel electrodes 24 disposed overlapping the plurality of common electrodes 25 via the third interlayer insulating film (the first insulating film) 38, the plurality of TFTs (the plurality of switching elements) 23 connected to the plurality of pixel electrodes 24, and the gate wiring line 26, source wiring line 27, touch wiring line 31, connection wiring line 32 and dummy touch wiring line 33 as a plurality of the wiring lines connected to any of the plurality of common electrodes 25 or any of the plurality of TFTs 23. The plurality of pixel electrodes 24 include the first pixel electrode 24α, the second pixel electrode 24β disposed being spaced apart from the first pixel electrode 24α in the first direction, the third pixel electrode 24γ, and the fourth pixel electrode 24δ disposed being spaced apart from the third pixel electrode 24γ in the first direction. The plurality of wiring lines include the first gate wiring line (the first wiring line) 26α located between the first pixel electrode 24α and the second pixel electrode 24β in the first direction, and extending along the second direction intersecting with the first direction; and the second gate wiring line (the second wiring line) 26β located between the third pixel electrode 24γ and the fourth pixel electrode 24δ in the first direction, and extending along the second direction. The plurality of TFTs 23 include the first TFT (the first switching element) 23α connected to the first gate wiring line 26α and the first pixel electrode 24α, and the second TFT (the second switching element) 23β connected to the second gate wiring line 26β and the third pixel electrode 24γ. The plurality of common electrodes 25 include the first common electrode 25α and the second common electrode 25β disposed being spaced apart from the first common electrode 25α in the first direction. The first TFT 23α includes the first semiconductor portion 23Dα. The second TFT 23β includes the second semiconductor portion 23Dβ. The first common electrode 25α is disposed overlapping the first pixel electrode 24α, the second pixel electrode 24β, the third pixel electrode 24γ, the first gate wiring line 26α, and at least the first semiconductor portion 23Dα of the first TFT 23α. The second common electrode 25β is disposed overlapping the fourth pixel electrode 24δ and the second gate wiring line 26β. Further, there is provided an overlapping portion 41 disposed overlapping at least the second semiconductor portion 23Dβ of the second TFT 23β and having the same potential as the potential of any of the plurality of common electrodes 25.

The first common electrode 25α is disposed overlapping the first semiconductor portion 23Dα of the first TFT 23α, and the overlapping portion 41 is disposed overlapping the second semiconductor portion 23Dβ of the second TFT 23β. The overlapping portion 41 has the same potential as any of the plurality of common electrodes 25. Accordingly, when a potential fluctuation occurs in the plurality of common electrodes 25, leakage currents caused by the potential fluctuation and flowing through the first semiconductor portion 23Dα and the second semiconductor portion 23Dβ are equivalent. As a result, even when leakage currents flow through the first semiconductor portion 23Dα and the second semiconductor portion 23Dβ, unevenness is unlikely to be generated in the display luminance related to the first pixel electrode 24α and the third pixel electrode 24γ.

The first common electrode 25α is disposed overlapping the first gate wiring line 26α, and the second common electrode 25β is disposed overlapping the second gate wiring line 26β. With this, an electrical field generated from the first gate wiring line 26α is blocked by the first common electrode 25α, and an electrical field generated from the second gate wiring line 26β is blocked by the second common electrode 25β. As a result, a potential fluctuation caused by the electrical field generated from the first gate wiring line 26α is unlikely to occur in the first pixel electrode 24α, and a potential fluctuation caused by the electrical field generated from the second gate wiring line 26β is unlikely to occur in the third pixel electrode 24γ, whereby unevenness is unlikely to be generated in the display luminance. Since it is unnecessary to provide a blocking portion overlapping the second gate wiring line 26β as in the related art, it is possible to prevent a reduction in the aperture ratio of the pixel PX due to the blocking portion.

The plurality of common electrodes 25 are the plurality of touch electrodes (position detection electrodes) 30, the first common electrode 25α is the first touch electrode (first position detection electrode) 30α, and the second common electrode 25β is the second touch electrode (second position detection electrode) 30β. The plurality of wiring lines include the first touch wiring line (third wiring line) 31α extending along the first direction and connected to any of the plurality of touch electrodes 30, and the first source wiring line (fourth wiring line) 27α extending along the first direction and connected to at least the second TFT 23β. At least part of the first touch wiring line 31α is disposed overlapping the first source wiring line 27α via the first interlayer insulating film 35 and flattening film 36 serving as the second insulating film, and part of the first touch wiring line 31α is disposed overlapping the second semiconductor portion 23Dβ. The overlapping portion 41 includes the first overlapping portion 41α constituted by a portion of the first touch wiring line 31α overlapping the second semiconductor portion 23Dβ. As described above, part of the first touch wiring line 31α constitutes the first overlapping portion 41α. Accordingly, the first overlapping portion 41α is indirectly connected to any of the plurality of touch electrodes 30 via the first touch wiring line 31α. Compared to a case where the first overlapping portion 41α is directly connected to any of the plurality of touch electrodes 30, the plurality of touch electrodes 30 do not need to be provided with a connection structure for the first overlapping portion 41α, and thus the degree of freedom in designing the plurality of touch electrodes 30 is improved.

The second TFT 23β includes the second drain electrode (first electrode) 23Cβ connected to part of the second semiconductor portion 23Dβ and disposed overlapping part of the second pixel electrode 24β, and is provided with the second intermediate electrode (second electrode) 39β disposed overlapping part of the second drain electrode 23Cβ and part of the third pixel electrode 24γ. The first touch wiring line 31α is made of the third metal film (first conductive film) located on a lower-layer side relative to any of the plurality of touch electrodes 30 and the plurality of pixel electrodes 24 via the second interlayer insulating film (third insulating film) 37, the first source wiring line 27α is made of the second metal film (second conductive film) located on a lower-layer side relative to the third metal film via the first interlayer insulating film 35 and flattening film 36 serving as the second insulating film, the second drain electrode 23Cβ is made of a portion of the second metal film different from the first source wiring line 27α, the second intermediate electrode 39β is made of a portion of the third metal film different from the first touch wiring line 31α and the first overlapping portion 41α, and is connected to the overlapping third pixel electrode 24γ and second drain electrode 23Cβ. The first overlapping portion 41α is disposed to be aligned being spaced apart from the second intermediate electrode 39β in the second direction. The third pixel electrode 24γ and the second drain electrode 23Cβ are connected to each other via the second intermediate electrode 39β. Since the first overlapping portion 41α and the second intermediate electrode 39β are spaced apart from each other, a short circuit therebetween is prevented. Since the first overlapping portion 41α and the second intermediate electrode 39β are disposed to be aligned being spaced apart in the second direction, even when the interval between the first overlapping portion 41α and the second intermediate electrode 39β is sufficiently secured, an arrangement space in the first direction of the first overlapping portion 41α is unlikely to be widened.

The second TFT 23β includes the second source electrode (third electrode) 23Bβ connected to a section of the second semiconductor portion 23Dβ different from a connection section with the second drain electrode 23Cβ. The second source electrode 23Bβ is constituted by part of the first source wiring line 27α. The second drain electrode 23Cβ includes the first drain-electrode forming portion (first portion) 23C1 overlapping the second intermediate electrode 39β, and the second drain-electrode forming portion (second portion) 23C2 extending from the first drain-electrode forming portion 23C1 along the second direction and connected to part of the second semiconductor portion 23Dβ. Since the second drain electrode 23Cβ includes the second drain-electrode forming portion 23C2 extending along the second direction from the first drain-electrode forming portion 23C1 toward the second semiconductor portion 23Dβ, the interval in the second direction between the first overlapping portion 41α and the second intermediate electrode 39β may be largely secured by an amount of extension of the second drain-electrode forming portion 23C2. This makes it difficult for a short circuit to occur between the first overlapping portion 41α and the second intermediate electrode 39β.

There is provided the driver (signal supply unit) 11 connected to the first touch wiring line 31α and the first source wiring line 27α, and configured to supply a signal to the first touch wiring line 31α and the first source wiring line 27α. The plurality of wiring lines include the first connection wiring line (fifth wiring line) 32α extending along the first direction, overlapping the first touch electrode 30α, disposed not overlapping the second touch electrode 30β, and connected to the first touch electrode 30α; the second connection wiring line (sixth wiring line) 32β extending along the first direction, overlapping the second touch electrode 30β, disposed not overlapping the first touch electrode 30α, and connected to the second touch electrode 30β; and the second source wiring line (seventh wiring line) 27β, which extends along the first direction, and at least part of which is disposed overlapping the first connection wiring line 32α and the second connection wiring line 32β via the first interlayer insulating film 35 and flattening film 36 serving as the second insulating film. The plurality of TFTs 23 include the third TFT (third switching element) 23γ connected to the second gate wiring line 26β and the second source wiring line 27β. The third TFT 23γ includes the third semiconductor portion 23Dγ. Part of the first connection wiring line 32α or second connection wiring line 32β is disposed overlapping the third semiconductor portion 23Dγ. The overlapping portion 41 includes the second overlapping portion 41β constituted by a portion of the first connection wiring line 32α or second connection wiring line 32β overlapping the third semiconductor portion 23Dγ. The second overlapping portion 41β is disposed overlapping the third semiconductor portion 23Dγ of the third TFT 23γ. As described above, part of the first connection wiring line 32α or second connection wiring line 32β constitutes the second overlapping portion 41β. Accordingly, the second overlapping portion 41β is indirectly connected to the first touch electrode 30α or the second touch electrode 30β by the first connection wiring line 32α or the second connection wiring line 32β. Compared to a case where the second overlapping portion 41β is directly connected to the first touch electrode 30α or the second touch electrode 30β, the first touch electrode 30α or the second touch electrode 30β does not need to be provided with a connection structure for the second overlapping portion 41β, and thus the degree of freedom in designing the first touch electrode 30α or second touch electrode 30β is improved. In addition, the resistance distribution of the first touch electrode 30α is reduced by the first connection wiring line 32α, and the resistance distribution of the second touch electrode 30β is reduced by the second connection wiring line 32β.

The plurality of touch electrodes 30 include the third touch electrode (third position detection electrode) 30γ aligned being spaced apart in the second direction from the first touch electrode 30α. The plurality of wiring lines include the first dummy touch wiring line (eighth wiring line) 33α extending along the first direction, disposed being interposed between the first touch electrode 30α and the third touch electrode 30γ, and disposed to overlap none of the first touch electrode 30α and the third touch electrode 30γ; and the third source wiring line (ninth wiring line) 27γ, which extends along the first direction and at least part of which is disposed overlapping the first dummy touch wiring line 33α via the first interlayer insulating film 35 and flattening film 36 serving as the second insulating film. The first dummy touch wiring line 33α is directly or indirectly connected to any of the plurality of touch electrodes 30. The plurality of TFTs 23 include the fourth TFT (fourth switching element) 23δ connected to the second gate wiring line 26β and the third source wiring line 27γ. The fourth TFT 23δ includes the fourth semiconductor portion 23Dδ. Part of the first dummy touch wiring line 33α is disposed overlapping the fourth semiconductor portion 23Dδ. The overlapping portion 41 includes the third overlapping portion 41γ constituted by a portion of the first dummy touch wiring line 33α overlapping the fourth semiconductor portion 23Dδ. As described above, part of the first dummy touch wiring line 33α constitutes the third overlapping portion 41γ. The first dummy touch wiring line 33α is directly connected to any of the plurality of touch electrodes 30 or indirectly connected thereto via the first connection wiring line 32α. Thus, the third overlapping portion 41γ has the same potential as any of the plurality of touch electrodes 30. As described above, the third overlapping portion 41γ is not directly connected to the plurality of touch electrodes 30, and therefore in comparison with a case where the third overlapping portion 41γ is directly connected to any of the plurality of touch electrodes 30, the plurality of touch electrodes 30 do not need to be provided with a connection structure for the third overlapping portion 41γ. With this, the degree of freedom in designing the plurality of touch electrodes 30 is improved.

The first common electrode 25α and the second common electrode 25β are disposed to interpose the second semiconductor portion 23Dβ therebetween in the first direction and not to overlap the second semiconductor portion 23Dβ, and the overlapping portion 41 is disposed in a different layer from the plurality of common electrodes 25. Since the second semiconductor portion 23Dβ is disposed not to overlap the first common electrode 25α and the second common electrode 25β, there is a concern that a leakage current different from that in the first semiconductor portion 23Dα flows when a potential fluctuation occurs in the plurality of common electrodes 25. In this respect, since the overlapping portion 41 provided in a different layer from the first common electrode 25α and the second common electrode 25β is disposed overlapping the second semiconductor portion 23Dβ, a leakage current that flows when the potential fluctuation occurs in the plurality of common electrodes 25 becomes equal to that in the first semiconductor portion 23Dα. In addition, problems that may be caused when one of the first common electrode 25α and the second common electrode 25β overlaps with the second semiconductor portion 23Dβ (for example, an electrical field from the second gate wiring line 26β acts on the second pixel electrode 24β) are unlikely to occur.

The liquid crystal panel (display device) 10 includes the above-described array substrate 21 and the counter substrate 20 disposed to face the array substrate 21. According to the liquid crystal panel 10 discussed above, the aperture ratio of the pixel PX is unlikely to decrease, and unevenness is unlikely to be generated in the display luminance. As a result, the display quality is improved.

Second Embodiment

A second embodiment will be described with reference to FIGS. 21 to 39. In the second embodiment, a case will be described in which a film layered on an inner face side of an array substrate 121 is changed, and the arrangement and the like of a touch wiring line 131, a connection wiring line 132, and a dummy touch wiring line 133 are changed. Further, repetitive descriptions of structures, actions, and effects similar to those of the first embodiment described above will be omitted.

Figure 21:
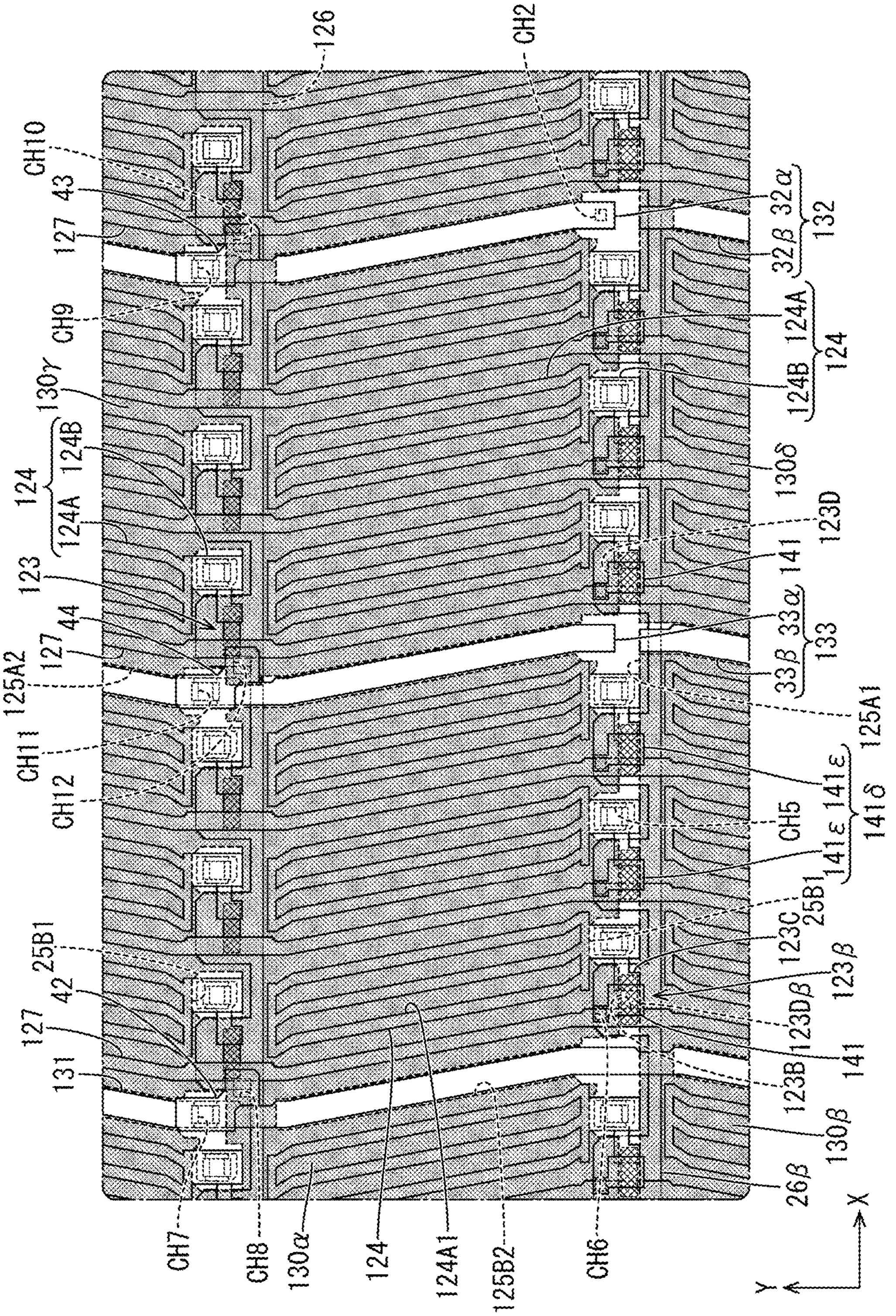
FIG. 21 is a plan view illustrating a pixel arrangement in a display region of a liquid crystal panel according to a second embodiment, and indicating a semiconductor film and a first transparent electrode film with different shading.
Figure 22:
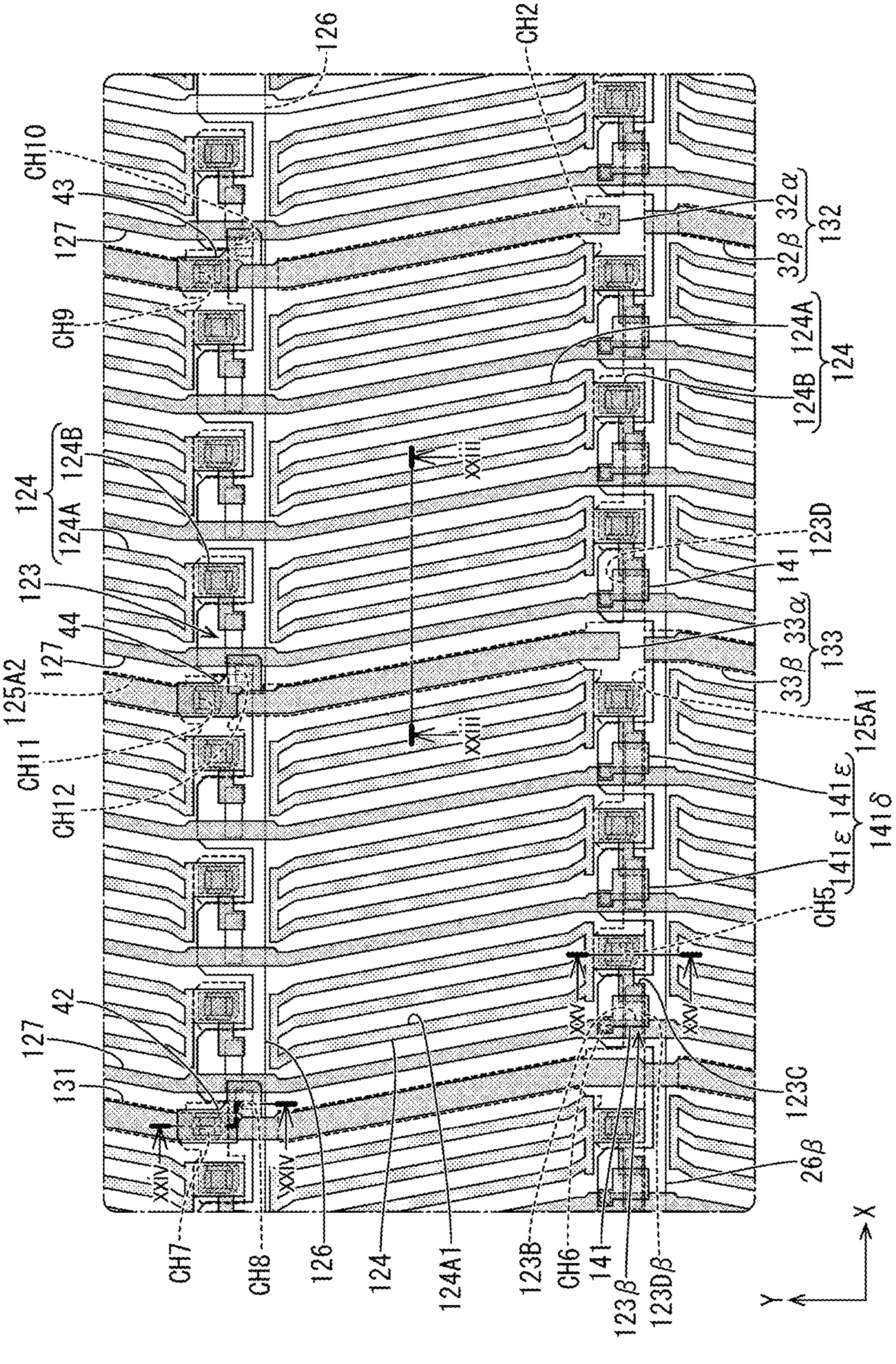
FIG. 22 is a plan view illustrating a pixel arrangement in a display region of the liquid crystal panel according to the second embodiment, and indicating a second metal film and a second transparent electrode film with different shading.

As illustrated in FIGS. 21 to 24, the array substrate 121 according to the present embodiment include none of the third metal film and the second interlayer insulating film 37 (see FIGS. 5 and 16) described in the first embodiment. Specifically, on the array substrate 121, a first metal film, a gate insulating film 134, a semiconductor film, a second metal film, a first interlayer insulating film 135, a flattening film 136, a first transparent electrode film, a third interlayer insulating film 138, a second transparent electrode film (fourth conductive film), and an alignment film are layer-formed in that order from the lower-layer side. In FIG. 21, the semiconductor film and the first transparent electrode film included in the array substrate 121 are respectively indicated with different shading. In FIG. 22, the second metal film and the second transparent electrode film included in the array substrate 121 are respectively indicated with different shading.

Figure 23:
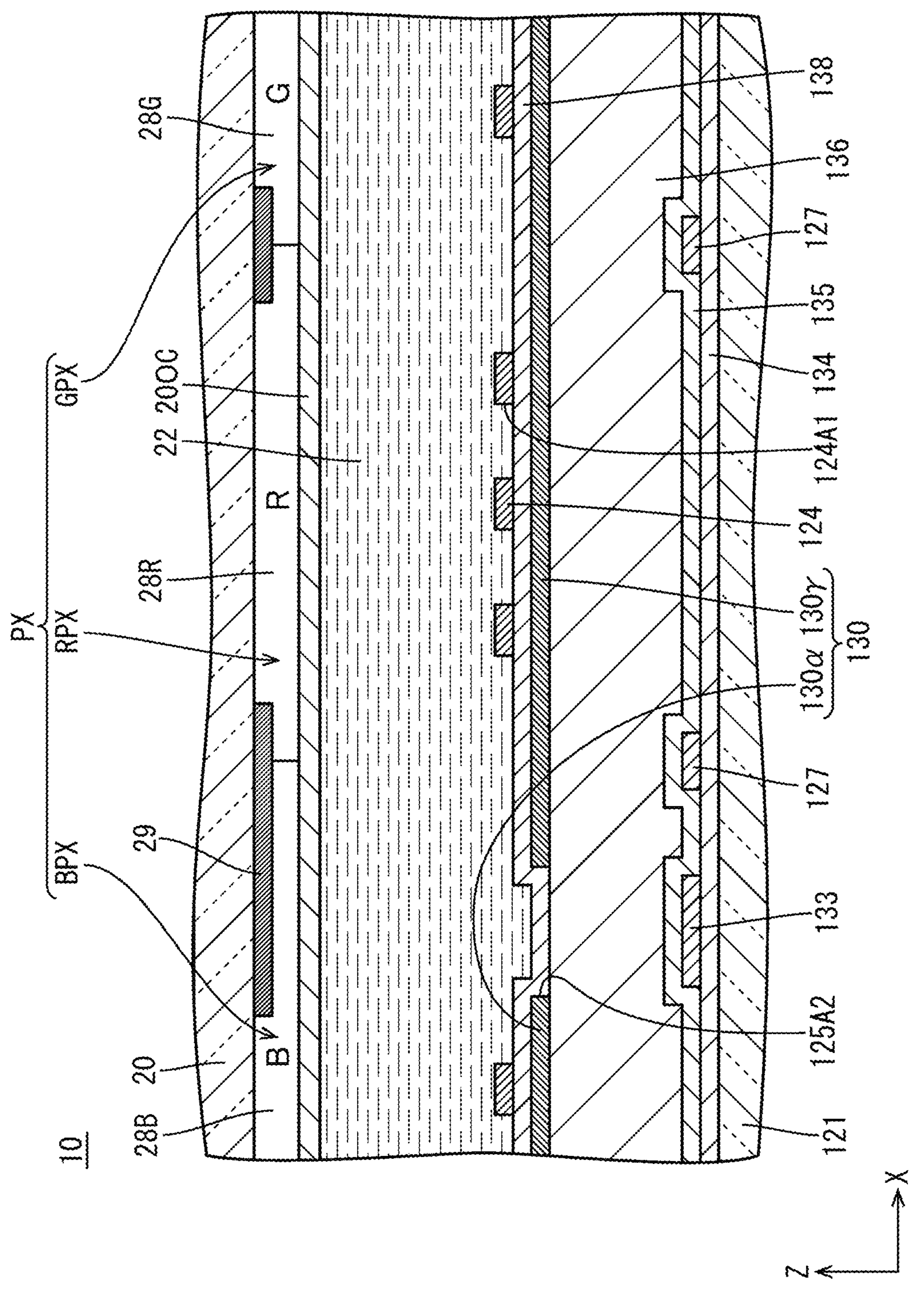
FIG. 23 is a cross-sectional view of the liquid crystal panel according to the second embodiment taken along a line xxiii-xxiii in FIG. 22.

As illustrated in FIGS. 22 and 23, the touch wiring line (tenth wiring line) 131, the connection wiring line (tenth wiring line) 132, and the dummy touch wiring line (tenth wiring line) 133 according to the present embodiment are all made of the same second metal film as a source wiring line 127 and the like. In other words, the touch wiring line 131, the connection wiring line 132, and the dummy touch wiring line 133 are made of portions of the second metal film different from the source wiring line 127, a source electrode 123B, a drain electrode 123C, and the like. The touch wiring line 131, the connection wiring line 132, and the dummy touch wiring line 133 are each disposed at a position with a space secured on the left side of the source wiring line 127 in the X-axis direction in FIGS. 21 and 22. The touch wiring line 131, the connection wiring line 132, and the dummy touch wiring line 133 are each disposed in parallel with the source wiring line 127 in a state where the interval with the adjacent source wiring line 127 is maintained substantially constant. In the present embodiment, all of TFTs 123 are each located on the right side of the source wiring line 127 to be connected thereto in FIG. 21 and FIG. 22. The touch wiring line 131, the connection wiring line 132, and the dummy touch wiring line 133 are not disposed to be adjacent to all of the source wiring lines 127, but are disposed to be adjacent to specific source wiring lines 127. Specifically, the touch wiring line 131, the connection wiring line 132, and the dummy touch wiring line 133 are each disposed to be selectively adjacent to the source wiring line 127 located between a second pixel BPX having the lowest relative luminous efficiency and a third pixel RPX having the second lowest relative luminous efficiency, for example. The sum of the numbers of dispositions of the touch wiring lines 131, connection wiring lines 132, and dummy touch wiring lines 133 is about one third the number of dispositions of the source wiring lines 127. The interval between the touch wiring line 131 and the source wiring line 127 is the same as the interval between the connection wiring line 132 and the source wiring line 127 and the interval between the dummy touch wiring line 133 and the source wiring line 127, is shorter than the short-side dimension of a pixel electrode 124, and is about the line width of the source wiring line 127. Thus, the touch wiring line 131, the connection wiring line 132, and the dummy touch wiring line 133 are unlikely to be short-circuited to the adjacent source wiring line 127. To describe the arrangement in the X-axis direction in detail, the touch wiring line 131, the connection wiring line 132, and the dummy touch wiring line 133 are disposed to be adjacent to and spaced apart from the adjacent source wiring line 127 on the side (left side in FIGS. 22 and 23) opposite to the side (right side in FIGS. 22 and 23) of the TFT 123, to which the above source wiring line 127 is connected. The touch wiring line 131, the connection wiring line 132, and the dummy touch wiring line 133 are each interposed in the X-axis direction between the adjacent source wiring line 127 with a space secured therebetween and the TFT 123 and the pixel electrode 124 located on the opposite side to the side of the TFT 123, to which the above source wiring line 127 is connected.

Figure 25:
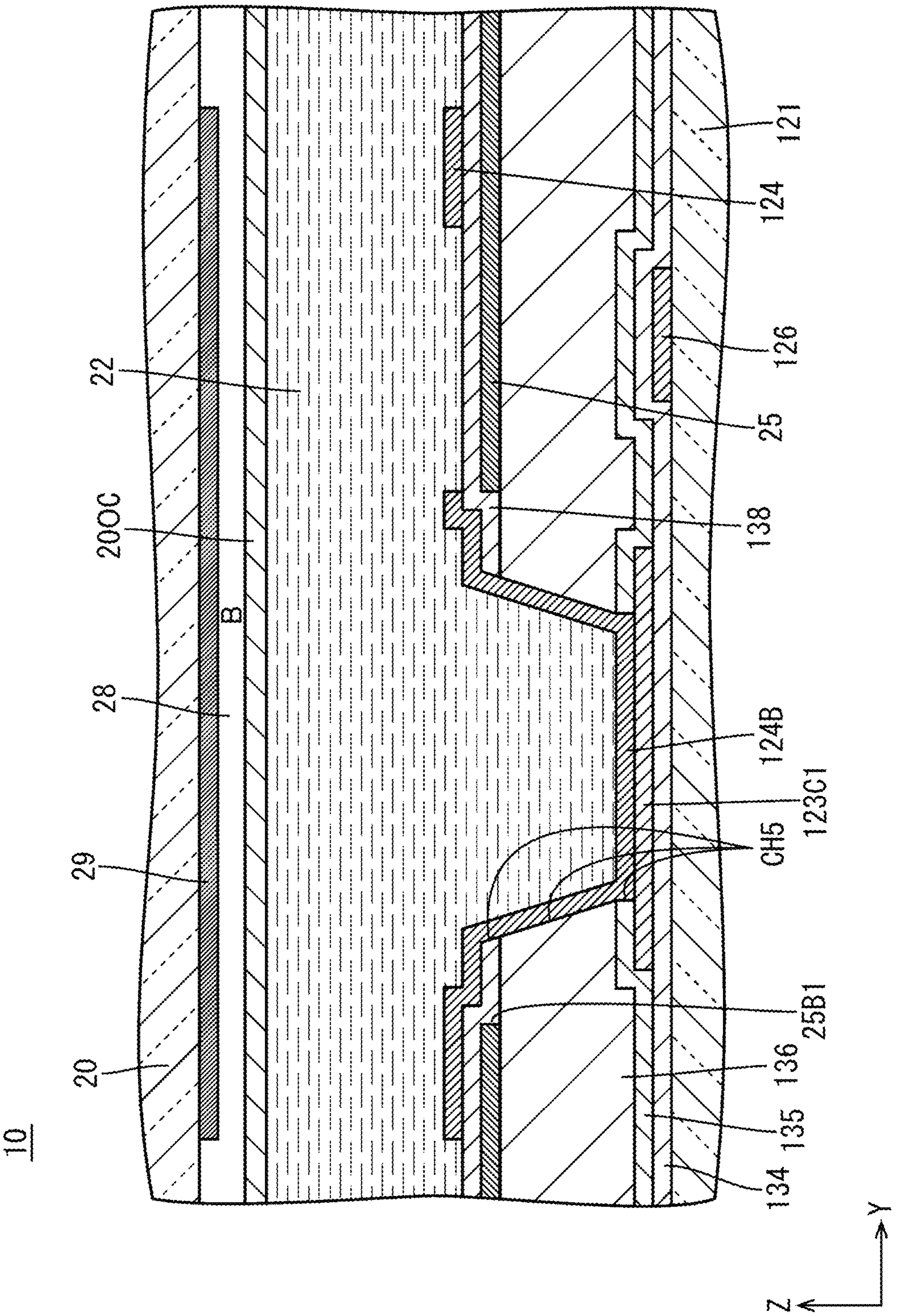
FIG. 25 is a cross-sectional view of the liquid crystal panel according to the second embodiment taken along a line xxv-xxv in FIG. 22.

As illustrated in FIG. 22, the pixel electrode 124 according to the present embodiment includes a pixel electrode main body 124A having a substantially rectangular shape whose planar shape is longitudinally elongated. The long side of the pixel electrode main body 124A extends along the source wiring line 127 and both side edges on the longitudinal side are slightly inclined relative to the Y-axis direction, but does not bend midway unlike the first embodiment (see FIG. 2). A plurality of slits 124A1 (two slits in FIG. 22 and the like) each extending along the longitudinal direction thereof (substantially the Y-axis direction) are formed in the pixel electrode main body 124A. The drain electrode 123C provided in the TFT 123 includes a first drain-electrode forming portion 123C1 connected to a contact portion 124B of the pixel electrode 124 and a second drain-electrode forming portion 123C2 connected to a semiconductor portion 123D, but does not include the third drain-electrode forming portion 23C3 described in the first embodiment (see FIG. 8). Accordingly, a gate wiring line 126 does not include the widened portion 26A described in the first embodiment (see FIG. 8). As illustrated in FIG. 25, the contact portion 124B of the pixel electrode 124 is directly connected to the first drain-electrode forming portion 123C1 of the drain electrode 123C. In the first interlayer insulating film (fourth insulating film) 135 and the flattening film (fourth insulating film) 136 interposed between the contact portion 124B and the first drain-electrode forming portion 123C1, a fifth contact hole CH5 for connecting the contact portion 124B and the first drain-electrode forming portion 123C1 is formed to be an opening. The fifth contact hole CH5 is disposed at a position overlapping both the contact portion 124B and the first drain-electrode forming portion 123C1 in the first interlayer insulating film 135 and the flattening film 136. Accordingly, the intermediate electrode 39 described in the first embodiment is not formed on the array substrate 121 (see FIG. 7).

As described above, the present embodiment is different from the first embodiment in that none of the touch wiring lines 131, the connection wiring lines 132, and the dummy touch wiring lines 133 are disposed to overlap the source wiring lines 127, as illustrated in FIG. 22. Because of this, the plurality of TFTs 123 according to the present embodiment each include a first TFT 123α and a second TFT 123β, but include none of the third TFT 23γ and the fourth TFT 23δ described in the first embodiment. Accordingly, an overlapping portion 141 according to the present embodiment includes none of the first overlapping portion 41α, the second overlapping portion 41β, and the third overlapping portion 41γ described in the first embodiment.

Figure 26:
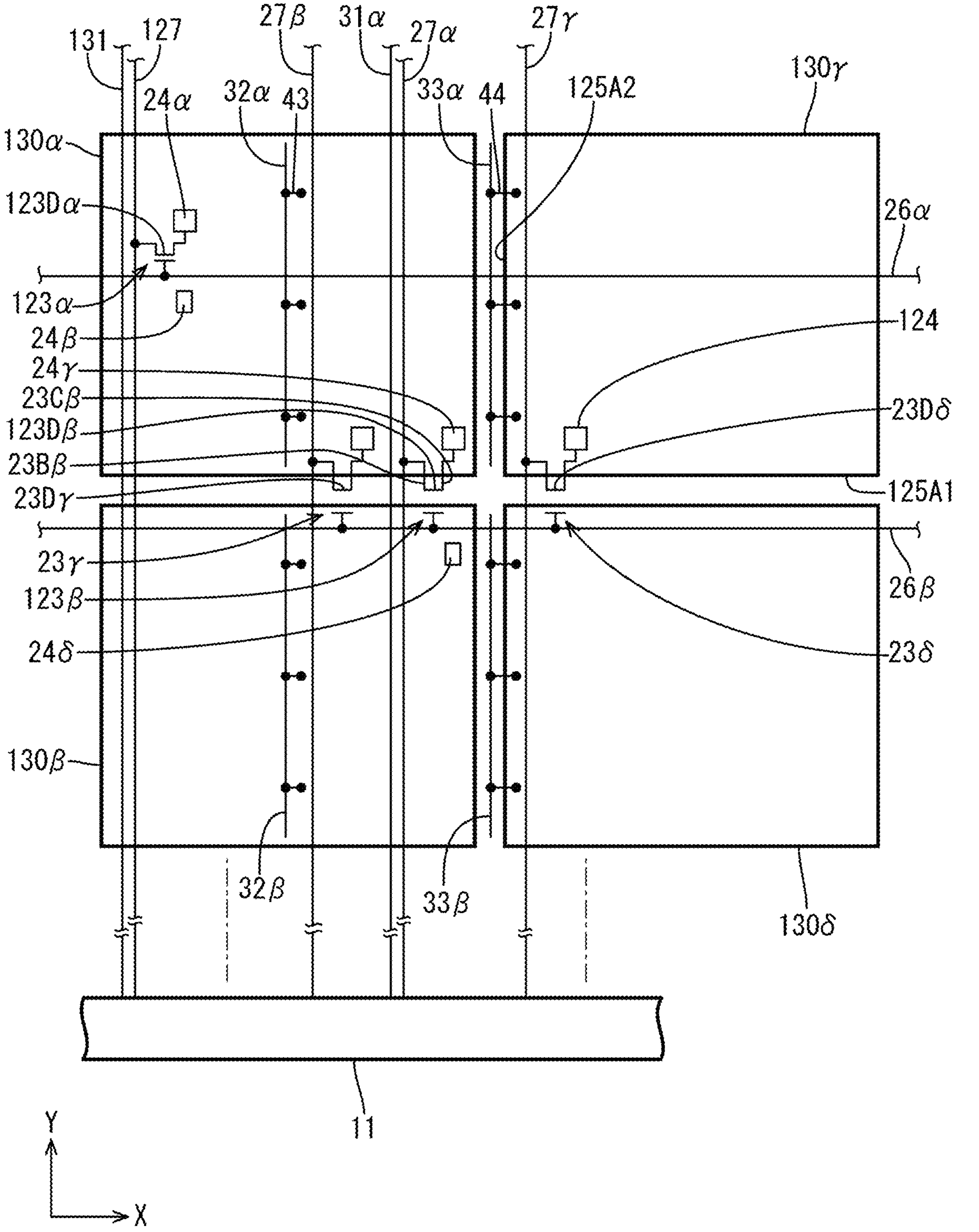
FIG. 26 is a plan view schematically illustrating a relationship between four touch electrodes, and a TFT, a pixel electrode, a gate wiring line, a source wiring line, a touch wiring line, a connection wiring line and a dummy touch wiring line, according to the second embodiment.
Figure 27:
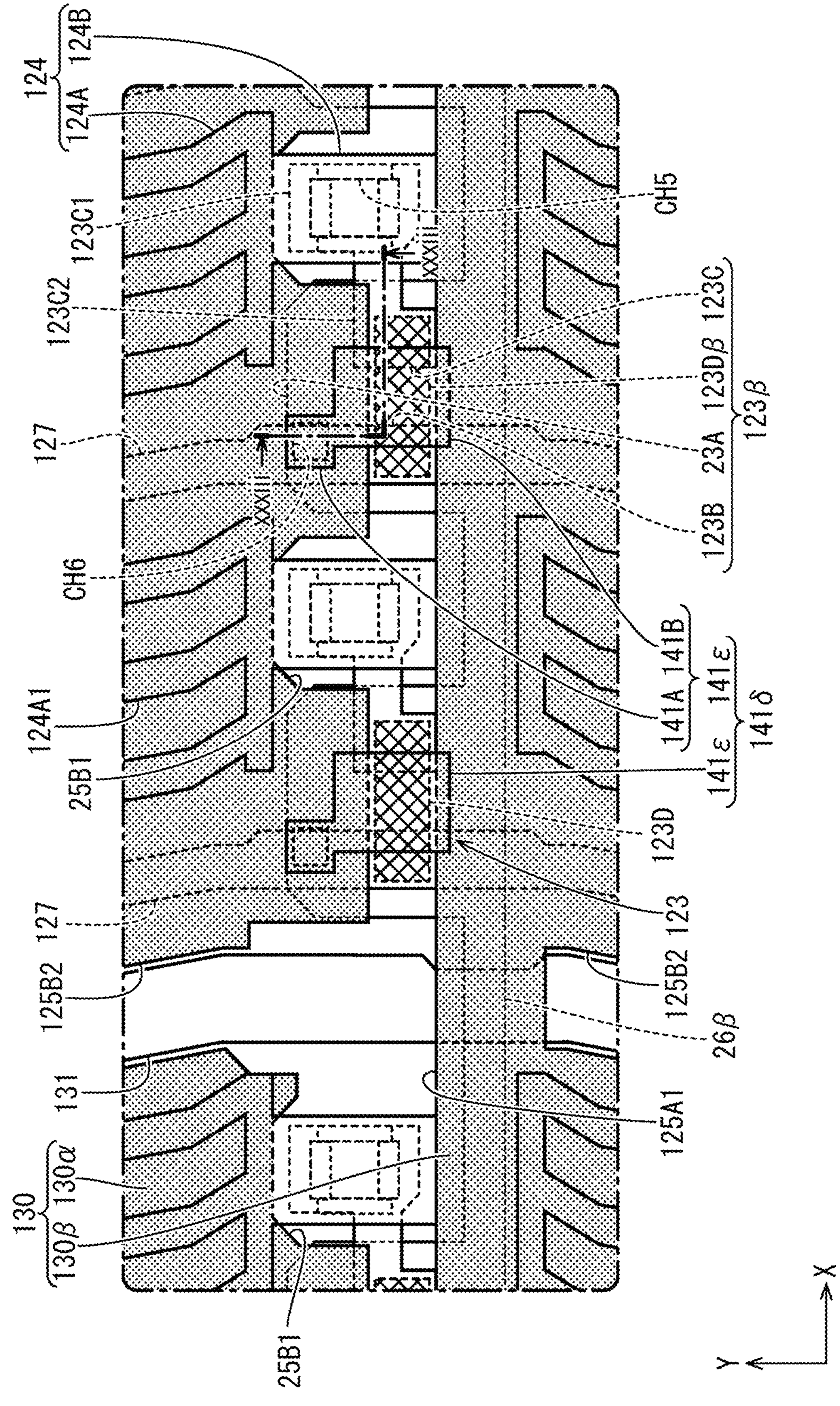
FIG. 27 is an enlarged plan view illustrating a second TFT, a touch wiring line, and the like near a first slit partitioning a first touch electrode and a second touch electrode according to the second embodiment, and indicating a semiconductor film and a first transparent electrode film with different shading.
Figure 28:
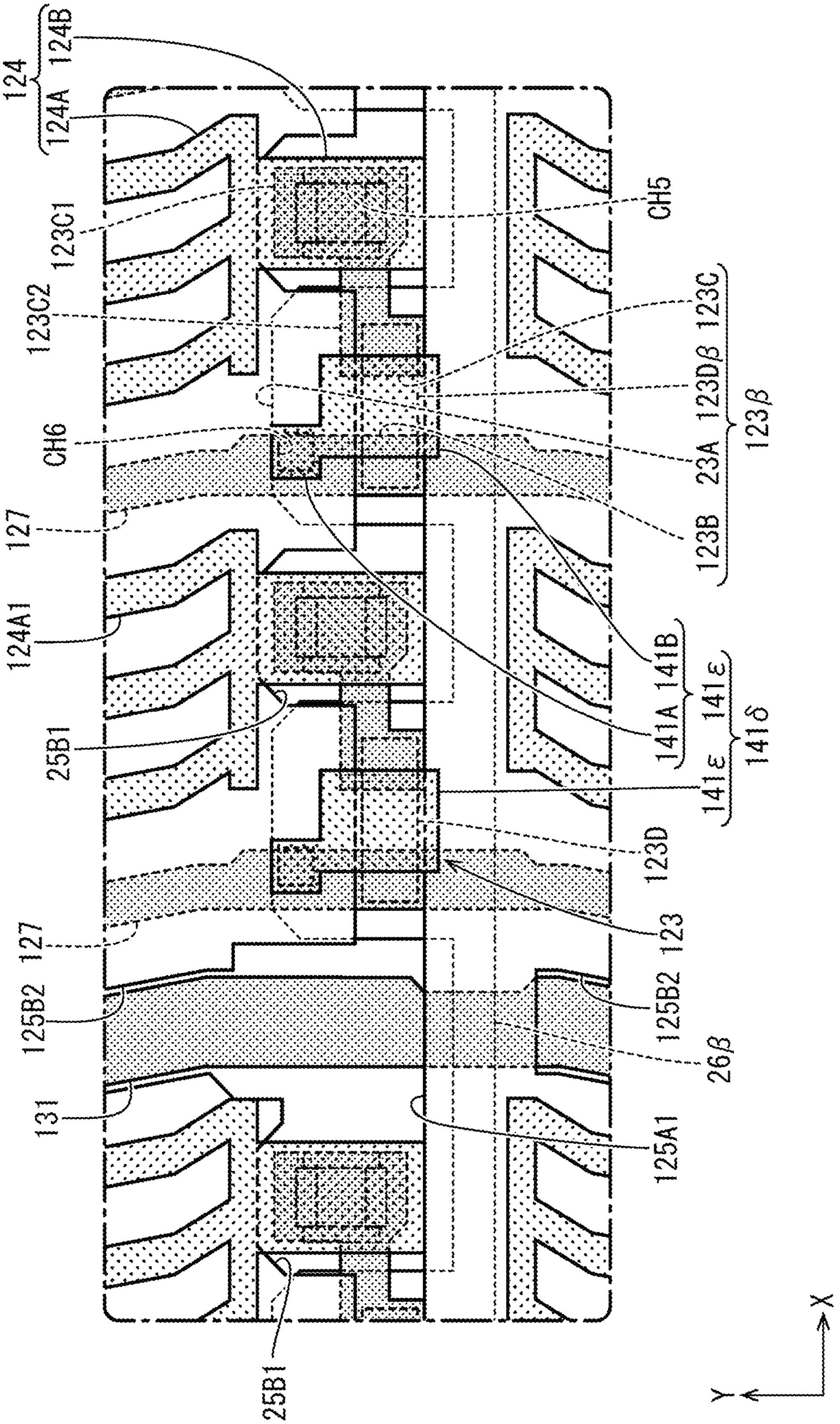
FIG. 28 is an enlarged plan view illustrating the second TFT, the touch wiring line, and the like near the first slit partitioning the first touch electrode and the second touch electrode according to the second embodiment, and indicating a second metal film and a second transparent electrode film with different shading.
Figure 29:
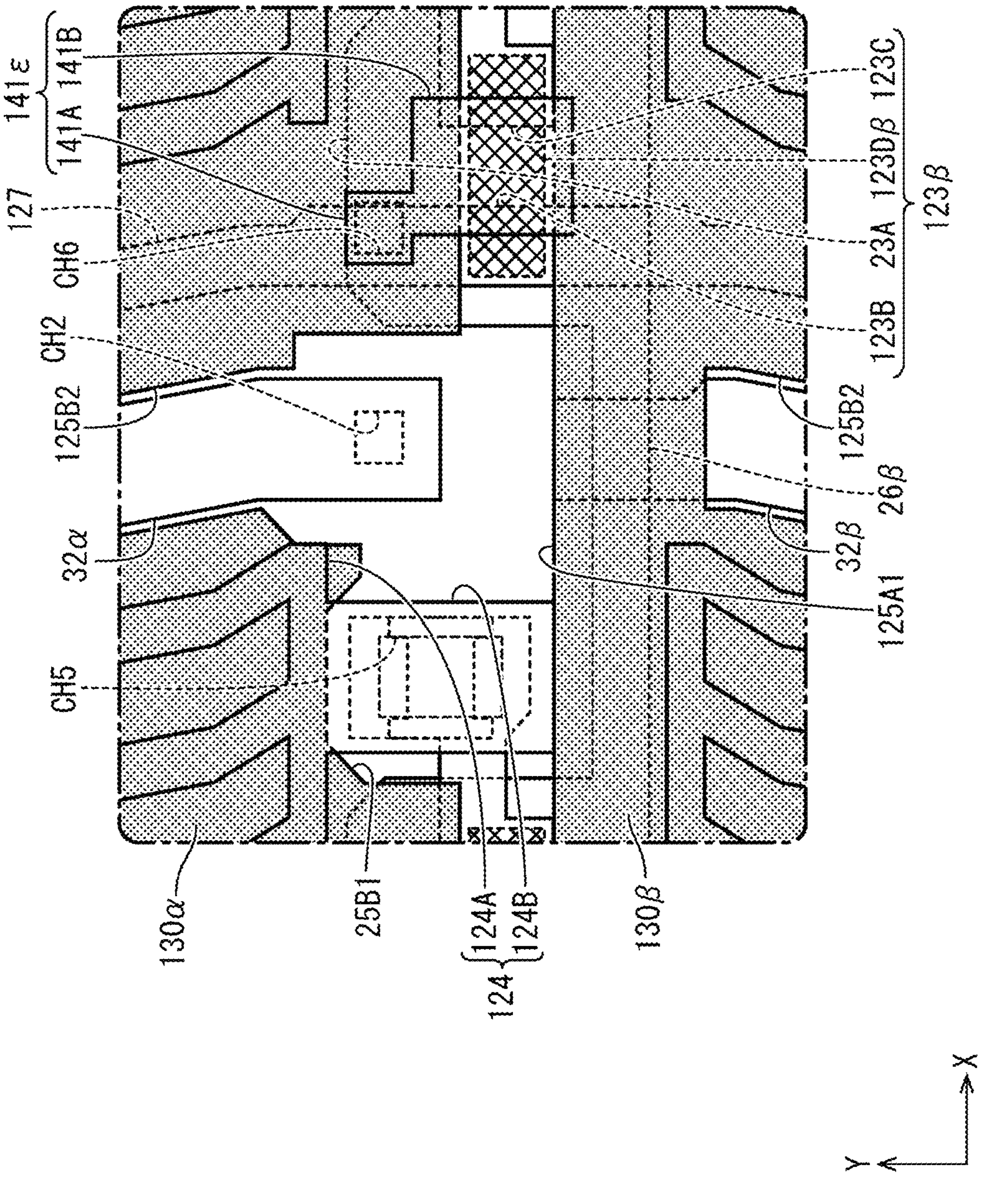
FIG. 29 is an enlarged plan view illustrating the second TFT, a connection wiring line, and the like near the first slit partitioning the first touch electrode and the second touch electrode according to the second embodiment, and indicating the semiconductor film and the first transparent electrode film with different shading.
Figure 30:
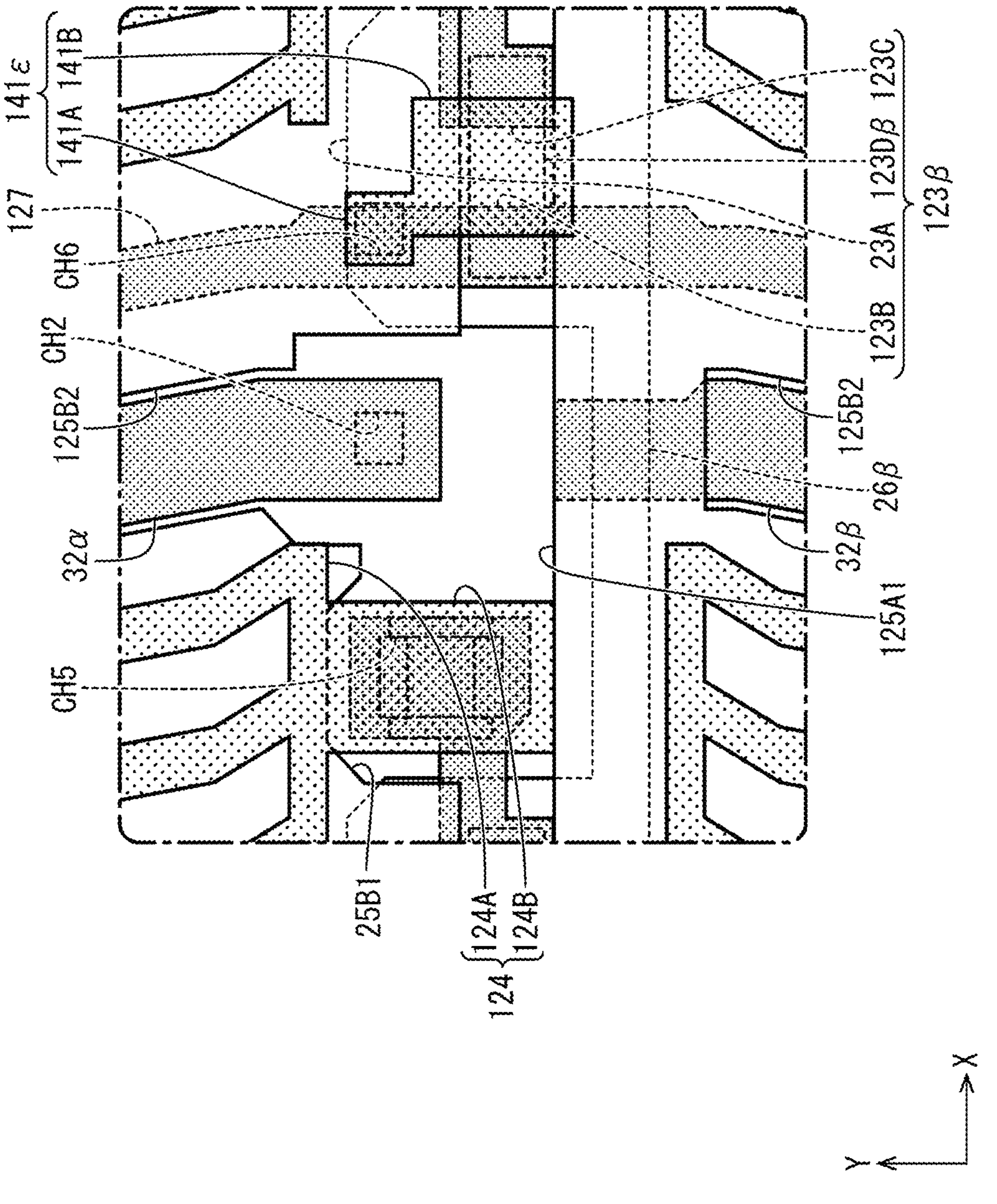
FIG. 30 is an enlarged plan view illustrating the second TFT, the connection wiring line, and the like near the first slit partitioning the first touch electrode and the second touch electrode according to the second embodiment, and indicating the second metal film and the second transparent electrode film with different shading.
Figure 31:
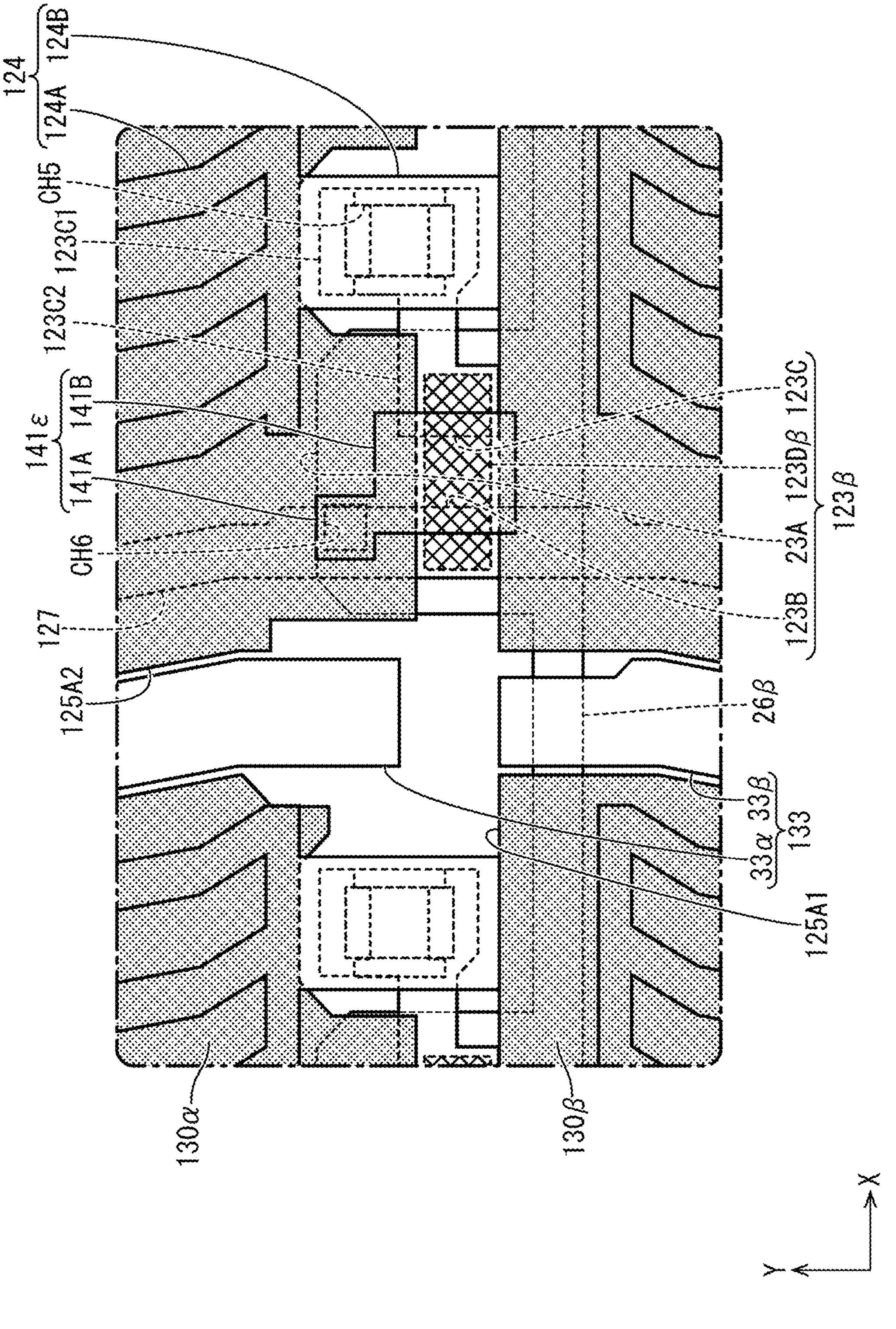
FIG. 31 is an enlarged plan view illustrating the second TFT, the dummy touch wiring line, and the like near the first slit partitioning the first touch electrode and the second touch electrode according to the second embodiment, and indicating the semiconductor film and the first transparent electrode film with different shading.
Figure 32:
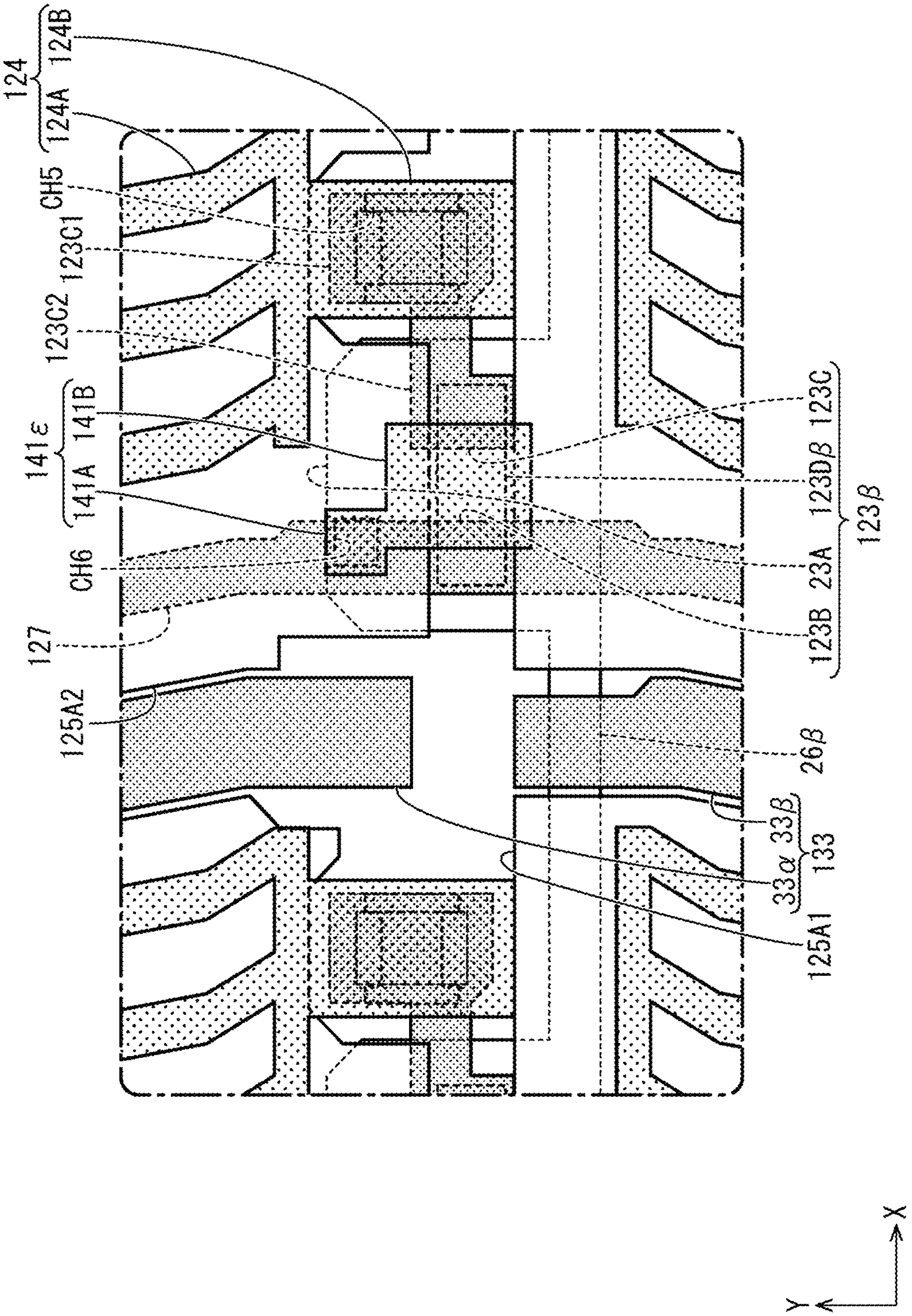
FIG. 32 is an enlarged plan view illustrating the second TFT, the dummy touch wiring line, and the like near the first slit partitioning the first touch electrode and the second touch electrode according to the second embodiment, and indicating the second metal film and the second transparent electrode film with different shading.

Next, the relationship between the overlapping portion 141 and a second semiconductor portion 1214 included in the second TFT 123β will be described with reference to FIGS. 26 to 33. In FIG. 26, as in FIG. 12, among a plurality of touch electrodes 130, four touch electrodes 130 (a first touch electrode 130α to a fourth touch electrode 130δ) are particularly illustrated. In FIG. 27 and FIG. 28, the second TFT 123β, the touch wiring line 131, and the like in the vicinity of a first slit 125A1 partitioning the first touch electrode 130α and second touch electrode 130β depicted in FIG. 26 are illustrated in an enlarged manner. In FIG. 29 and FIG. 30, the second TFT 123β, the connection wiring line 132, and the like in the vicinity of the first slit 125A1 partitioning the first touch electrode 130α and the second touch electrode 130β depicted in FIG. 26 are illustrated in an enlarged manner. In FIG. 31 and FIG. 32, the second TFT 123β, the dummy touch wiring line 133, and the like in the vicinity of the first slit 125A1 partitioning the first touch electrode 130α and the second touch electrode 130β depicted in FIG. 26 are illustrated in an enlarged manner. In FIG. 27, FIG. 29, and FIG. 31, the semiconductor film and the first transparent electrode film included in the array substrate 121 are respectively indicated with different shading. In FIG. 28, FIG. 30, and FIG. 32, the second metal film and the second transparent electrode film included in the array substrate 121 are respectively indicated with different shading.

Figure 33:
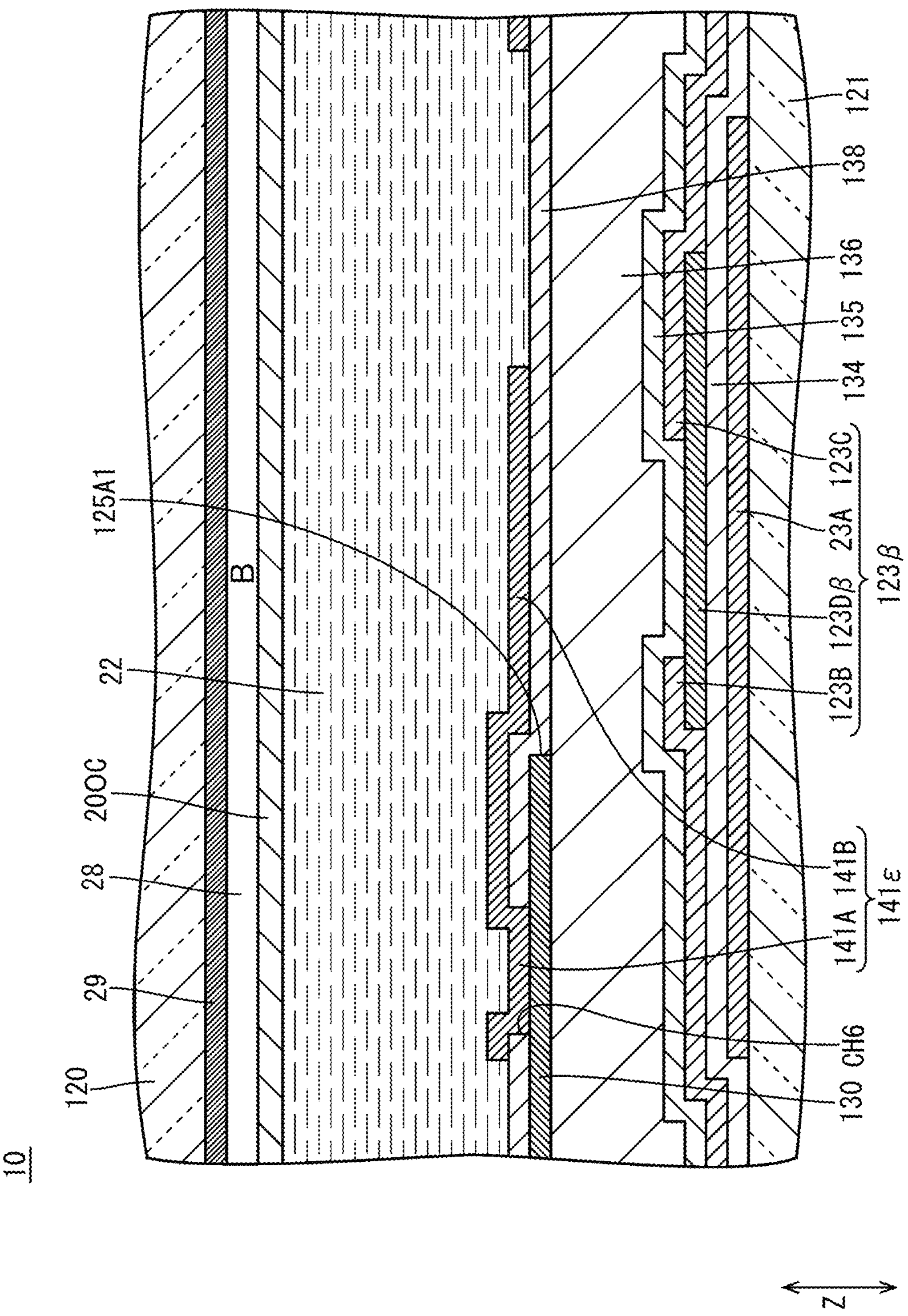
FIG. 33 is a cross-sectional view of the liquid crystal panel according to the second embodiment taken along a line xxxiii-xxxiii in FIG. 27.

As illustrated in FIGS. 27 to 32, the overlapping portion 141 according to the present embodiment includes a plurality of fourth overlapping portions 141δ formed of the same second transparent electrode film as the pixel electrode 124. The fourth overlapping portion 141δ is constituted by a portion of the second transparent electrode film different from the pixel electrode 124. As illustrated in FIG. 33, the fourth overlapping portion 141δ is disposed overlapping the upper-layer side of the second semiconductor portion 123Dβ included in the second TFT 123β with the first interlayer insulating film 135, the flattening film 136, and the third interlayer insulating film 138 interposed therebetween.

As illustrated in FIGS. 27 to 32, all of the plurality of fourth overlapping portions 141δ according to the present embodiment are fifth overlapping portions 141ε each including a first connecting electrode portion (third portion) 141A directly connected to any of the plurality of touch electrodes 130. A main body portion 141B of the fifth overlapping portion 141ε excluding the first connecting electrode portion 141A has a longitudinally elongated rectangular shape in plan view, and is disposed to overlap most of the second semiconductor portion 123Dβ (at least a channel portion functioning as a channel) included in the second TFT 123β. The main body portion 141B of the fifth overlapping portion 141ε is disposed at a position spaced apart from the contact portion 124B of the pixel electrode 124 in the X-axis direction. Thus, the main body portion 141B and the contact portion 124B adjacent to each other are unlikely to be short-circuited. The first connecting electrode portion 141A of the fifth overlapping portion 141ε has a substantially square shape in plan view, and is disposed overlapping the first touch electrode 130α or the third touch electrode 130γ. The first connecting electrode portion 141A is continuous with one corner (a corner at the upper left in FIGS. 27 to 32) of the main body portion 141B of the fifth overlapping portion 141ε, and is disposed to overlap a portion at the upper side in FIGS. 27 to 32 relative to the source electrode 123B of the source wiring line 127. As illustrated in FIG. 33, in the third interlayer insulating film 138 interposed between the first connecting electrode portion 141A and the first touch electrode 130α or the third touch electrode 130γ, a sixth contact hole CH6 for connecting the first connecting electrode portion 141A and the first touch electrode 130α or the third touch electrode 130γ is formed to be an opening.

Figure 34:
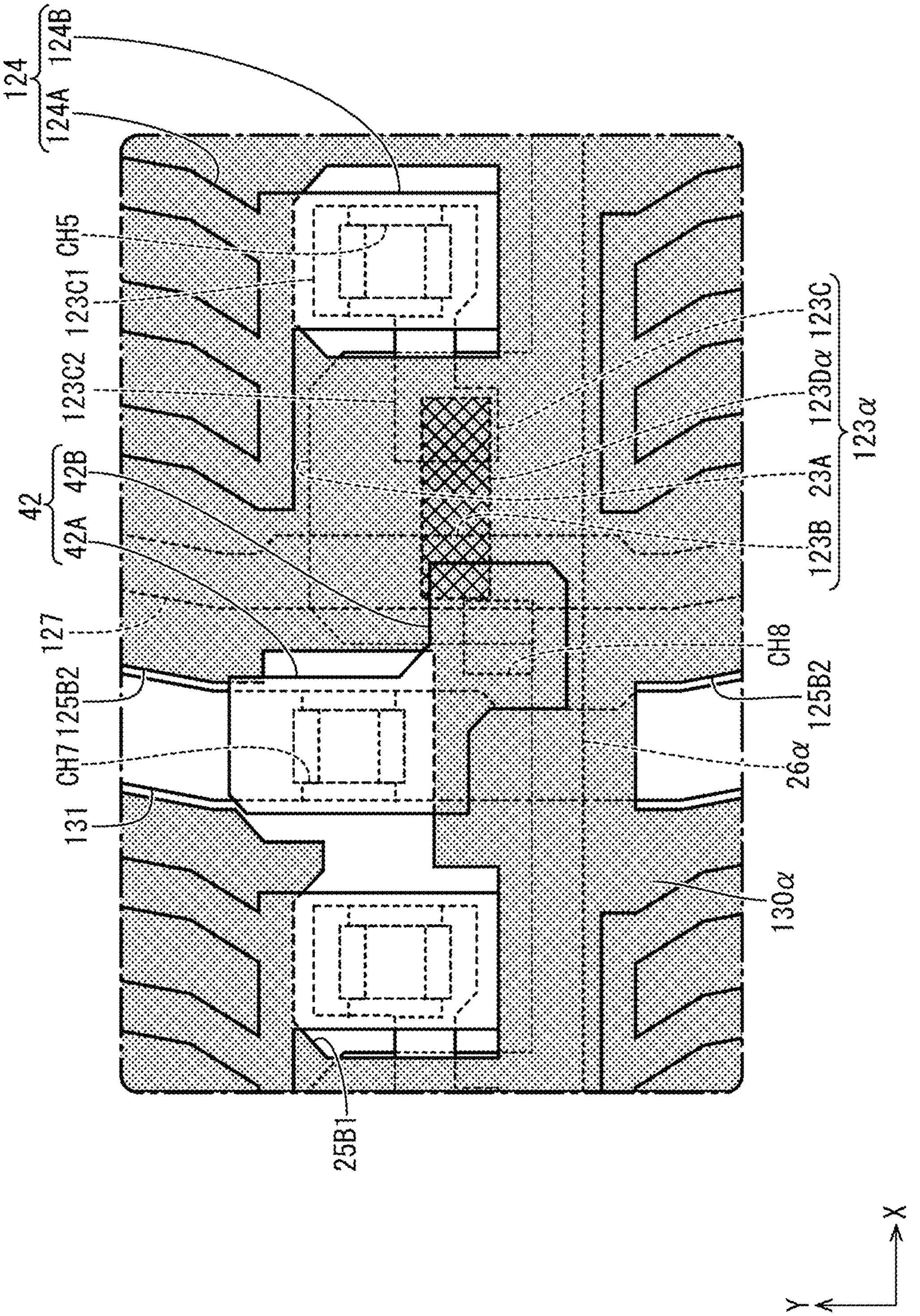
FIG. 34 is an enlarged plan view illustrating a first TFT, the touch wiring line, and the like in a formation range of the first touch electrode according to the second embodiment, and indicating the semiconductor film and the first transparent electrode film with different shading.
Figure 35:
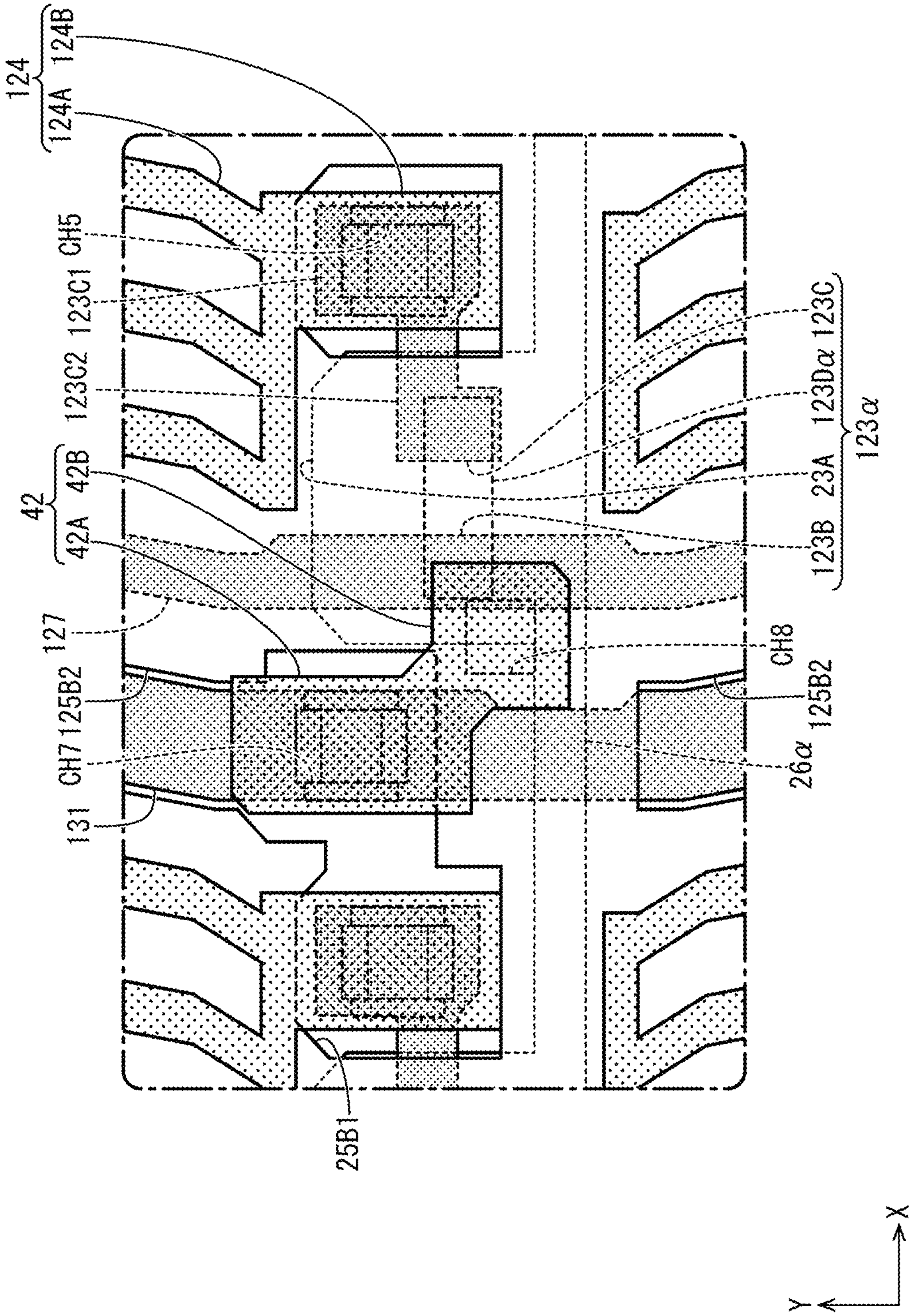
FIG. 35 is an enlarged plan view illustrating the first TFT, the touch wiring line, and the like in a formation range of the first touch electrode according to the second embodiment, and indicating the second metal film and the second transparent electrode film with different shading.
Figure 36:
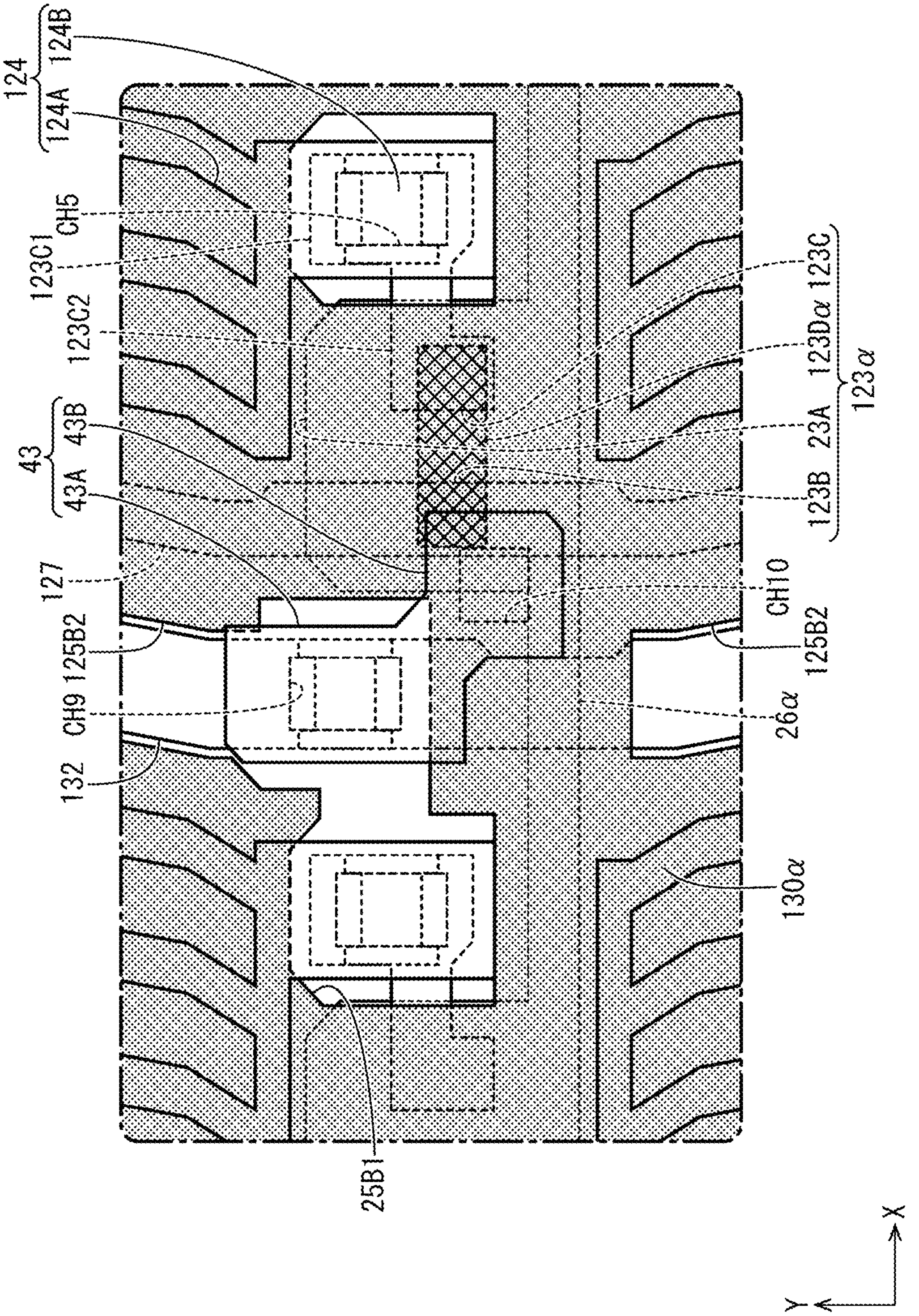
FIG. 36 is an enlarged plan view illustrating the first TFT, the connection wiring line, and the like in a formation range of the first touch electrode according to the second embodiment, and indicating the semiconductor film and the first transparent electrode film with different shading.
Figure 37:
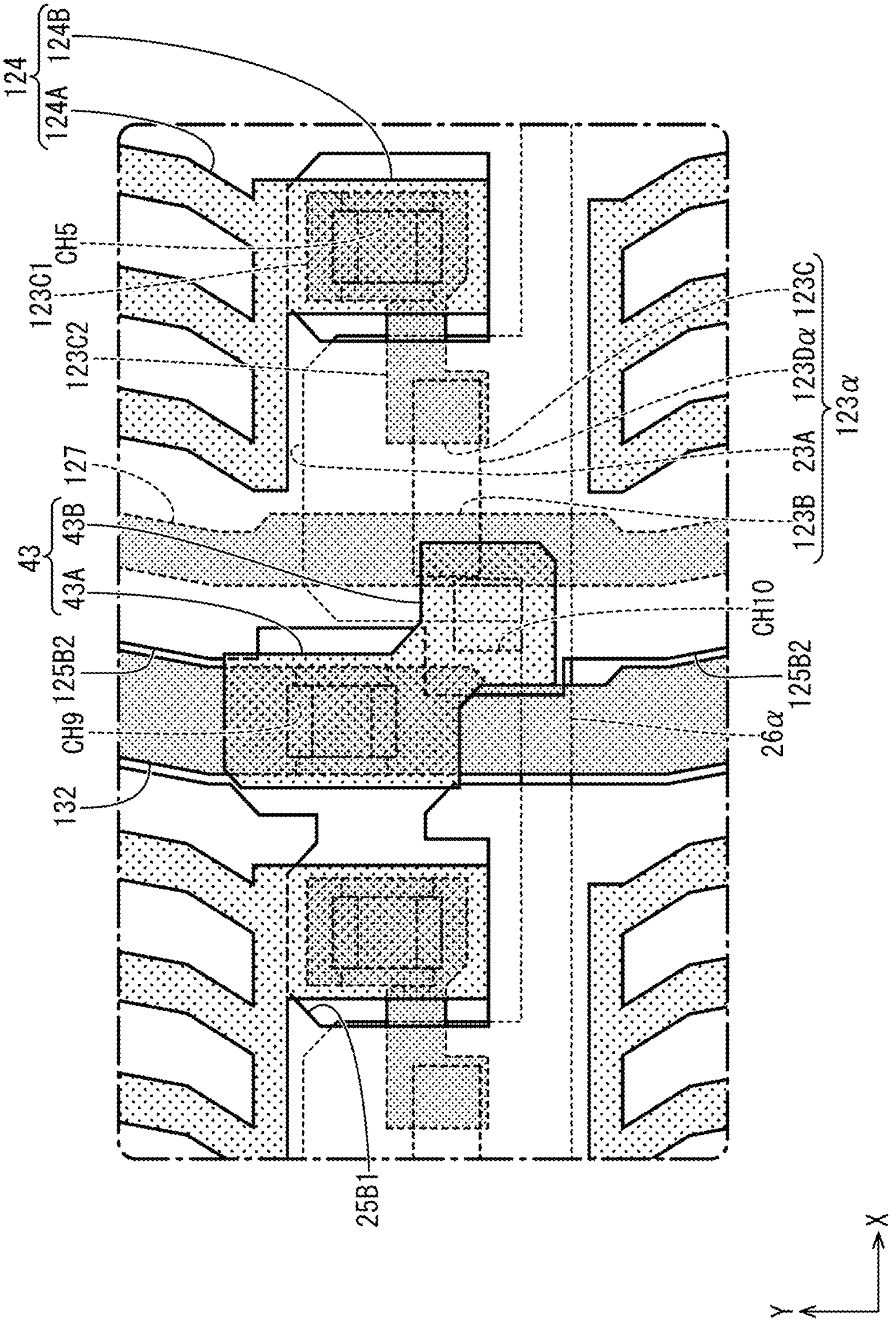
FIG. 37 is an enlarged plan view illustrating the first TFT, the connection wiring line, and the like in a formation range of the first touch electrode according to the second embodiment, and indicating the second metal film and the second transparent electrode film with different shading.
Figure 38:
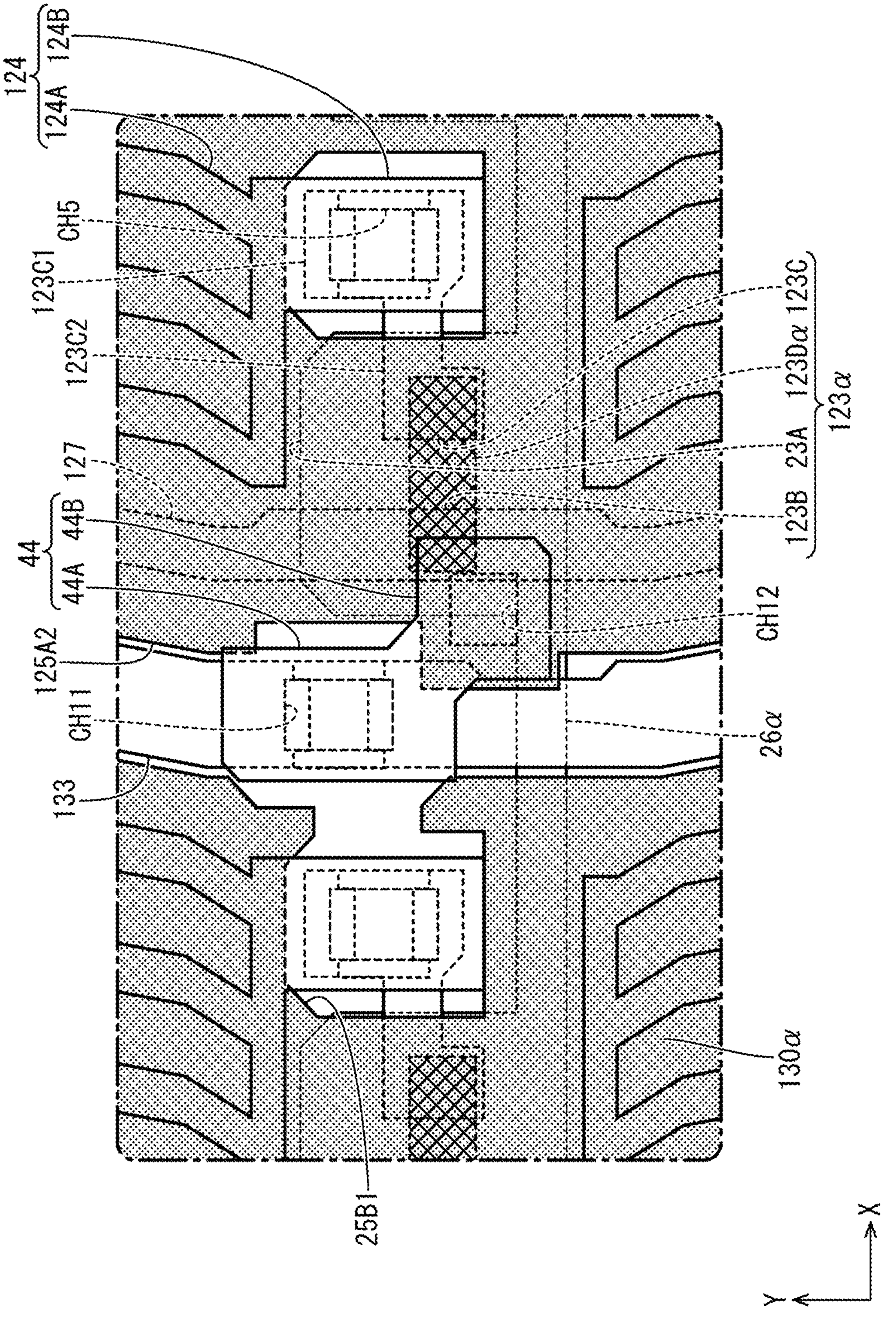
FIG. 38 is an enlarged plan view illustrating the first TFT, the dummy touch wiring line, and the like in a formation range of the first touch electrode according to the second embodiment, and indicating the semiconductor film and the first transparent electrode film with different shading.
Figure 39:
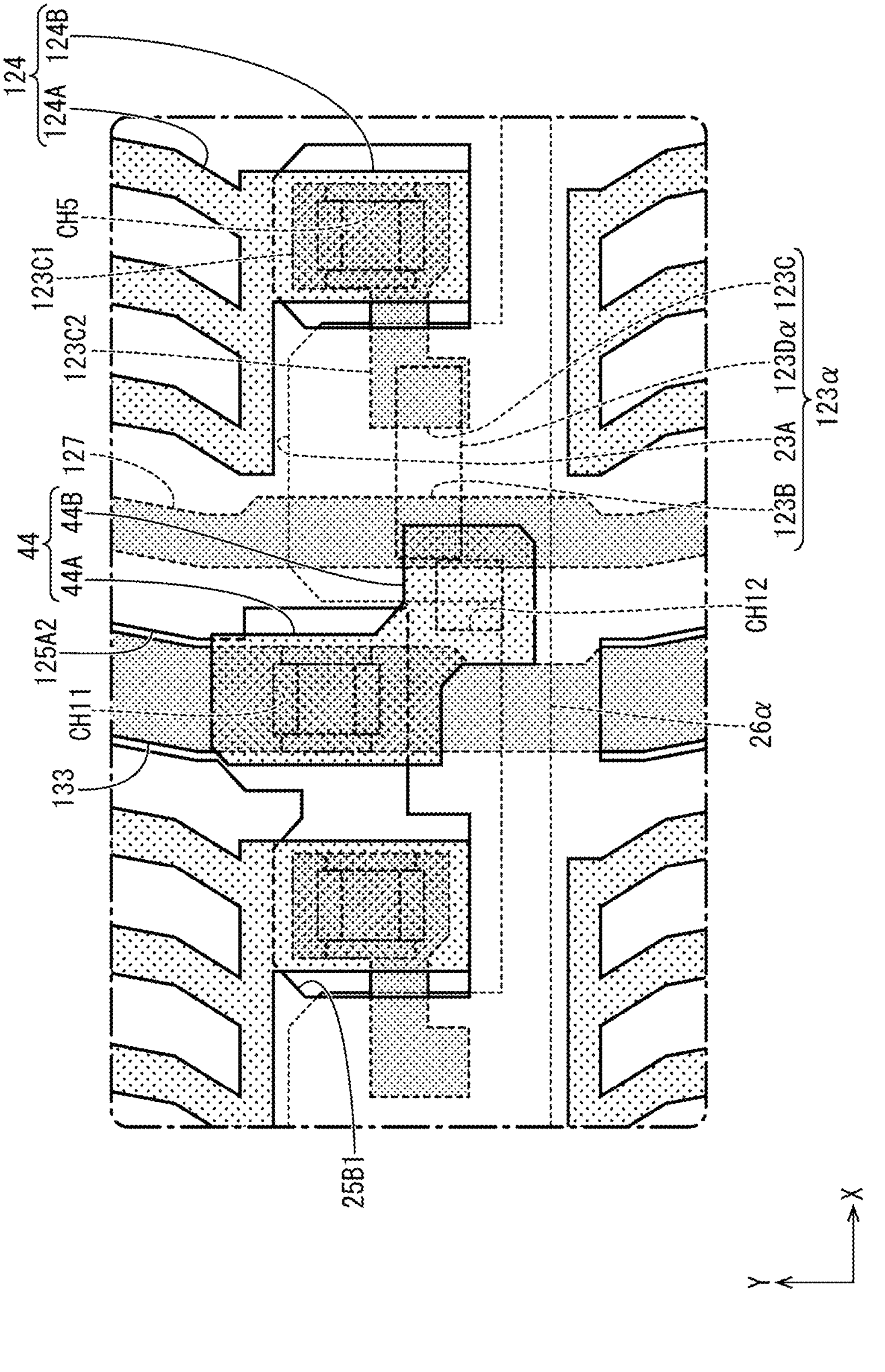
FIG. 39 is an enlarged plan view illustrating the first TFT, the dummy touch wiring line, and the like in a formation range of the first touch electrode according to the second embodiment, and indicating the second metal film and the second transparent electrode film with different shading.

Next, a connection structure between the touch wiring line 131, the connection wiring line 132, the dummy touch wiring line 133, and the touch electrode 130 will be described with reference to FIGS. 24 and 34 to 39. In FIGS. 34 and 35, the first TFT 123α, the touch wiring line 131, and the like in a formation range of the first touch electrode 130α are illustrated in an enlarged manner. In FIGS. 36 and 37, the first TFT 123α, the connection wiring line 132, and the like in the formation range of the first touch electrode 130α are illustrated in an enlarged manner. In FIGS. 38 and 39, the first TFT 123α, the dummy touch wiring line 133, and the like in the formation range of the first touch electrode 130α are illustrated in an enlarged manner. In FIG. 34, FIG. 36, and FIG. 38, the semiconductor film and the first transparent electrode film included in the array substrate 121 are respectively indicated with different shading. In FIG. 35, FIG. 37, and FIG. 39, the second metal film and the second transparent electrode film included in the array substrate 121 are respectively indicated with different shading.

As illustrated in FIGS. 34 to 39, the array substrate 121 according to the present embodiment is provided with the touch wiring line 131, the connection wiring line 132, and connecting electrodes 42 to 44 for connecting the dummy touch wiring line 133 to the touch electrode 130 to be connected thereto. Any of the touch wiring lines 131, the connection wiring lines 132, and the dummy touch wiring lines 133 illustrated in FIGS. 34 to 39 is connected to the first touch electrode 130α. The connecting electrodes 42 to 44 are formed of the same second transparent electrode film as the pixel electrode 124 and the overlapping portion 141. The connecting electrodes 42 to 44 are each constituted by a portion of the second transparent electrode film different from the pixel electrode 124 and the overlapping portion 141. The connecting electrodes 42 to 44 include a first connecting electrode 42 for connecting the touch wiring line 131 to the touch electrode 130, a second connecting electrode 43 for connecting the connection wiring line 132 to the touch electrode 130, and a third connecting electrode 44 for connecting the dummy touch wiring line 133 to the touch electrode 130. As illustrated in FIGS. 34 to 39, the first touch electrode 130α is disposed to overlap each of first semiconductor portions 123Dα included in a plurality of the first TFTs 123α.

Figure 24:
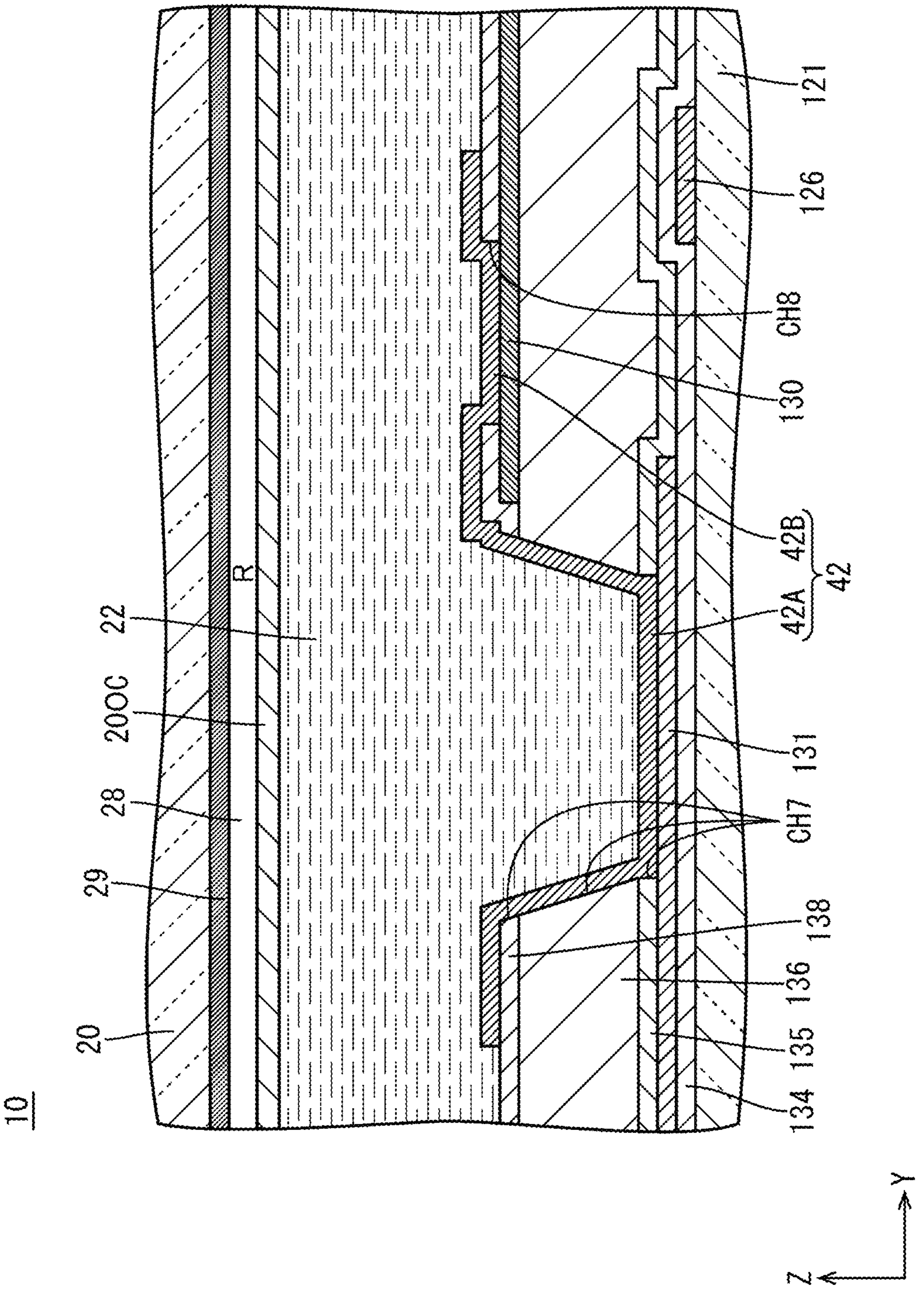
FIG. 24 is a cross-sectional view of the liquid crystal panel according to the second embodiment taken along a line xxiv-xxiv in FIG. 22.

As illustrated in FIGS. 34 and 35, the first connecting electrode 42 includes a first connection portion 42A overlapping the touch wiring line 131, and a second connection portion 42B not overlapping the touch wiring line 131 but overlapping the touch electrode 130. The first connection portion 42A has a longitudinally elongated rectangular shape in plan view, and is disposed to overlap a portion of the touch wiring line 131 interposed between the contact portion 124B located on the left side in FIGS. 34 and 35 and the source electrode 123B located on the right side in FIGS. 34 and 35. The second connection portion 42B is continuous with one corner (a corner at the lower right in FIGS. 34 and 35) of the first connection portion 42A, and part of the second connection portion 42B is disposed to overlap the source electrode 123B. As illustrated in FIG. 24, in the first interlayer insulating film 135, the flattening film 136, and the third interlayer insulating film 138 interposed between the first connection portion 42A made of the second transparent electrode film and the touch wiring line 131 made of the second metal film, a seventh contact hole CH7 for connecting the first connection portion 42A and the touch wiring line 131 is formed to be an opening. In the third interlayer insulating film 138 interposed between the second connection portion 42B and the touch electrode 130, an eighth contact hole CH8 for connecting the second connection portion 42B and the touch electrode 130 is formed to be an opening. As illustrated in FIGS. 34 and 35, the eighth contact hole CH8 is located between the source wiring line 127 and the touch wiring line 131 in the X-axis direction. In the touch electrode 130, a second opening 125B2 disposed overlapping the touch wiring line 131 is formed to extend to overlap the first connection portion 42A.

As illustrated in FIGS. 36 and 37, the second connecting electrode 43 includes a third connection portion 43A overlapping the connection wiring line 132, and a fourth connection portion 43B not overlapping the connection wiring line 132 but overlapping the touch electrode 130. The third connection portion 43A has a longitudinally elongated rectangular shape in plan view, and is disposed to overlap a portion of the connection wiring line 132 interposed between the contact portion 124B located on the left side in FIGS. 36 and 37 and the source electrode 123B located on the right side in FIGS. 36 and 37. The fourth connection portion 43B is continuous with one corner (a corner at the lower right in FIGS. 36 and 37) of the third connection portion 43A, and part of the fourth connection portion 43B is disposed to overlap the source electrode 123B. In the first interlayer insulating film 135, the flattening film 136, and the third interlayer insulating film 138 interposed between the third connection portion 43A made of the second transparent electrode film and the connection wiring line 132 made of the second metal film, a ninth contact hole CH9 for connecting the third connection portion 43A and the connection wiring line 132 is formed to be an opening. In the third interlayer insulating film 138 interposed between the fourth connection portion 43B and the touch electrode 130, a tenth contact hole CH10 for connecting the fourth connection portion 43B and the touch electrode 130 is formed to be an opening. The cross-sectional configurations of the third connection portion 43A and the connection wiring line 132 overlapping each other are similar to those of the first connection portion 42A and the touch wiring line 131 illustrated in FIG. 24. The cross-sectional configurations of the fourth connection portion 43B and the touch electrode 130 overlapping each other are similar to those of the second connection portion 42B and the touch electrode 130 illustrated in FIG. 24. As illustrated in FIGS. 36 and 37, the tenth contact hole CH10 is located between the source wiring line 127 and the connection wiring line 132 in the X-axis direction. In the touch electrode 130, the second opening 125B2 disposed overlapping the connection wiring line 132 is formed to extend to overlap the third connection portion 43A.

As illustrated in FIGS. 38 and 39, the third connecting electrode 44 includes a fifth connection portion 44A overlapping the dummy touch wiring line 133, and a sixth connection portion 44B not overlapping the dummy touch wiring line 133 but overlapping the touch electrode 130 (for example, the third touch electrode 130γ). The fifth connection portion 44A has a longitudinally elongated rectangular shape in plan view, and is disposed to overlap a portion of the dummy touch wiring line 133 interposed between the contact portion 124B located on the left side in FIGS. 38 and 39 and the source electrode 123B located on the right side in FIGS. 38 and 39. The sixth connection portion 44B is continuous with one corner (a corner at the lower right in FIGS. 38 and 39) of the fifth connection portion 44A, and part of the sixth connection portion 44B is disposed to overlap the source electrode 123B. In the first interlayer insulating film 135, the flattening film 136, and the third interlayer insulating film 138 interposed between the fifth connection portion 44A made of the second transparent electrode film and the dummy touch wiring line 133 made of the second metal film, an eleventh contact hole CH11 for connecting the fifth connection portion 44A and the dummy touch wiring line 133 is formed to be an opening. In the third interlayer insulating film 138 interposed between the sixth connection portion 44B and the touch electrode 130, a twelfth contact hole CH12 for connecting the sixth connection portion 44B and the touch electrode 130 is formed to be an opening. The cross-sectional configurations of the fifth connection portion 44A and the dummy touch wiring line 133 overlapping each other are similar to those of the first connection portion 42A and the touch wiring line 131 illustrated in FIG. 24. The cross-sectional configurations of the sixth connection portion 44B and the touch electrode 130 overlapping each other are similar to those of the second connection portion 42B and the touch electrode 130 illustrated in FIG. 24. As illustrated in FIGS. 38 and 39, the twelfth contact hole CH12 is located between the source wiring line 127 and the dummy touch wiring line 133 in the X-axis direction. In the touch electrode 130, a second slit 125A2 disposed overlapping the dummy touch wiring line 133 is formed to overlap the fifth connection portion 44A.

As described above, according to the present embodiment, the plurality of common electrodes 25 are the plurality of touch electrodes (position detection electrodes) 130, the first common electrode 25α is the first touch electrode (first position detection electrode) 130α, and the second common electrode 25β is the second touch electrode (second position detection electrode) 130β. The plurality of wiring lines include the touch wiring line 131, connection wiring line 132, and dummy touch wiring line 133, as the tenth wiring lines, extending along the first direction and connected to any of the plurality of touch electrodes 130, and the source wiring line (eleventh wiring line) 127 extending along the first direction and connected to at least the second TFT 123β. The source wiring line 127 is made of the second metal film (third conductive film) located on the lower-layer side relative to any of the plurality of touch electrodes 130 and the plurality of pixel electrodes 124 via the first interlayer insulating film 135 and flattening film 136 as the fourth insulating film. The touch wiring line 131, connection wiring line 132, and dummy touch wiring line 133, as the tenth wiring lines, are each made of a portion of the second metal film different from the source wiring line 127, and disposed to be aligned being spaced apart in the second direction from the source wiring line 127. The plurality of pixel electrodes 124 are made of the second transparent electrode film (fourth conductive film). The overlapping portion 141 includes the fourth overlapping portion 141δ made of a portion of the second transparent electrode film different from the plurality of pixel electrodes 124. As described above, the touch wiring line 131, connection wiring line 132, and, dummy touch wiring line 133, as the tenth wiring lines, are made of a portion of the second metal film different from the source wiring line 127. Because of this, the numbers of metal films (conductive films) and the like may be reduced as compared with a case where the touch wiring line 131, connection wiring line 132, and dummy touch wiring line 133, as the tenth wiring lines, are constituted by a metal film (conductive film) disposed in a different layer from the second metal film. The touch wiring line 131, connection wiring line 132, and, dummy touch wiring line 133, as the tenth wiring lines, are disposed to be aligned being spaced apart in the second direction from the source wiring line 127, thereby avoiding a short circuit with the source wiring line 127. The fourth overlapping portion 141δ can be provided by using part of the second transparent electrode film.

The fourth overlapping portion 141δ includes the fifth overlapping portion 141ε having the first connecting electrode portion (third portion) 141A overlapping the first touch electrode 130α or the second touch electrode 130β, and the third portion of the fifth overlapping portion 141ε is connected to the first touch electrode 130α or the second touch electrode 130β. Since the first connecting electrode portion 141A of the fifth overlapping portion 141ε is directly connected to the first touch electrode 130α or the second touch electrode 130β, high connection reliability is obtained.

Third Embodiment

A third embodiment will be described with reference to FIGS. 40 to 44. The third embodiment describes a case in which the configuration of a fourth overlapping portion 241δ is changed from the configuration of the second embodiment described above. Further, repetitive descriptions of structures, actions, and effects similar to those of the second embodiment described above will be omitted.

Figure 40:
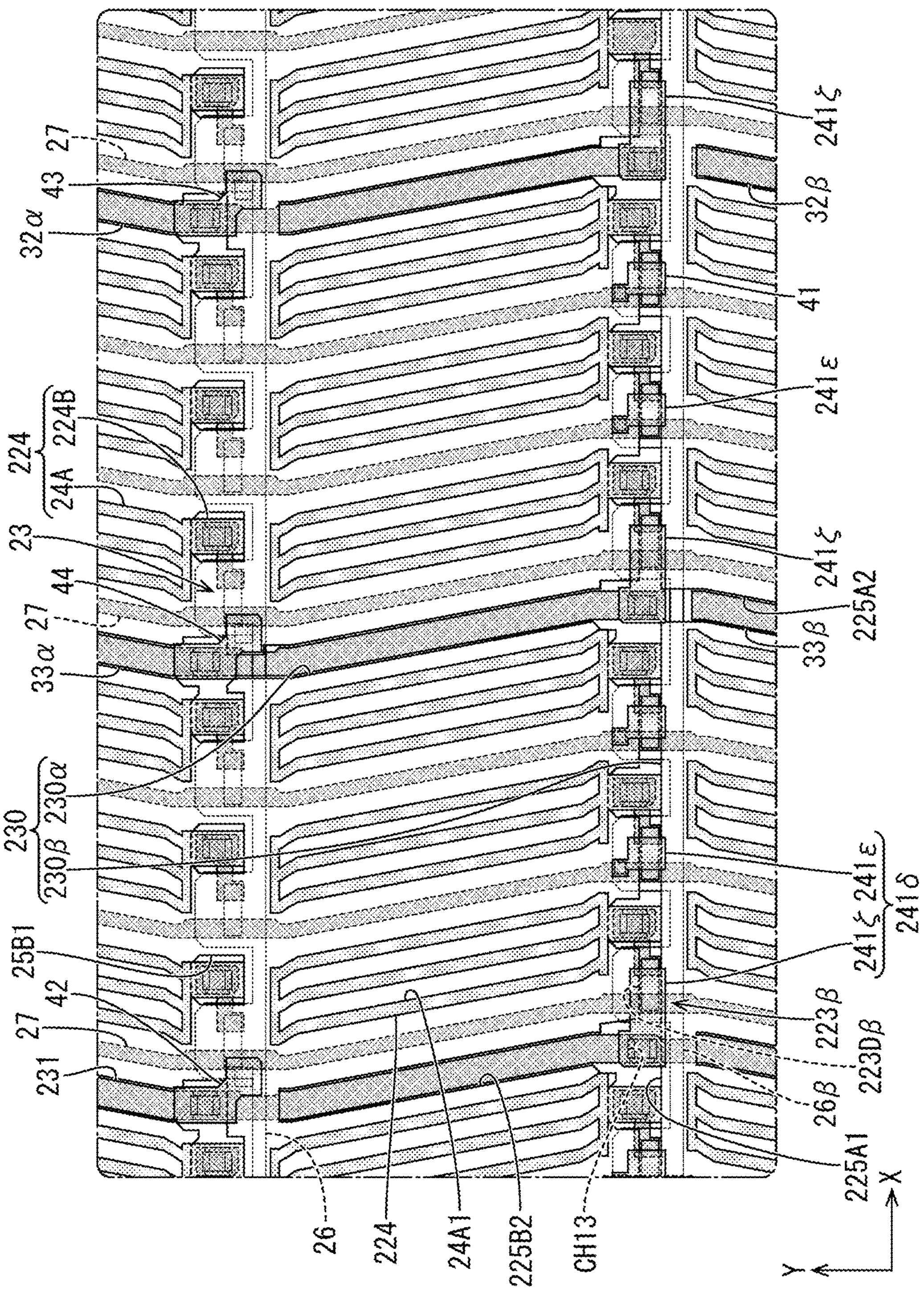
FIG. 40 is a plan view illustrating a pixel arrangement in a display region of a liquid crystal panel according to a third embodiment, and indicating a second metal film and a second transparent electrode film with different shading.

As illustrated in FIG. 40, the fourth overlapping portion 241δ according to the present embodiment includes a sixth overlapping portion 241ζ in addition to the fifth overlapping portion 241ε described in the second embodiment. In FIG. 40, a second metal film and a second transparent electrode film included in an array substrate 221 are respectively indicated with different shading. The sixth overlapping portion 241ζ is made of a portion of a second transparent electrode film different from a pixel electrode 224 and the fifth overlapping portion 241ε.

Figure 41:
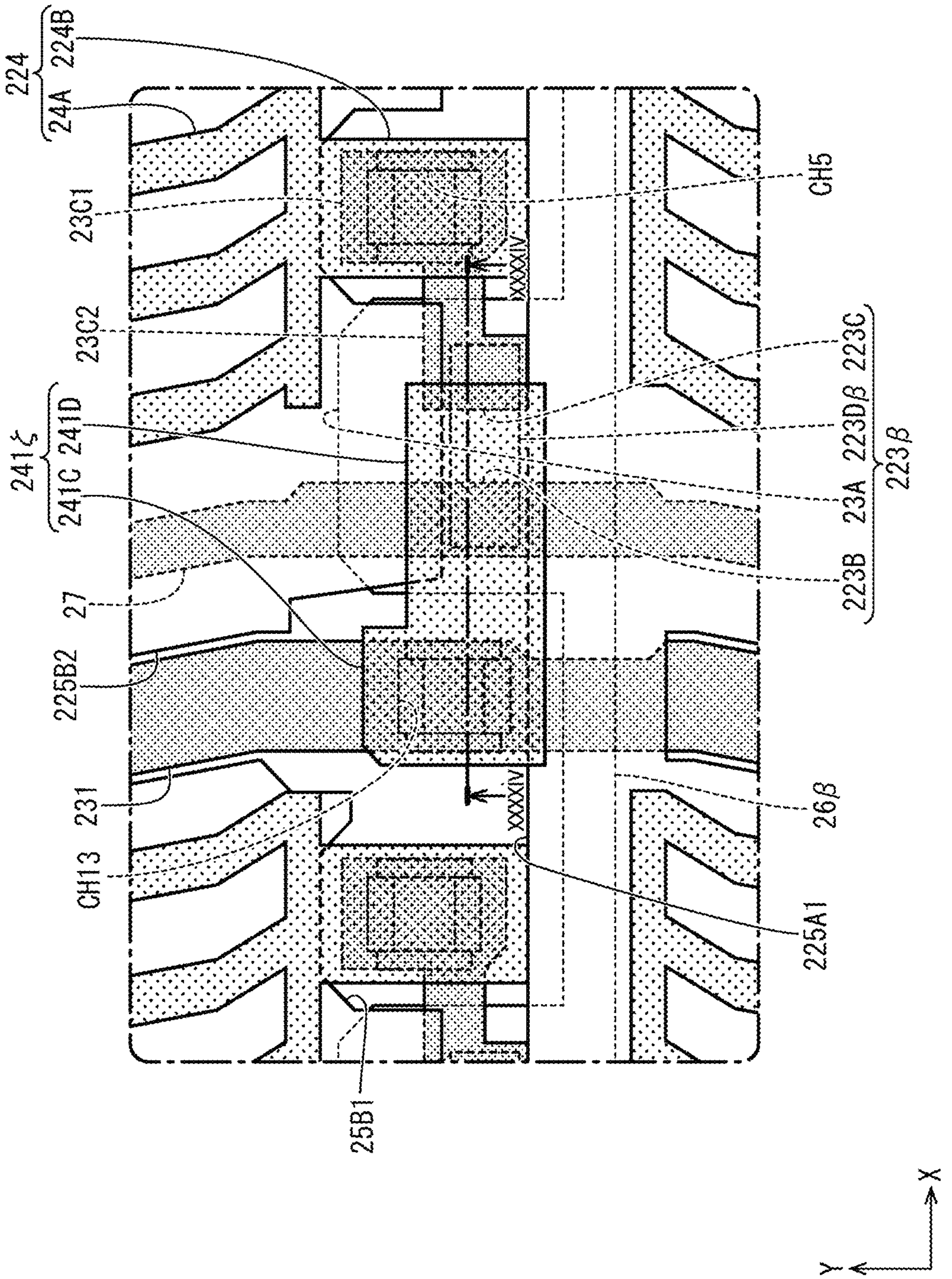
FIG. 41 is an enlarged plan view illustrating a second TFT, a touch wiring line, and the like near a first slit partitioning a first touch electrode and a second touch electrode according to the third embodiment, and indicating the second metal film and the second transparent electrode film with different shading.
Figure 42:
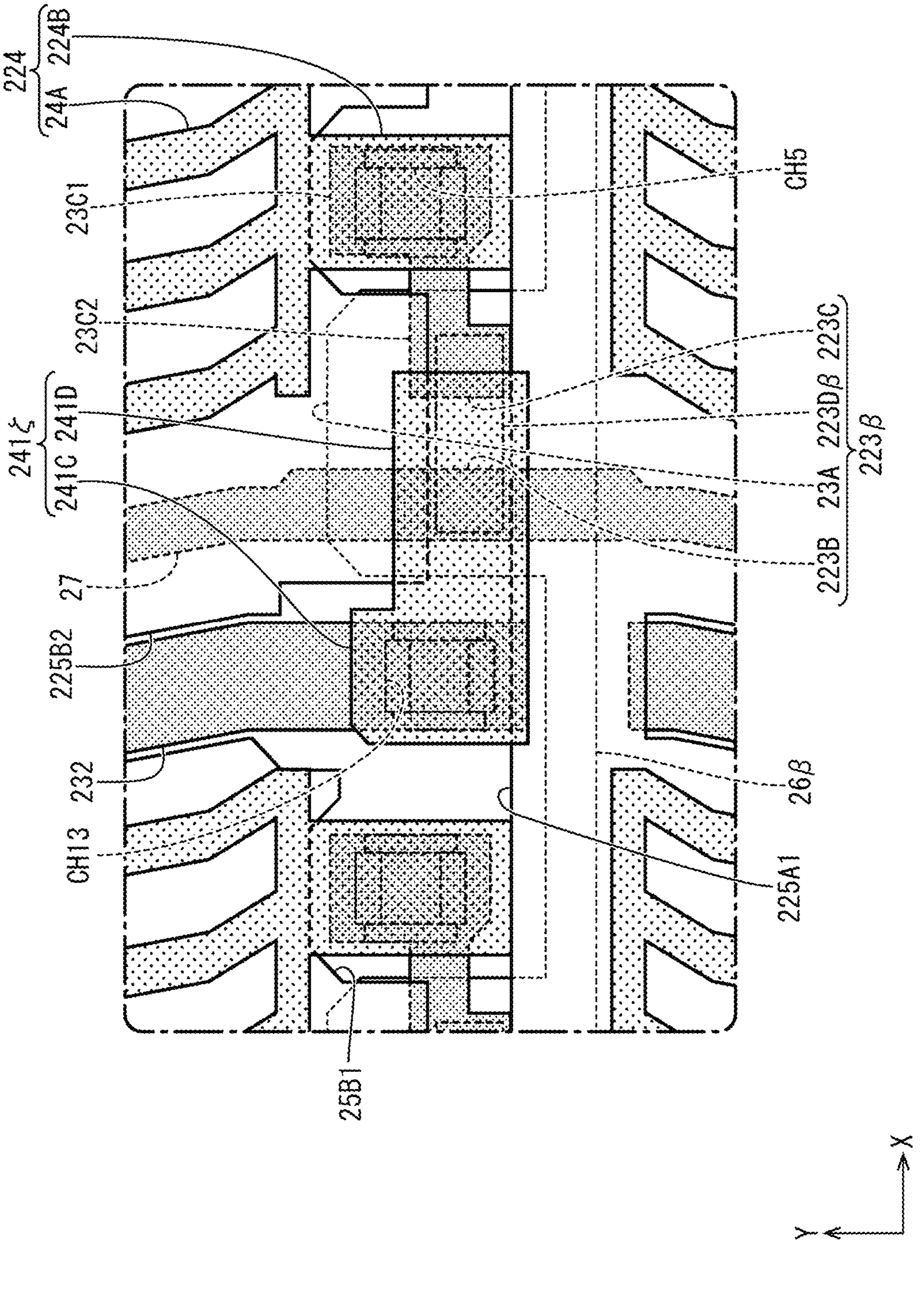
FIG. 42 is an enlarged plan view illustrating the second TFT, a connection wiring line, and the like near the first slit partitioning the first touch electrode and the second touch electrode according to the third embodiment, and indicating the second metal film and the second transparent electrode film with different shading.
Figure 43:
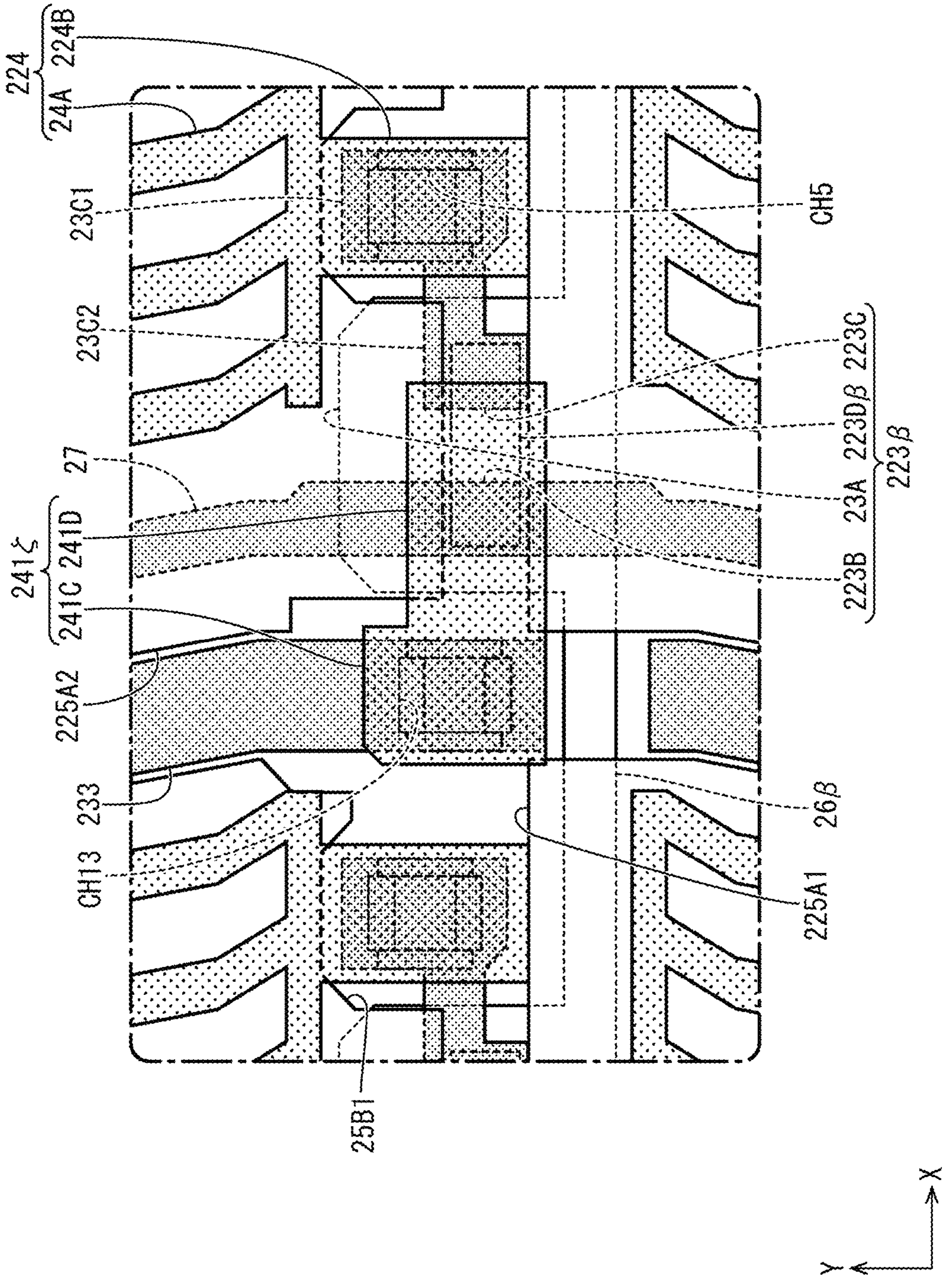
FIG. 43 is an enlarged plan view illustrating the second TFT, a dummy touch wiring line, and the like near the first slit partitioning the first touch electrode and the second touch electrode according to the third embodiment, and indicating the second metal film and the second transparent electrode film with different shading.

The configuration of the sixth overlapping portion 241ζ will be described with reference to FIGS. 41 to 44. In FIG. 41, a second TFT 223β, a touch wiring line 231, and the like in the vicinity of a first slit 225A1 partitioning a first touch electrode 230α and a second touch electrode 230β are illustrated in an enlarged manner. In FIG. 42, the second TFT 223β, a connection wiring line 232, and the like in the vicinity of the first slit 225A1 partitioning the first touch electrode 230α and the second touch electrode 230β are illustrated in an enlarged manner. In FIG. 43, the second TFT 223β, a dummy touch wiring line 233, and the like in the vicinity of the first slit 225A1 partitioning the first touch electrode 230α and the second touch electrode 230β are illustrated in an enlarged manner. In FIGS. 41 to 43, the second metal film and the second transparent electrode film included in the array substrate 221 are respectively indicated with different shading.

Figure 44:
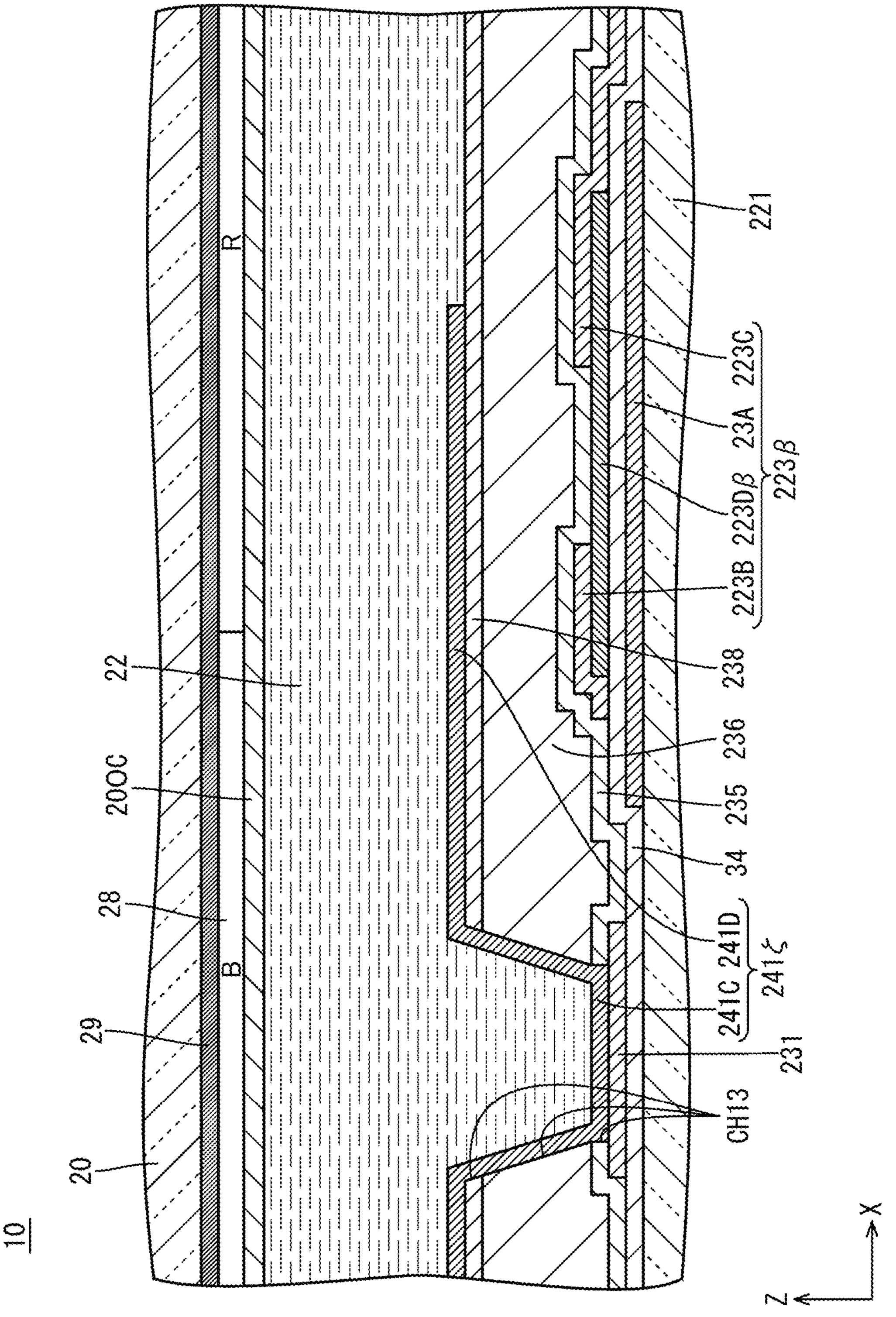
FIG. 44 is a cross-sectional view of the liquid crystal panel according to the third embodiment taken along a line xxxxiv-xxxxiv in FIG. 41.

As illustrated in FIGS. 41 to 43, the sixth overlapping portion 241ζ includes a second connecting electrode portion (fourth portion) 241C overlapping any of the touch wiring line 231, the connection wiring line 232, and the dummy touch wiring line 233. The sixth overlapping portion 241ζ is connected to any of the touch wiring line 231, connection wiring line 232, and dummy touch wiring line 233 overlapping with the second connecting electrode portion 241C. Accordingly, the sixth overlapping portion 241ζ is indirectly connected to any of a plurality of touch electrodes 230 via any of the touch wiring line 231, connection wiring line 232, and dummy touch wiring line 233. A main body portion 241D of the sixth overlapping portion 241ζ excluding the second connecting electrode portion 241C has a horizontally elongated rectangular shape in plan view, and is disposed to overlap most of a second semiconductor portion 223Dβ (at least a channel portion functioning as a channel) included in the second TFT 223β. The main body portion 241D of the sixth overlapping portion 241ζ is disposed at a position spaced apart from a contact portion 224B of the pixel electrode 224 in the X-axis direction. Thus, the main body portion 241D and the contact portion 224B adjacent to each other are unlikely to be short-circuited. The second connecting electrode portion 241C of the sixth overlapping portion 241ζ has a longitudinally elongated rectangular shape in plan view, and is disposed to overlap any of the touch wiring line 231, connection wiring line 232, and dummy touch wiring line 233. The second connecting electrode portion 241C is continuous with an end portion on the opposite side to the contact portion 224B side in the X-axis direction (an end portion on the left side in FIGS. 41 to 43) of the main body portion 241D of the sixth overlapping portion 241ζ, and is disposed at a position spaced apart from a source electrode 223B on the opposite side in the X-axis direction to the side of a drain electrode 223C. As illustrated in FIG. 44, in a first interlayer insulating film 235, a flattening film 236, and a third interlayer insulating film 238 interposed between the second connecting electrode portion 241C and any of the touch wiring line 231, the connection wiring line 232, and the dummy touch wiring line 233, a thirteenth contact hole CH13 for connecting the second connecting electrode portion 241C and any of the touch wiring line 231, the connection wiring line 232, and the dummy touch wiring line 233 is formed to be an opening. In the touch electrode 230, a second opening 225B2 disposed overlapping the touch wiring line 231, the connection wiring line 232, and the like is formed to communicate with the first slit 225A1 in such a manner as to overlap the second connecting electrode portion 241C, as illustrated in FIGS. 41 and 42. In addition, in the touch electrode 230, a second slit 225A2 disposed overlapping the dummy touch wiring line 233 is formed to communicate with the first slit 225A1 in such a manner as to overlap the second connecting electrode portion 241C, as illustrated in FIG. 43.

As described above, according to the present embodiment, the fourth overlapping portion 241δ includes the sixth overlapping portion 241ζ having the second connecting electrode portion (fourth portion) 241C overlapping the touch wiring line 231, connection wiring line 232, and dummy touch wiring line 233 as the tenth wiring lines, and the second connecting electrode portion 241C of the sixth overlapping portion 241ζ is connected to the touch wiring line 231, connection wiring line 232, and dummy touch wiring line 233 as the tenth wiring lines. In this manner, the second connecting electrode portion 241C of the sixth overlapping portion 241ζ is indirectly connected to any of the plurality of touch electrodes 230 via the touch wiring line

231, connection wiring line 232, and dummy touch wiring line 233 as the tenth wiring lines. Compared to a case where the sixth overlapping portion 241ζ is directly connected to any of the plurality of touch electrodes 230, the plurality of touch electrodes 230 do not need to be provided with a connection structure for the sixth overlapping portion 241ζ, and thus the degree of freedom in designing the plurality of touch electrodes 230 is improved.

Fourth Embodiment

A fourth embodiment will be described with reference to FIGS. 45 and 46. The fourth embodiment describes a case in which the configuration of an overlapping portion 341 is changed from the configuration of the first embodiment described above. Further, repetitive descriptions of structures, actions, and effects similar to those of the first embodiment described above will be omitted.

Figure 45:
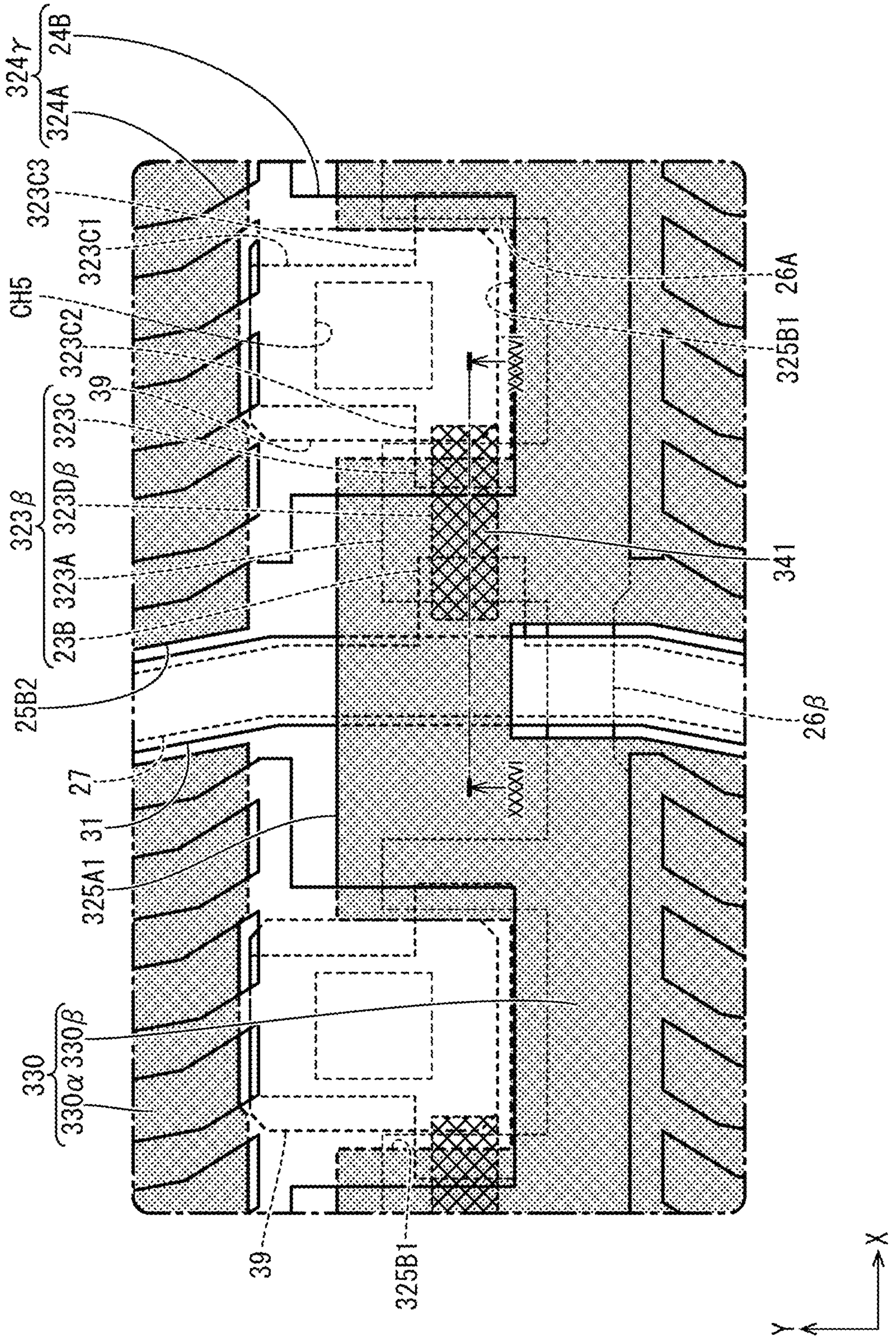
FIG. 45 is an enlarged plan view illustrating a second TFT, a touch wiring line, and the like near a first slit partitioning a first touch electrode and a second touch electrode according to a fourth embodiment, and indicating a semiconductor film and a first transparent electrode film with different shading.
Figure 46:
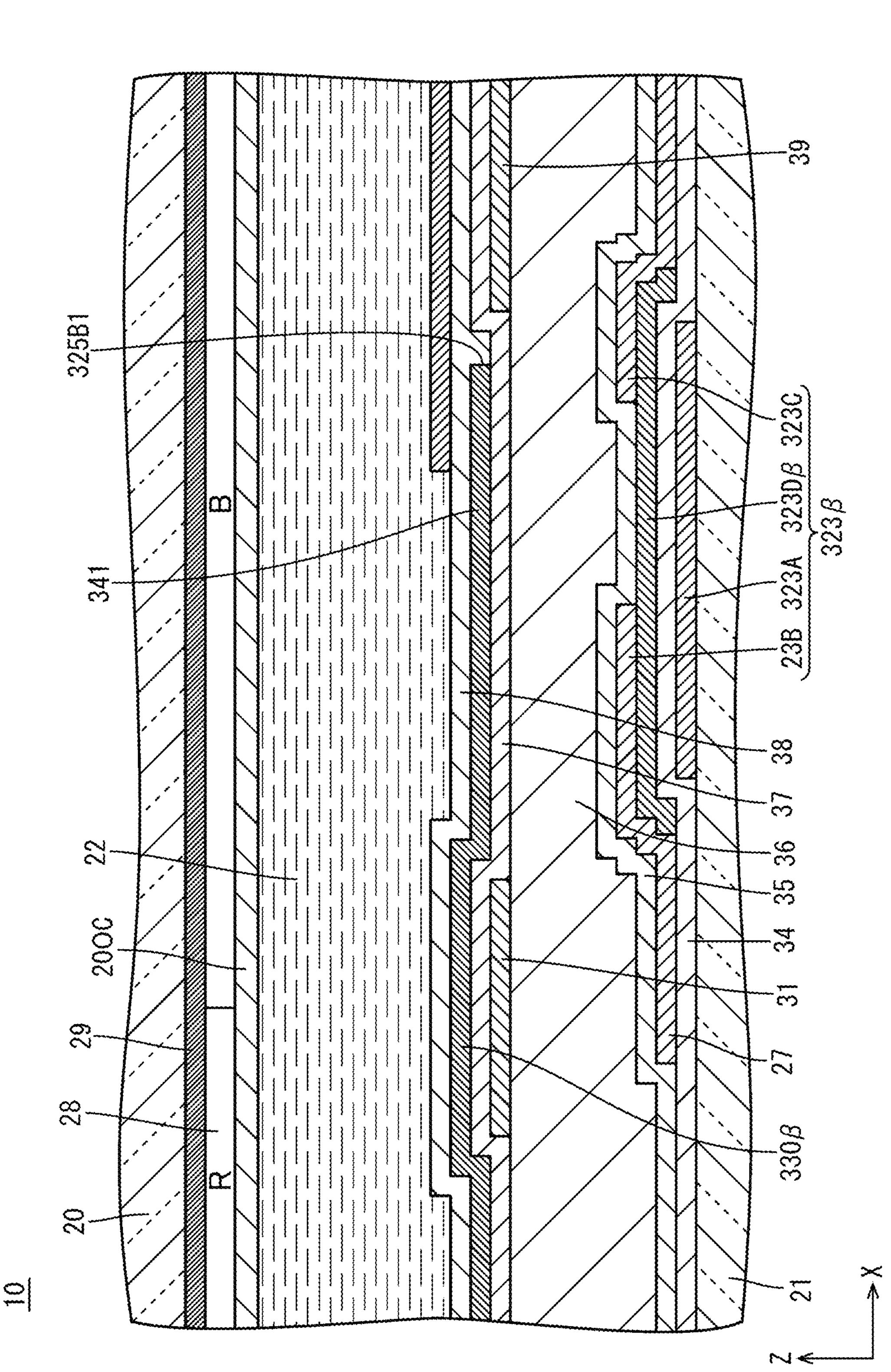
FIG. 46 is a cross-sectional view of the liquid crystal panel according to the fourth embodiment taken along a line xxxxvi-xxxxvi in FIG. 45.

The overlapping portion 341 according to the present embodiment is directly connected to any of a plurality of touch electrodes 330, as illustrated in FIGS. 45 and 46. The overlapping portion 341 is made of the same first transparent electrode film as the touch electrode 330, and is constituted by part of a second touch electrode 330β. In other words, part of the second touch electrode 330β is disposed to overlap most of a second semiconductor portion 323Dβ (at least a channel portion functioning as a channel) included in a second TFT 323β, thereby constituting the overlapping portion 341.

To be specific, in the present embodiment, a first slit 325A1 partitioning a first touch electrode 330α and the second touch electrode 330β does not overlap the second semiconductor portions 323Dβ. More specifically, the first slit 325A1 is disposed to be shifted toward the side of a pixel electrode main body 324A (upper side in FIG. 45) of the third pixel electrode 324γ relative to the second semiconductor portion 323Dβ. The first slit 325A1 is disposed to overlap none of a second drain-electrode forming portion 323C2 and a third drain-electrode forming portion 323C3 of a drain electrode 323C included in the second TFT 323β but overlap part of a first drain-electrode forming portion 323C1. The first slit 325A1 is continuous with an end portion of a first opening 325B1 on the pixel electrode main body 324A side (upper side in FIG. 45) in the Y-axis direction. The first opening 325B1 communicating with the first slit 325A1 is disposed to overlap part of each of the first drain-electrode forming portion 323C1, the second drain-electrode forming portion 323C2, and the third drain-electrode forming portion 323C3. The first slit 325A1 is disposed not to overlap a gate electrode 323A included in the second TFT 323β, but to overlap an end portion of the pixel electrode main body 324A on the second semiconductor portion 323Dβ side (lower side in FIG. 45) in the Y-axis direction. The overlapping portion 341 is constituted by part of an end portion of the second touch electrode 330β facing the first slit 325A1.

As described above, according to the present embodiment, part of the first touch electrode 330α (first common electrode 25α) or the second touch electrode 330β (second common electrode 25β) is disposed to overlap the second semiconductor portion 323Dβ, and the overlapping portion 341 is constituted by a portion of the first touch electrode 330α (first common electrodes 25α) or second touch electrode 330β (second common electrode 25β) overlapping the second semiconductor portion 323Dβ. Part of the first touch electrode 330α (first common electrode 25α) or second touch electrode 330β (second common electrode 25β) constitutes the overlapping portion 341. Compared to a case in which the overlapping portion 341 is provided in a different layer from the first touch electrode 330α (first common electrode 25α) and the second touch electrode 330β (second common electrode 25β), a structure for connecting the overlapping portion 341 to any of the plurality of touch electrodes 330 (common electrode 25) is unnecessary.

Other Embodiments

The techniques disclosed in the present specification are not limited to the embodiments described above and illustrated in the drawings, and the following embodiments, for example, are also included within the technical scope.

Figure 47:
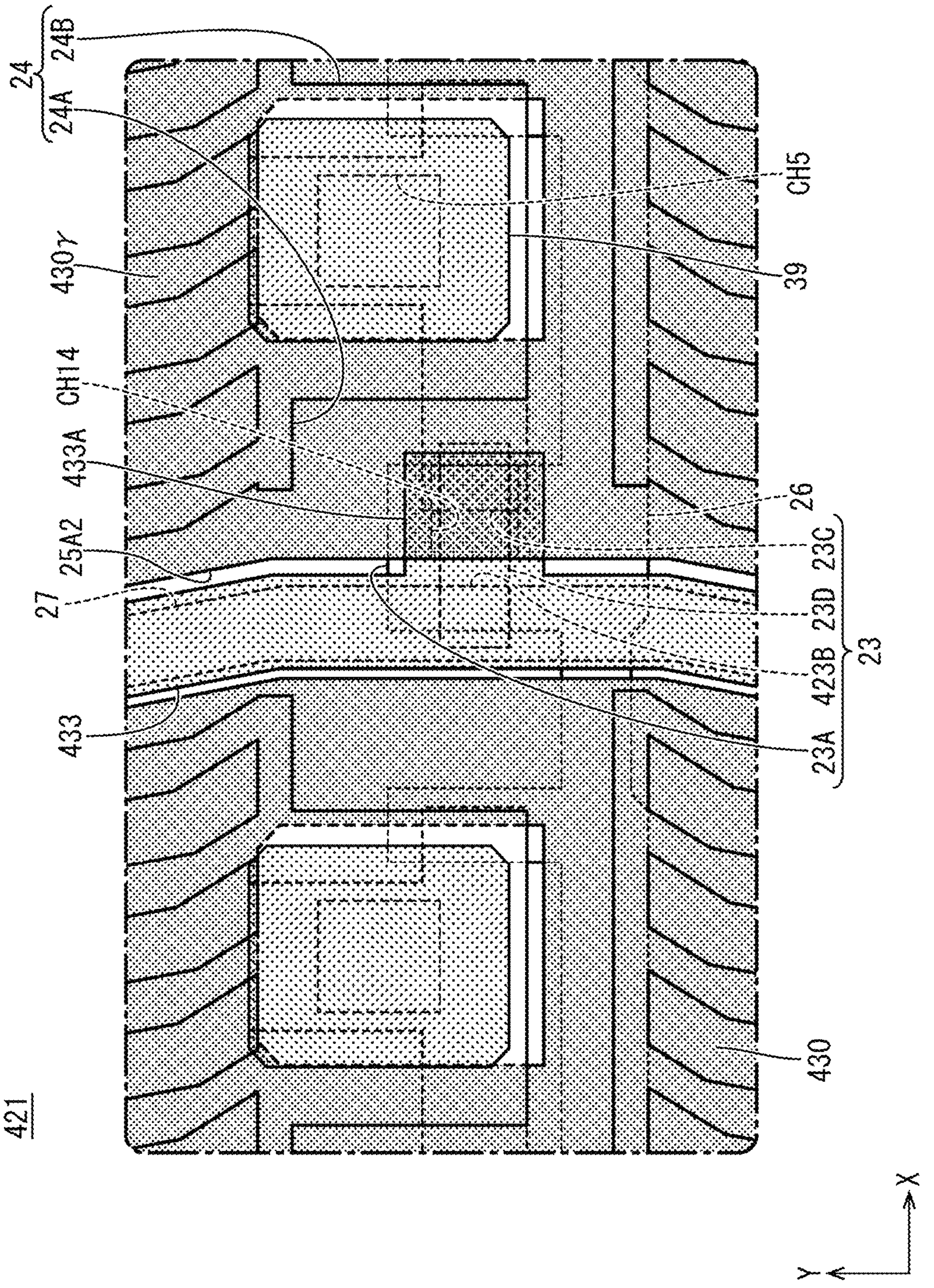
FIG. 47 is an enlarged plan view illustrating a first dummy touch wiring line and the like near a second slit partitioning a first touch electrode and a third touch electrode according to another embodiment (1), and indicating a third metal film and a first transparent electrode film with different shading.

(1) As a modification of the first embodiment, as illustrated in FIG. 47, a dummy touch wiring line 433 may be directly connected to a touch electrode 430. In FIG. 47, a third metal film and a first transparent electrode film included in an array substrate 421 are respectively indicated with different shading. The dummy touch wiring line 433 comes to have a seventh connection portion 433A by widening part thereof (a portion overlapping a source electrode 423B). The seventh connection portion 433A is disposed to overlap the touch electrode 430 (for example, a third touch electrode 430γ). In a second interlayer insulating film 37 interposed between the seventh connection portion 433A and the touch electrode 430, a fourteenth contact hole CH14 for connecting the seventh connection portion 433A and the touch electrode 430 is formed to be an opening.

(2) In the configuration described in the first embodiment, part of the second connection wiring line 32β may constitute the second overlapping portion 41β. Specifically, an end portion (an end portion on the side near the first connection wiring line 32α) of the second connection wiring line 32β facing the first slit 25A1 partitioning the first touch electrode 30α and the second touch electrode 30β is selectively widened, whereby the second overlapping portion 41β may be formed.

(3) In the configuration described in the first embodiment, part of the second dummy touch wiring line 33β may constitute the third overlapping portion 41γ. Specifically, an end portion (an end portion on the side near the first dummy touch wiring line 33α) of the second dummy touch wiring line 33β facing the first slit 25A1 partitioning the first touch electrode 30α and the second touch electrode 30β is selectively widened, whereby the third overlapping portion 41γ may be formed.

(4) Technical matters described in the second and third embodiments may be applied also to the configurations described in the first and fourth embodiments. That is, in the configurations described in the first and fourth embodiments, the overlapping portions 41 and 341 may be constituted by the second transparent electrode film. In this case, part of each of the overlapping portions 41 and 341 constituted of the second transparent electrode film is disposed to overlap any of the touch wiring line 31, the connection wiring line 32, and the dummy touch wiring lines 33, 433. In the second interlayer insulating film 37 and the third interlayer insulating film 38 interposed between the overlapping portions 41, 341 and any of the touch wiring line 31, the connection wiring line 32, and the dummy touch wiring lines 33, 433, a contact hole for connecting the overlapping portions 41, 341 and any of the touch wiring line 31, the connection wiring line 32, and the dummy touch wiring line 33, 433 may be formed to be an opening.

(5) In the configurations described in the second and third embodiments, the first connecting electrode portion 141A constituting the fifth overlapping portions 141ε, 241ε may be disposed to overlap the second touch electrodes 130β, 230β or the fourth touch electrode 130δ, and may be connected to the second touch electrodes 130β, 230β or the fourth touch electrode 130δ.

(6) Technical matters described in the fourth embodiment may be applied also to the configurations described in the second and third embodiments. That is, in the configurations described in the second and third embodiments, the overlapping portion 141 may be constituted by part of the touch electrodes 130, 230.

(7) In the configurations described in the second and third embodiments, the sum of the numbers of pieces of installation of the touch wiring lines 131, 231, the connection wiring lines 132, 232, and the dummy touch wiring lines 133, 233 may be changed. For example, the sum of the numbers of pieces of installation of the touch wiring lines 131, 231, the connection wiring lines 132, 232, and the dummy touch wiring lines 133, 233 may be less than one third the number of pieces of installation of the source wiring lines 127 (for example, may be about one sixth or one ninth), or may be more than one third the number of pieces of installation of the source wiring lines 127.

(8) In the configuration described in the fourth embodiment, the overlapping portion 341 may be constituted by part of the first touch electrode 330α. The plurality of overlapping portions 341 may include the overlapping portion 341 constituted by part of the first touch electrode 330α and the overlapping portion 341 constituted by part of the second touch electrode 330β.

(9) In the configuration described in the first embodiment, the overlapping portion 41 made of the third metal film may not be directly continuous with any of the touch wiring line 31, the connection wiring line 32, and the dummy touch wiring line 33, but may be indirectly connected to any of the touch electrode 30, the touch wiring line 31, the connection wiring line 32, and the dummy touch wiring line 33 via an electrode made of the first metal film, the second metal film, the first transparent electrode film, or the second transparent electrode film.

(10) In the configuration described in the fourth embodiment, the overlapping portion 341 made of the first transparent electrode film may not be directly continuous with the touch electrode 330, but may be indirectly connected to any of the touch electrode 330, the touch wiring line 31, the connection wiring line 32, and the dummy touch wiring line 33 via an electrode made of the first metal film, the second metal film, the third metal film, or the second transparent electrode film.

(11) The dummy touch wiring lines 33, 133, 233, 433 may be formed to cross the first slits 25A1, 125A1, 225A1, 325A1. For example, similarly to the source wiring lines 27, 127, the dummy touch wiring lines 33, 133, 233, 433 may be disposed to cross the display region AA along the Y-axis direction over the substantially entire length, and one end portion thereof may be connected to the driver 11 or the like to receive the supply of a common potential signal.

(12) The common electrode 25 may be located on the upper-layer side of the third interlayer insulating films 38, 138, 238, and the pixel electrodes 24, 124, 224 may be located on the lower-layer side of the third interlayer insulating films 38, 138, 238. In other words, the first transparent electrode film may constitute the pixel electrodes 24, 124, 224, and the second transparent electrode film may constitute the common electrode 25 (touch electrodes 30, 130, 230, 330, 430).

(13) In a case where the configuration of (12) described above is applied to the second and third embodiments, the overlapping portion 141 and the connecting electrodes 42 to 44 can be constituted by the same first transparent electrode film as the pixel electrodes 24, 124, 224.

(14) In a case where the configuration of (12) described above is applied to the fourth embodiment, the overlapping portion can be constituted by the same second transparent electrode film as the common electrode 25 (touch electrodes 30, 130, 230, 330, 430).

(15) None of the flattening films 36, 136, 236 may be formed on the array substrates 21, 121, 221.

(16) The gate circuit portion 13 may be omitted. In this case, a gate driver having the same function as that of the gate circuit portion 13 may be mounted on the array substrates 21, 121, 221. Further, the gate circuit portion 13 can be provided to only a side portion at one side of the array substrates 21, 121, 221.

(17) The material of the semiconductor film constituting the semiconductor portions 23D, 123D may be polysilicon (LTPS) or the like.

(18) The touch panel pattern may be a mutual-capacitance type in addition to a self-capacitance type.

(19) The configurations of the TFTs 23, 123 may be a top gate type, a double gate type, or the like, in addition to the bottom gate type illustrated in the drawings. In the case of the top gate type or the double gate type, the overlapping portions 41, 141, 341 are each preferably provided at a portion of the semiconductor portion 23D that does not overlap the gate electrode on the upper-layer side (the liquid crystal layer 22 side).

(20) The color filter 28 may be provided on the array substrates 21, 121, 221. In this case, both the pixel electrodes 24, 124, 224 and the color filter 28 are provided on the array substrates 21, 121, 221, and the constituent elements of the pixels are not provided on the counter substrate 20.

(21) The number of colors of the color filter 28 may be four or more. The color filter 28 to be added may be a yellow color filter capable of emitting yellow light included in a yellow wavelength region (approximately 570 nm to approximately 600 nm), a transparent color filter capable of emitting light in a full wavelength region, or the like.

(22) The planar shape of the liquid crystal panel 10 may be rectangular with longitudinal elongation, square, circular, semi-circular, elliptical, oval, trapezoidal, or the like.

(23) The liquid crystal panel 10 may be a reflective type or a semi-transmissive type, in addition to a transmissive type.

(24) The display panel may be a type different from the liquid crystal panel 10 (such as an organic electroluminescence (EL) display panel) or a microcapsule-type electrophoretic display panel (EPD).

(25) The liquid crystal panel 10 is allowed not to include a touch panel function. In this case, the plurality of touch wiring lines 31 serve as a plurality of common wiring lines dedicated to transmitting a common potential signal. The plurality of common electrodes 25 are connected to the plurality of common wiring lines to have a common potential, and do not function as the touch electrodes 30, 130, 230, 330, 430.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An array substrate, comprising:

a plurality of common electrodes defined by a transparent electrode film;

a plurality of pixel electrodes disposed overlapping the plurality of common electrodes via a first insulating film;

a plurality of switching elements connected to the plurality of pixel electrodes; and a plurality of wiring lines connected to any of the plurality of common electrodes or any of the plurality of switching elements, wherein the plurality of pixel electrodes include a first pixel electrode, a second pixel electrode disposed being spaced apart from the first pixel electrode in a first direction, a third pixel electrode, and a fourth pixel electrode disposed being spaced apart from the third pixel electrode in the first direction, the plurality of wiring lines include a first wiring line located between the first pixel electrode and the second pixel electrode in the first direction and a second wiring line located between the third pixel electrode and the fourth pixel electrode in the first direction, the first wiring line and the second wiring line are located in a same layer and extend along a second direction intersecting with the first direction, the plurality of switching elements include a first switching element connected to the first wiring line and the first pixel electrode, and a second switching element connected to the second wiring line and the third pixel electrode, the plurality of common electrodes include a first common electrode and a second common electrode spaced apart from the first common electrode in the first direction, the first switching element includes a first semiconductor portion, the second switching element includes a second semiconductor portion, the first common electrode is disposed overlapping the first pixel electrode, the second pixel electrode, the third pixel electrode, the first wiring line, and at least the first semiconductor portion of the first switching element, the second common electrode is disposed overlapping the fourth pixel electrode and the second wiring line, and there is provided an overlapping portion that is disposed overlapping at least the second semiconductor portion of the second switching element, has a potential identical to the potential of any of the plurality of common electrodes, is defined by a conductive film of a material different from the transparent electrode film that defines the plurality of common electrodes, is electrically connected to any of the plurality of common electrodes, and is disposed in a different layer from the plurality of common electrodes, wherein the overlapping portion is configured, in a plan view, not to overlap any contact holes electrically connecting the plurality of pixel electrodes and the second switching element.

2. The array substrate according to claim 1, wherein the plurality of common electrodes are a plurality of position detection electrodes, the first common electrode is a first position detection electrode, the second common electrode is a second position detection electrode, the plurality of wiring lines include a third wiring line extending along the first direction and connected to any of the plurality of position detection electrodes, and a fourth wiring line extending along the first direction and connected to at least the second switching element, at least part of the third wiring line is disposed overlapping the fourth wiring line via a second insulating film, part of the third wiring line is disposed overlapping the second semiconductor portion, and the overlapping portion includes a first overlapping portion constituted by a portion of the third wiring line overlapping the second semiconductor portion.

3. The array substrate according to claim 2, wherein the second switching element includes a first electrode connected to part of the second semiconductor portion and disposed overlapping part of the third pixel electrode, and is provided with a second electrode disposed overlapping part of the first electrode and part of the third pixel electrode, the third wiring line is formed of a first conductive film located on a lower-layer side relative to any of the plurality of position detection electrodes and the plurality of pixel electrodes via a third insulating film, the fourth wiring line is formed of a second conductive film located on a lower-layer side relative to the first conductive film via the second insulating film, the first electrode is formed of a portion of the second conductive film different from the fourth wiring line, the second electrode is formed of a portion of the first conductive film different from the third wiring line and the first overlapping portion, and is connected to the third pixel electrode and the first electrode overlapping each other, and the first overlapping portion is disposed to be aligned being spaced apart from the second electrode in the second direction.

4. The array substrate according to claim 3, wherein the second switching element includes a third electrode connected to a section of the second semiconductor portion different from a section of the second semiconductor portion connected to the first electrode, the third electrode is constituted by part of the fourth wiring line, and the first electrode includes a first portion overlapping the second electrode, and a second portion extending from the first portion along the second direction and connected to part of the second semiconductor portion.

5. The array substrate according to claim 2, wherein the plurality of wiring lines include a fifth wiring line extending along the first direction, overlapping the first position detection electrode, disposed not overlapping the second position detection electrode, and connected to the first position detection electrode, a sixth wiring line extending along the first direction, overlapping the second position detection electrode, disposed not overlapping the first position detection electrode, and connected to the second position detection electrode, and a seventh wiring line which extends along the first direction, and at least part of which is disposed overlapping the fifth wiring line and the sixth wiring line via the second insulating film, the plurality of switching elements include a third switching element connected to the second wiring line and the seventh wiring line, the third switching element includes a third semiconductor portion, part of the fifth or sixth wiring line is disposed overlapping the third semiconductor portion, and the overlapping portion includes a second overlapping portion constituted by a portion of the fifth or sixth wiring line overlapping the third semiconductor portion.

6. The array substrate according to claim 2, wherein the plurality of position detection electrodes include a third position detection electrode aligned being spaced apart from the first position detection electrode in the second direction, the plurality of wiring lines include an eighth wiring line extending along the first direction, disposed being interposed between the first position detection electrode and the third position detection electrode, and disposed overlapping neither the first position detection electrode nor the third position detection electrode, and a ninth wiring line which extends along the first direction, and at least part of which is disposed overlapping the eighth wiring line via the second insulating film, the eighth wiring line is directly or indirectly connected to any of the plurality of position detection electrodes, the plurality of switching elements include a fourth switching element connected to the second wiring line and the ninth wiring line, the fourth switching element includes a fourth semiconductor portion, part of the eighth wiring line is disposed overlapping the fourth semiconductor portion, and the overlapping portion includes a third overlapping portion constituted by a portion of the eighth wiring line overlapping the fourth semiconductor portion.

7. The array substrate according to claim 1, wherein the plurality of common electrodes are a plurality of position detection electrodes, the first common electrode is a first position detection electrode, the second common electrode is a second position detection electrode, the plurality of wiring lines include a tenth wiring line extending along the first direction and connected to any of the plurality of position detection electrodes, and an eleventh wiring line extending along the first direction and connected to at least the second switching element, the eleventh wiring line is formed of a third conductive film located on a lower-layer side relative to any of the plurality of position detection electrodes and the plurality of pixel electrodes via a fourth insulating film, the tenth wiring line is formed of a portion of the third conductive film different from the eleventh wiring line, and disposed to be aligned being spaced apart from the eleventh wiring line in the second direction, the plurality of pixel electrodes are formed of a fourth conductive film, and the overlapping portion includes a fourth overlapping portion constituted by a portion of the fourth conductive film different from the plurality of pixel electrodes.

8. The array substrate according to claim 7, wherein the fourth overlapping portion includes a fifth overlapping portion having a third portion overlapping the first position detection electrode or the second position detection electrode, and the third portion of the fifth overlapping portion is connected to the first position detection electrode or the second position detection electrode.

9. The array substrate according to claim 7, wherein the fourth overlapping portion includes a sixth overlapping portion having a fourth portion overlapping the tenth wiring line, and the fourth portion of the sixth overlapping portion is connected to the tenth wiring line.

10. The array substrate according to claim 1, wherein the first common electrode and the second common electrode are disposed to interpose the second semiconductor portion between the first and second common electrodes in the first direction and not to overlap the second semiconductor portion.

11. A display device, comprising:

the array substrate according to claim 1; and a counter substrate disposed to face the array substrate.

* * * * *